(12) United States Patent
Tokuhara et al.

(10) Patent No.: US 10,841,526 B2
(45) Date of Patent: *Nov. 17, 2020

(54) IMAGING DEVICE HAVING A VOLTAGE SUPPLY CIRCUIT SUPPLYING POTENTIAL DIFFERENCES BETWEEN ELECTRODES OF DUAL IMAGING CELLS

(71) Applicant: PANASONIC INTELLECTUAL PROPERTY MANAGEMENT CO., LTD., Osaka (JP)

(72) Inventors: Takeyoshi Tokuhara, Osaka (JP); Sanshiro Shishido, Osaka (JP); Masaaki Yanagida, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/668,983

(22) Filed: Oct. 30, 2019

(65) Prior Publication Data

US 2020/0120301 A1 Apr. 16, 2020

Related U.S. Application Data

(63) Continuation of application No. 15/876,263, filed on Jan. 22, 2018, now Pat. No. 10,506,191.

(30) Foreign Application Priority Data

Feb. 3, 2017 (JP) .................................. 2017-019090
Feb. 3, 2017 (JP) .................................. 2017-019091
Sep. 22, 2017 (JP) .................................. 2017-182534

(51) Int. Cl.
  *H04N 5/378* (2011.01)
  *H01L 27/146* (2006.01)
(Continued)

(52) U.S. Cl.
  CPC .......... *H04N 5/378* (2013.01); *H01L 27/146* (2013.01); *H01L 27/14612* (2013.01);
(Continued)

(58) Field of Classification Search
  CPC ................. H01L 27/307; H01L 27/146; H01L 27/14612; H01L 27/14636;
(Continued)

(56) References Cited

U.S. PATENT DOCUMENTS 5,136,389 A * 8/1992 Suzuki ................ H04N 5/3692
                                                           257/431
8,872,087 B2   10/2014 Yamaguchi
(Continued)

FOREIGN PATENT DOCUMENTS

JP    2008-227092 A    9/2008
JP    2011-119694 A    6/2011
(Continued)

OTHER PUBLICATIONS

Notice of Allowance issued in U.S. Appl. No. 15/876,263, dated Jul. 31, 2019.
(Continued)

*Primary Examiner* — Que Tan Le
(74) *Attorney, Agent, or Firm* — McDermott Will & Emery LLP

(57) ABSTRACT

An imaging device including a first imaging cell having a first photoelectric converter including a first electrode, a second electrode, and a first photoelectric conversion layer between the first electrode and the second electrode, and a first reset transistor one of a source and a drain of which is coupled to the first electrode; and a second imaging cell having a second photoelectric converter including a third electrode, a fourth electrode, and a second photoelectric conversion layer between the third electrode and the fourth (Continued)

electrode, and a second reset transistor one of a source and a drain of which is coupled to the third electrode. The imaging device further including a first voltage supply circuitry to supply a first voltage to the first reset transistor; and a second voltage supply circuitry to supply a second voltage different from the first voltage to the second reset transistor.

18 Claims, 28 Drawing Sheets

(51) Int. Cl.
*H04N 5/355* (2011.01)
*H01L 27/30* (2006.01)
*H01L 51/00* (2006.01)

(52) U.S. Cl.
CPC .. *H01L 27/14665* (2013.01); *H01L 27/14667* (2013.01); *H01L 27/307* (2013.01); *H04N 5/35563* (2013.01); *H01L 51/0046* (2013.01); *H01L 51/0061* (2013.01); *H01L 51/0068* (2013.01); *H01L 51/0071* (2013.01); *H01L 51/0072* (2013.01); *H01L 51/0073* (2013.01); *H01L 51/0078* (2013.01)

(58) Field of Classification Search
CPC ........ H01L 27/14665; H01L 27/14667; H04N 5/35563; H04N 5/351; H04N 5/378
USPC .......................................... 250/208.1, 214 R
See application file for complete search history.

(56) References Cited

U.S. PATENT DOCUMENTS

| | | |
|---|---|---|
| 2007/0013798 A1 | 1/2007 | Ahn et al. |
| 2011/0216212 A1 | 9/2011 | Watanabe et al. |
| 2012/0204960 A1 | 8/2012 | Kato et al. |
| 2013/0277536 A1 | 10/2013 | Mizuno et al. |
| 2015/0115339 A1 | 4/2015 | Tamaki et al. |
| 2015/0207087 A1 | 7/2015 | Udaka et al. |
| 2016/0119562 A1 | 4/2016 | Takase et al. |
| 2016/0191825 A1 | 6/2016 | Sato et al. |

FOREIGN PATENT DOCUMENTS

| | | |
|---|---|---|
| JP | 2011-187544 A | 9/2011 |
| JP | 2016-021488 A | 2/2016 |
| JP | 2016-076921 A | 5/2016 |
| JP | 2016-127265 A | 7/2016 |
| JP | 2016-219849 A | 12/2016 |
| WO | 2012/169127 A1 | 12/2012 |
| WO | 2014/002367 A1 | 1/2014 |
| WO | 2014/024581 A1 | 2/2014 |

OTHER PUBLICATIONS

The Extended European Search Report dated Jun. 11, 2018 for the related European Patent Application No. 18154455.2.
The Extended European Search Report dated Jul. 3, 2018 for the related European Patent Application No. 18154473.5.
The Extended European Search Report dated Mar. 19, 2020 for the related European Patent Application No. 18154455.2.

* cited by examiner

CZBDF

IMAGING DEVICE HAVING A VOLTAGE SUPPLY CIRCUIT SUPPLYING POTENTIAL DIFFERENCES BETWEEN ELECTRODES OF DUAL IMAGING CELLS

CROSS-REFERENCE OF RELATED APPLICATIONS

This application is a Continuation of U.S. patent application Ser. No. 15/876,263, filed on Jan. 22, 2018, which claims the benefit of Japanese Application No. 2017-019090, filed on Feb. 3, 2017, Japanese Application No. 2017-019091, filed on Feb. 3, 2017, and Japanese Application No. 2017-182534, filed on Sep. 22, 2017, the entire disclosures of which applications are incorporated by reference herein.

BACKGROUND

1. Technical Field

The present disclosure relates to an imaging device.

2. Description of the Related Art

Image sensors utilizing photoelectric conversion are widely used. As a replacement for pinned photo diodes, a structure in which a photoelectric conversion device is arranged above a semiconductor substrate has been proposed (see International Publication Nos. WO 2014/024581 and WO 2014/002367, Japanese Unexamined Patent Application Publication No. 2008-227092). The photoelectric conversion device positioned above a semiconductor substrate typically has a pair of electrodes, and a photoelectric conversion film interposed between these electrodes. In the structure in which a photoelectric conversion device is arranged above a semiconductor substrate, wires can be disposed between the semiconductor substrate and the photoelectric conversion device. Thus, the structure has an advantage in that the area of region that contributes to photoelectric conversion can be increased in each imaging cell, as compared with the case where pinned photo diodes are used.

International Publication No. WO 2014/024581 and Japanese Unexamined Patent Application Publication No. 2008-227092 each disclose a photoelectric conversion device capable of changing a spectrum sensitivity by switching between bias voltages to be applied to a pair of electrodes. With the technique described in International Publication No. WO 2014/024581 and Japanese Unexamined Patent Application Publication No. 2008-227092, a structure in which organic photoelectric conversion films with different absorption spectra are stacked is disposed between the pair of electrodes.

International Publication No. WO 2014/024581 discloses formation of a photoelectric conversion film between a pair of electrodes by co-evaporation of two or more types of organic semiconductor materials. Japanese Unexamined Patent Application Publication No. 2008-227092 describes that one of monochrome images based on an infrared image and visible light can be selectively obtained by switching the bias voltage to be applied across a pair of electrodes between a first bias voltage and a second bias voltage. The contents of the disclosure of International Publication Nos. WO 2014/024581 and WO 2014/002367, Japanese Unexamined Patent Application Publication No. 2008-227092 are incorporated by reference herein in its entirety.

SUMMARY

It is useful when multiple image signals obtained with different sensitivities can be collectively acquired by a single imaging device In one general aspect, the techniques disclosed herein feature the following: an imaging device including: a first imaging cell having a first photoelectric converter including a first electrode, a second electrode, and a first photoelectric conversion layer between the first electrode and the second electrode, and a first reset transistor one of a source and a drain of which is coupled to the first electrode. The imaging device further including: a second imaging cell having a second photoelectric converter including a third electrode, a fourth electrode, and a second photoelectric conversion layer between the third electrode and the fourth electrode, and a second reset transistor one of a source and a drain of which is coupled to the third electrode. The imaging device also including a first voltage supply circuitry configured to supply a first voltage to the other of the source and the drain of the first reset transistor; and a second voltage supply circuitry configured to supply a second voltage different from the first voltage to the other of the source and the drain of the second reset transistor.

It should be noted that general or specific embodiments may be implemented as a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Underlying Knowledge of Inventors

Figure 1:
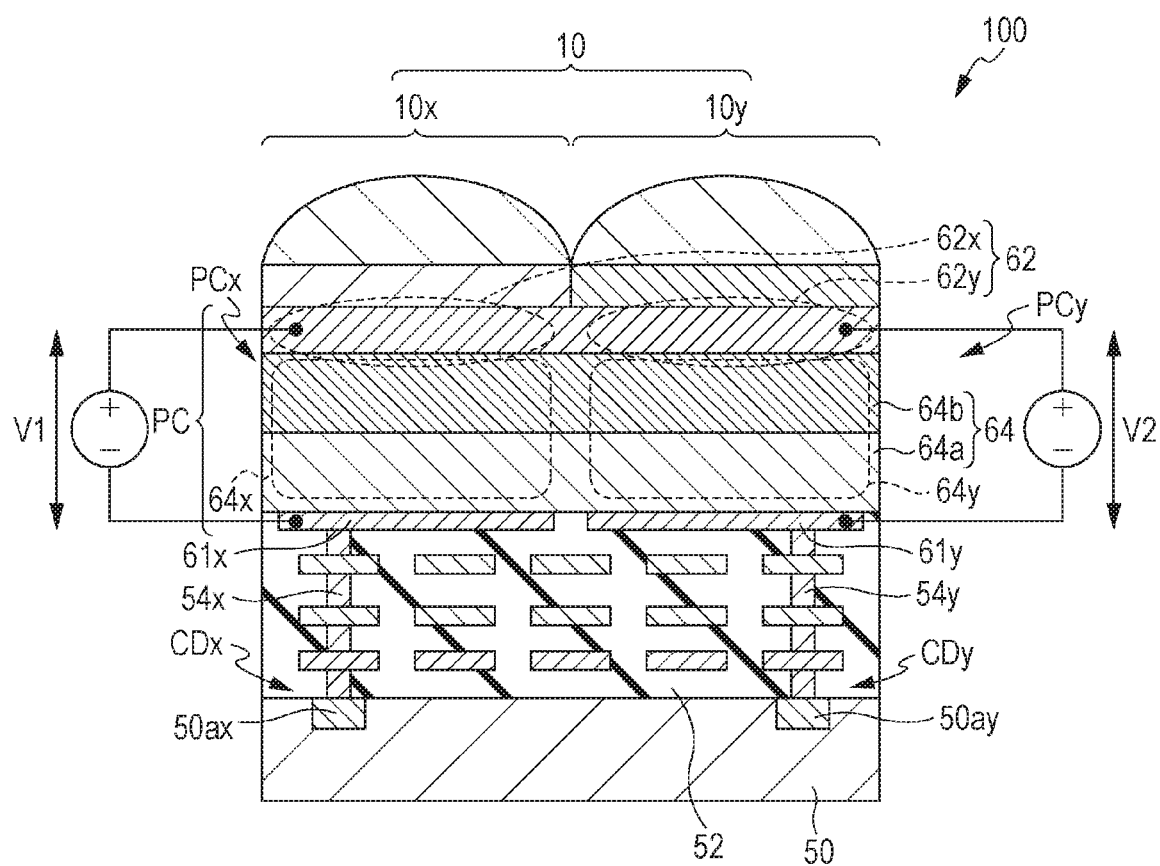
FIG. 1 is a schematic sectional view illustrating an overview of the configuration of an imaging device according to a typical embodiment of the present disclosure.

With the technique described in Japanese Unexamined Patent Application Publication No. 2008-227092, a monochrome image based on an infrared image and visible light is obtained. However, a photograph is taken with one of the first and the second bias voltages selectively applied, and thus moments of photographing for these images are different. In other words, it is not possible to collectively obtain an infrared image of a subject, and a monochrome image based on visible light at a certain moment.

It is useful if image signals based on different wavelength ranges can be collectively obtained.

Before Embodiments of the present disclosure is described, a summary of the Embodiments of the present disclosure will be described. The summary in an aspect of the present disclosure is as follows.

[Item 1]

An imaging device including:
a first imaging cell including
 a first photoelectric converter including a first pixel electrode, a first opposite electrode, and a first photoelectric conversion layer between the first pixel electrode and the first opposite electrode, the first photoelectric converter generating first signal charge by photoelectric conversion, and
 a first charge detection circuit connected to the first pixel electrode, the first charge detection circuit detecting the first signal charge;
a second imaging cell including
 a second photoelectric converter including a second pixel electrode, a second opposite electrode, and a second photoelectric conversion layer between the second pixel electrode and the second opposite electrode, the second photoelectric converter generating second signal charge by photoelectric conversion, and
 a second charge detection circuit connected to the second pixel electrode, the second charge detection circuit detecting the second signal charge; and
a voltage supply circuit supplying a voltage such that, in a first frame period, a potential difference between the first pixel electrode and the first opposite electrode at a start time of a charge accumulation period of the first imaging cell is made different from a potential difference between the second pixel electrode and the second opposite electrode at a start time of a charge accumulation period of the second imaging cell.

[Item 2]

The imaging device according to Item 1, wherein the first charge detection circuit includes a first reset transistor having a source and a drain, one of the source and the drain of the first reset transistor being connected to the first pixel electrode, the second charge detection circuit includes a second reset transistor having a source and a drain, one of the source and the drain of the second reset transistor being connected to the second pixel electrode, in the first frame period, the voltage supply circuit supplies a first voltage to the other of the source and the drain of the first reset transistor in a reset period of the first imaging cell, and supplies a second voltage different from the first voltage to the other of the source and the drain of the second reset transistor in a reset period of the second imaging cell.

[Item 3]

The imaging device according to Item 1, further including:

a first inverting amplifier having a first inverting input terminal, a first non-inverting input terminal, and a first output terminal; and a second inverting amplifier having a second inverting input terminal, a second non-inverting input terminal, and a second output terminal, wherein the first charge detection circuit includes a first reset transistor having a source and a drain, one of the source and the drain of the first reset transistor being connected to the first pixel electrode, the other of the source and the drain of the first reset transistor being electrically connected to the first output terminal, and a first signal detection transistor having a gate, a source and a drain, the gate of the first signal detection transistor being connected to the first pixel electrode, one of the source and the drain of the first signal detection transistor being electrically connected to the first inverting input terminal, the second charge detection circuit includes a second reset transistor having a source and a drain, one of the source and the drain of the second reset transistor being connected to the second pixel electrode, the other of the source and the drain of the second reset transistor being electrically connected to the second output terminal, and a second signal detection transistor having a gate, a source and a drain, the gate of the second signal detection transistor being connected to the second pixel electrode, one of the source and the drain of the second signal detection transistor being electrically connected to the second inverting input terminal, in the first frame period, the voltage supply circuit supplies a first voltage to the first non-inverting input terminal in a reset period of the first imaging cell, and supplies a second voltage different from the first voltage to the second non-inverting input terminal in a reset period of the second imaging cell.

[Item 4]

The imaging device according to Item 1, wherein the first charge detection circuit includes a first capacitor having a first end and a second end, the first end of the first capacitor being connected to the first pixel electrode, in the first frame period, the voltage supply circuit supplies a first voltage to the second end of the first capacitor in the charge accumulation period of the first imaging cell, and supplies a second voltage different from the first voltage to the second end of the first capacitor in a reset period of the first imaging cell.

[Item 5]

The imaging device according to Item 4, wherein the second charge detection circuit includes a second capacitor having a first end and a second end, the first end of the second capacitor being connected to the second pixel electrode, in the first frame period, the voltage supply circuit supplies a third voltage to the second end of the second capacitor in the charge accumulation period of the second imaging cell, and supplies a fourth voltage different from the third voltage to the second end of the second capacitor in a reset period of the second imaging cell.

[Item 6]

The imaging device according to Item 1, wherein the first charge detection circuit includes a first capacitor having a first end and a second end, the first end of the first capacitor being connected to the first pixel electrode, the second charge detection circuit includes a second capacitor having a first end and a second end, the first end of the second capacitor being connected to the second pixel electrode, a capacitive value of the second capacitor being different from a capacitive value of the first capacitor, in the first frame period, the voltage supply circuit supplies a first voltage to the second end of the first capacitor and the second end of the second capacitor in charge accumulation periods of the first imaging cell and the second imaging cell, and supplies a second voltage different from the first voltage to the second end of the first capacitor and the second end of the second capacitor in reset periods of the first imaging cell and the second imaging cell.

[Item 7]

The imaging device according to any one of Items 1 to 6, wherein the first opposite electrode and the second opposite electrode form a single continuous electrode.

[Item 8]

The imaging device according to any one of Items 1 to 6, wherein the first opposite electrode and the second opposite electrode are electrically connected to each other.

[Item 9]

The imaging device according to Item 1, wherein in the first frame period, the voltage supply circuit supplies a first voltage to the first opposite electrode in the charge accumulation period of the first imaging cell, and supplies a second voltage different from the first voltage to the second opposite electrode in the charge accumulation period of the second imaging cell.

[Item 10]

The imaging device according to any one of Items 1 to 9, wherein the first photoelectric conversion layer and the second photoelectric conversion layer form a single continuous photoelectric conversion layer.

[Item 11]

The imaging device according to any one of Items 1 to 10, wherein each of the first photoelectric conversion layer and the second photoelectric conversion layer includes a first layer and a second layer stacked one on the other, the first layer includes a first material, the second layer includes a second material, and impedance of the first layer is greater than impedance of the second layer.

[Item 12]

The imaging device according to any one of Items 1 to 10, wherein each of the first photoelectric conversion layer and the second photoelectric conversion layer includes a first layer and a second layer stacked one on the other, the first layer includes a first material,
the second layer includes a second material, and
an ionization potential of the first material is greater than an ionization potential of the second material by 0.2 eV or more.

[Item 13]

The imaging device according to Item 11 to 12, wherein the first material and the second material are both electron-donating molecules.

[Item 14]

An imaging device having an array of multiple imaging cells each including a first imaging cell and a second imaging cell, wherein
the first imaging cell has a first photoelectric converter and a first charge detector, a second imaging cell has a second photoelectric converter and a second charge detector,
the first photoelectric converter includes
a first electrode, a second electrode, and a first photoelectric conversion structure positioned between the first electrode and the second electrode,
the first charge detector includes a first transistor connected to the first electrode,
the second photoelectric converter includes a third electrode, a fourth electrode, and a second photoelectric conversion structure positioned between the third electrode and the fourth electrode,
the second charge detector includes a second transistor connected to the third electrode,
each of the first photoelectric conversion structure and the second photoelectric conversion structure includes at least part of a multilayer structure having a first photoelectric conversion layer and a second photoelectric conversion layer, and
a potential difference applied across the first electrode and the second electrode at the time of start of a charge accumulation period is different from a potential difference applied across the third electrode and the fourth electrode at the time of start of the charge accumulation period.

With the configuration of item 14, imaging cells with different spectral sensitivity characteristic can be mixed in the pixel array of imaging cells.

[Item 15]

The imaging device according to Item 14, wherein
the first electrode is connected to a gate of the first transistor of the first charge detector, and
the third electrode is connected to a gate of the second transistor of the second charge detector.

With the configuration of item 15, non-destructive read of a signal charge is possible.

[Item 16]

The imaging device according to Item 2, wherein
the first charge detector includes a first reset circuit having a third transistor having one of a source and a drain connected to the first electrode,
the second charge detector includes a second reset circuit having a fourth transistor having one of a source and a drain connected to the third electrode, and
a fourth electrode of the second photoelectric converter, and a second electrode of the first photoelectric converter have the same potential.

[Item 17]

The imaging device according to Item 16, further including:
a first voltage line that is connected to the other of the source and the drain of the third transistor, and supplies a first voltage to the other of the source and the drain of the third transistor; and
a second voltage line that is connected to the other of the source and the drain of the fourth transistor, and supplies a second voltage different from the first voltage in absolute value to the other of the source and the drain of the fourth transistor.

With the configuration of item 17, the first electrode of the first imaging cell and the third electrode of the second imaging cell can be reset to different potentials, and the bias voltage applied to the photoelectric conversion structure at the start of the charge accumulation period can be made different between the first imaging cell and the second imaging cell.

[Item 18]

The imaging device according to Item 16, wherein
the first reset circuit includes a first feedback circuit that performs negative feedback of the electrical signals generated in the first photoelectric converter,
the second reset circuit includes a second feedback circuit that performs negative feedback of the electrical signals generated in the second photoelectric converter,
the first feedback circuit includes a first inverting amplifier,
the second feedback circuit includes a second inverting amplifier,
the inverting input terminal of the first inverting amplifier is electrically connected to one of the source and the drain of the first transistor, and
the inverting input terminal of the second inverting amplifier is electrically connected to one of the source and the drain of the second transistor.

With the configuration of item 18, the effect of random noise can be canceled by formation of a feedback loop.

[Item 19]

The imaging device according to Item 18, further including:
a first voltage line that is connected to the non-inverting input terminal of the first inverting amplifier, and applies a first voltage to the non-inverting input terminal of the first inverting amplifier; and
a second voltage line that is connected to the non-inverting input terminal of the second inverting amplifier, and applies a second voltage different from the first voltage in absolute value to the non-inverting input terminal of the first inverting amplifier.

With the configuration of item 19, the first electrode of the first imaging cell and the third electrode of the second imaging cell can be reset to different potentials, and the bias voltage applied to the photoelectric conversion structure at the start of the charge accumulation period can be made different between the first imaging cell and the second imaging cell.

[Item 20]

The imaging device according to Item 16 or 18, further including a first voltage line, wherein
the first charge detector a first capacitor connected between the first electrode and the first voltage line, and
the first voltage line supplies a first voltage to the first capacitor.

With the configuration of item 20, it is possible to temporarily increase the potential of the first electrode of the first imaging cell in the charge accumulation period by the electrical coupling between the first voltage line and the charge accumulation node via the first capacitor.

[Item 21]

The imaging device according to Item 20, wherein the absolute value of the first voltage is different between the charge accumulation period included a frame period, and the period other than the charge accumulation period in the frame period.

With the configuration of item 21, the bias voltage applied to the first photoelectric conversion structure in the charge accumulation period can be selectively changed, and the bias voltage applied to the photoelectric conversion structure at the start of the charge accumulation period can be made different between the first imaging cell and the second imaging cell.

[Item 22]

The imaging device according to Item 21, wherein the second charge detector includes a second capacitor connected between the third electrode and the first voltage line, and the capacitive value of the second capacitor is different from the capacitive value of the first capacitor.

With the configuration of item 22, the potential difference between the first electrode and the second electrode, and the potential difference between the third electrode and the fourth electrode can be made different while the voltage applied to the first signal line is used in common.

[Item 23]

The imaging device according to any one of Items 14 to 22, wherein the first imaging cell and the second imaging cell are arranged adjacent to each other in the array, and the imaging device further includes a subtraction circuit that outputs the difference between a first image signal outputted from the first charge detector and a second image signal outputted from the second charge detector.

With the configuration of item 23, an image based on infrared light can be formed based on the difference between the level of an output signal of the first imaging cell and the level of an output signal of the second imaging cell.

[Item 24]

The imaging device according to any one of Items 14 to 23, wherein the second electrode of the first photoelectric converter and the fourth electrode of the second photoelectric converter form a single continuous electrode.

With the configuration of item 24, it is possible to collectively apply a predetermined voltage to the second electrode of the first imaging cell and the fourth electrode of the second imaging cell.

[Item 25]

The imaging device according to Items 14 or 15, wherein the first imaging cell has a first voltage line connected to the second electrode, the second imaging cell has a second voltage line connected to the fourth electrode, the second electrode and the fourth electrode are electrically separated, the first voltage line supplies a first voltage to the second electrode at least in the charge accumulation, and the second voltage line supplies a second voltage different from the first voltage in absolute value to the fourth electrode at least in the charge accumulation.

With the configuration of item 25, the potentials of the second electrode of the first imaging cell and the fourth electrode of the second imaging cell can be made different, for instance in the charge accumulation, and the bias voltage applied to the photoelectric conversion structure at the start of the charge accumulation period can be made different between the first imaging cell and the second imaging cell.

[Item 26]

The imaging device according to any one of Items 14 to 25, wherein the first photoelectric conversion layer and the second photoelectric conversion layer include a first material and a second material, respectively, and the impedance of the first photoelectric conversion layer is greater than the impedance of the second photoelectric conversion layer.

With the configuration of item 26, the spectral sensitivity characteristic of the photoelectric conversion structure can be changed by changing the potential difference applied across the first electrode and the second electrode.

[Item 27]

The imaging device according to any one of Items 14 to 25, wherein the first photoelectric conversion layer and the second photoelectric conversion layer include a first material and a second material, respectively, and the ionization potential of the first material is greater than the ionization potential of the second material by 0.2 eV or more.

With the configuration of item 27, the spectral sensitivity characteristic of the photoelectric conversion structure can be changed by changing the potential difference applied across the first electrode and the second electrode.

[Item 28]

The imaging device according to Items 26 or 27, wherein the first material and the second material are electron-donating molecules.

[Item 29]

An imaging device having an array of multiple imaging cells each including a first imaging cell and a second imaging cell, wherein the first imaging cell has a first photoelectric converter and a first charge detector, the second imaging cell has a second photoelectric converter and a second charge detector, the first photoelectric converter includes
  a first electrode, a second electrode, and a first photoelectric conversion structure positioned between the first electrode and the second electrode, the first charge detector includes
  a first reset circuit that is connected to the first electrode, and resets the potential of the first electrode to a first potential, the second photoelectric converter includes
  a third electrode, a fourth electrode, and a second photoelectric conversion structure where positioned between the third electrode and the fourth electrode, the second charge detector includes
  a second reset circuit that is connected to the third electrode, and resets the potential of the third electrode to a second potential different from the first potential, each of the first photoelectric conversion structure and the second photoelectric conversion structure includes at least part of a multilayer structure having a first photoelectric conversion layer and a second photoelectric conversion layer, and the potential of the fourth electrode of the second photoelectric converter in the charge accumulation is equal to the potential of the second electrode of the first photoelectric converter in the charge accumulation.

With the configuration of item 29, the first electrode of the first imaging cell and the third electrode of the second imaging cell can be reset to different potentials, and the bias voltage applied to the photoelectric conversion structure at the start of the charge accumulation period can be made different between the first imaging cell and the second imaging cell.

[Item 30]

An imaging device having an array of multiple imaging cells each including a first imaging cell and a second imaging cell, wherein the imaging device includes a first voltage line to which a first voltage is applied, the first imaging cell has a first photoelectric converter and a first charge detector, the second imaging cell has a second photoelectric converter and a second charge detector, the first photoelectric converter includes
a first electrode, a second electrode, and a first photoelectric conversion structure positioned between the first electrode and the second electrode, the first charge detector includes
a first reset circuit that is connected to the first electrode, and resets the potential of the first electrode to a first potential, and a first capacitor connected between the first electrode and the first voltage line, the second photoelectric converter includes
a third electrode, a fourth electrode, and a second photoelectric conversion structure where positioned between the third electrode and the fourth electrode, the second charge detector includes
a second reset circuit that is connected to the third electrode, and resets the potential of the third electrode to the first potential, each of the first photoelectric conversion structure and the second photoelectric conversion structure includes at least part of a multilayer structure having a first photoelectric conversion layer and a second photoelectric conversion layer, and the potential of the fourth electrode of the second photoelectric converter in the charge accumulation is equal to the potential of the second electrode of the first photoelectric converter in the charge accumulation, and the first voltage is higher in the charge accumulation period included in a frame period than in the period other than the charge accumulation period in the frame period.

With the configuration of item 30, the bias voltage applied to the first photoelectric conversion structure in the charge accumulation period can be selectively changed, and the bias voltage applied to the photoelectric conversion structure at the start of the charge accumulation period can be made different between the first imaging cell and the second imaging cell.

[Item 31]

An imaging device having an array of multiple imaging cells each including a first imaging cell and a second imaging cell, wherein the first imaging cell has a first photoelectric converter and a first charge detector, the second imaging cell has a second photoelectric converter and a second charge detector, the first photoelectric converter includes
a first electrode, a second electrode, a first photoelectric conversion structure positioned between the first electrode and the second electrode, and a first voltage line connected to the second electrode, the first charge detector is connected to the first electrode, the second photoelectric converter includes
a third electrode, a fourth electrode electrically separated from the second electrode, a second photoelectric conversion structure positioned between the third electrode and the fourth electrode, and a second voltage line connected to the fourth electrode, the second charge detector is connected to the third electrode, each of the first photoelectric conversion structure and the second photoelectric conversion structure includes at least part of a multilayer structure having a first photoelectric conversion layer and a second photoelectric conversion layer, the first voltage line supplies a first voltage to the second electrode at least in the charge accumulation period, and the second voltage line supplies a second voltage different from the first voltage in absolute value to the fourth electrode at least in the charge accumulation period.

With the configuration of item 31, the potentials of the second electrode of the first imaging cell and the fourth electrode of the second imaging cell can be made different, for instance in the charge accumulation, and the bias voltage applied to the photoelectric conversion structure at the start of the charge accumulation period can be made different between the first imaging cell and the second imaging cell.

Hereinafter, Embodiments of the present disclosure will be described in detail. It is to be noted that each of the Embodiments described below represents a comprehensive or specific example. The numerical values, shapes, materials, components, arrangement and connection topologies of the components, steps, the order of the steps which are presented in the following Embodiments are examples, and not intended to limit the present disclosure. Various aspects described in the present description may be combined as long as no contradiction occurs. Any component which is included in the components of the following Embodiments and is not recited in the independent claim providing the most generic concept will be described as an arbitrary component. In the following description, components having substantially the same function are labeled with a common reference symbol, and a description may be omitted.

FIG. 1 illustrates an overview of the configuration of an imaging device according to a typical embodiment of the present disclosure. As schematically illustrated in FIG. 1, an imaging device 100 according to an embodiment of the present disclosure includes a semiconductor substrate 50, an interlayer insulation layer 52 that covers the semiconductor substrate 50, and a photoelectric converter PC supported by the semiconductor substrate 50 and the interlayer insulation layer 52. The imaging device 100 has multiple imaging cells 10, and FIG. 1 illustrates a schematic sectional view of two imaging cells 10x and 10y among the multiple imaging cells 10. The imaging device 100 includes an imaging region which has a repetitive structure in which a unit formed by a pair of two imaging cells 10x and 10y is repeated.

As schematically illustrated in FIG. 1, the photoelectric converter PC has pixel electrodes 61x and 61y, an opposite electrode 62, and a photoelectric conversion structure 64. The opposite electrode 62 is typically a transparent electrode, and is positioned more distant from the semiconductor substrate 50 than from the pixel electrodes 61x and 61y. The photoelectric conversion structure 64 is positioned between the pixel electrodes 61x and 61y, and the opposite electrode 62, and includes a multilayer structure having the first photoelectric conversion layer 64a and the second photoelectric conversion layer 64b.

The imaging cells 10x and 10y have photoelectric converters PCx and PCy, respectively. In this example, the photoelectric conversion structure 64 and the opposite electrode 62 are shared between the imaging cells 10x and 10y. Therefore, each of the photoelectric converters PCx and PCy is part of the photoelectric converter PC. The photoelectric converter PCx includes an opposite electrode 62x, a photoelectric conversion structure 64x, and a pixel electrode 61x. The opposite electrode 62x and the photoelectric conversion structure 64x are part of the opposite electrodes 62 and part of the photoelectric conversion structure 64, respectively. Similarly, the photoelectric converter PCy includes an opposite electrode 62y which is part of the opposite electrodes 62, a photoelectric conversion structure 64y which is part of the photoelectric conversion structures 64, and a pixel electrode 61y.

The imaging cell 10x has a charge detector CDx which includes, in part, an impurity region 50ax formed in the semiconductor substrate 50. The imaging cell 10y has a charge detector CDy which includes, in part, an impurity region 50ay formed in the semiconductor substrate 50. Hereinafter, the charge detector is also called a charge detection circuit. As schematically illustrated in FIG. 1, the pixel electrode 61x of photoelectric converter PCx is connected to the impurity region 50ax via a connector 54x disposed in the interlayer insulation layer 52. Similarly, the pixel electrode 61y of photoelectric converter PCy is connected to the impurity region 50ay via a connector 54y disposed in the interlayer insulation layer 52.

The photoelectric conversion structure 64 is irradiated with light, and generates charge pairs therein. The charges generated in a portion between the opposite electrode 62 and the pixel electrodes 61x in the photoelectric conversion structure 64 are generally collected as signal charges by the pixel electrode 61x by applying an appropriate potential difference across the pixel electrode 61x and the opposite electrodes 62x. The signal charges collected by the pixel electrode 61x are temporarily held in a charge accumulation region which includes, in part, the pixel electrode 61x, the connector 54x, and the impurity region 50ax, and are detected by the charge detector CDx. Similarly, the charges generated in a portion between the opposite electrode 62 and the pixel electrodes 61y in the photoelectric conversion structure 64 are generally collected as signal charges by the pixel electrode 61y by applying an appropriate potential difference across the pixel electrode 61y and the opposite electrodes 62y, then the charges are detected by the charge detector CDy. Therefore, each of the imaging cells 10x and 10y can be defined as the unit structure that has a pixel electrode connected to the charge detector via the connector.

In photographing, as schematically illustrated in FIG. 1, a first bias voltage V1 is applied to the photoelectric conversion structure 64x, and a second bias voltage V2 is applied to the photoelectric conversion structure 64y. Here, the first bias voltage V1 and second bias voltage V2 are different in absolute value ($|V1| \neq |V2|$). In an embodiment of the present disclosure, at the start of the charge accumulation period included in a frame period, the potential difference between the pixel electrode and the opposite electrode of the first imaging cell (between the pixel electrode 61x and the opposite electrode 62x in this example) is different from the potential difference between the pixel electrode and the opposite electrode of the second imaging cell (between the pixel electrode 61y and the opposite electrode 62y in this example).

In the photoelectric converter PC, the photoelectric conversion structure 64 includes a multilayer structure that has the first photoelectric conversion layer 64a and the second photoelectric conversion layer 64b. Also, the voltage applied across a pair of electrodes by which the photoelectric conversion structure 64 is interposed is switched between multiple voltages having different absolute values. As described in detail later, the spectral sensitivity characteristic is changed by the switching between voltages. Thus, in a charge accumulation period, for instance, the first imaging cell has sensitivity in the wavelength ranges of visible light and infrared light, and the second imaging cell selectively has sensitivity in the wavelength range of visible light. In this case, the charge detector (the charge detector CDx in this example) of the first imaging cell outputs an image signal based on the visible light and infrared light, and the charge detector (the charge detector CDy in this example) of the second imaging cell outputs an image signal based on visible light.

Like this, according to an embodiment of the present disclosure, a set including at least two imaging cells with different spectral sensitivity characteristics can be mixed in the array of imaging cells. In other words, it is possible to collectively obtain image signals based on light with different wavelength ranges. According to an embodiment of the present disclosure, for instance, it is possible to form an image based on visible light and infrared light from an image signal obtained by one of the first and second imaging cells, and to form an image based on visible light from an image signal obtained by the other of the first and second imaging cells. Furthermore, it is also possible to form an image based on infrared light by calculating the difference between the levels of output signals of the first and second imaging cells. Each of these images is formed from an image signal based on the amount of signal charges accumulated in the same charge accumulation period, and thus synchronization is guaranteed. Therefore, even when a high-speed moving object is photographed, blur does not occur in the image based on the difference. This is different from the case where the spectral sensitivity characteristic of the imaging cell is changed between two frames, and multiple image signals based on light with different wavelength ranges are successively obtained.

First Embodiment

Figure 2:
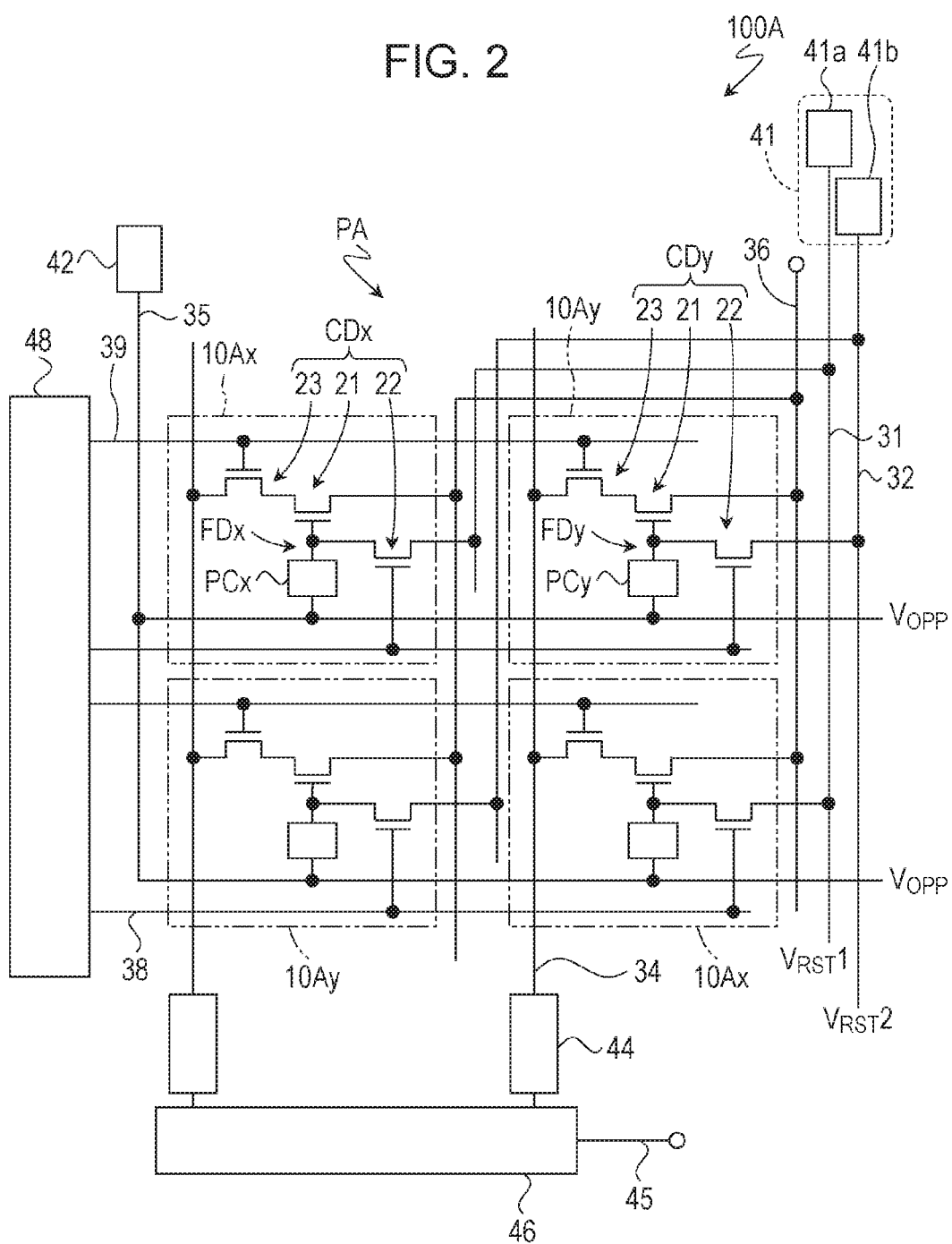
FIG. 2 is a diagram illustrating an exemplary circuit configuration of an imaging device according to a first embodiment of the present disclosure.

FIG. 2 illustrates an exemplary circuit configuration of an imaging device according to a first embodiment of the present disclosure. The imaging device 100A illustrated in FIG. 2 has a pixel array PA including multiple imaging cells arranged two-dimensionally. The pixel array PA has multiple imaging cells each including at least one pair of imaging cells 10Ax and 10Ay.

FIG. 2 schematically illustrates an example in which imaging cells are arranged in a matrix. A pixel block including four imaging cells arranged in two rows by two columns among the multiple imaging cells is selectively illustrated. The pixel block illustrated in FIG. 2 has two imaging cells 10Ax and two imaging cells 10Ay. In this example, the imaging cell 10Ax and 10y are adjacent to each other in the row direction, and adjacent to each other in the column direction too. In the present description, the "row direction" indicates the direction in which the rows of the multiple imaging cells extend, and the "column direction" indicates the direction in which the columns of the multiple imaging cells extend. In the example of FIG. 2, the "row direction" is the horizontal direction on the paper, and the "column direction" is the vertical direction on the paper. Needless to say, the number and arrangement of the imaging cells 10Ax and 10Ay are not limited to the example illustrated in FIG. 2.

The imaging cell 10Ax has the photoelectric converter PCx and the charge detector CDx. The charge detector CDx detects a signal charge collected by the pixel electrode 61x (see FIG. 1) of the photoelectric converter PCx. In this example, the charge detector CDx has a signal detection transistor 21, a reset transistor 22, and an address transistor 23. The signal detection transistor 21, the reset transistor 22, and the address transistor 23, are typically field effect transistors (FET). Hereinafter an example, in which N-channel MOS is used for the signal detection transistor 21, the reset transistor 22, and the address transistor 23, will be described.

The imaging cell 10Ay has the photoelectric converter PCy and the charge detector CDy. The charge detector CDy detects a signal charge collected by the pixel electrode 61y (see FIG. 1) of the photoelectric converter PCy. Similarly to the charge detector CDx of the imaging cell 10Ax, the charge detector CDy has the signal detection transistor 21, the reset transistor 22, and the address transistor 23.

The imaging device 100A has a vertical signal line 34 provided for each column of the multiple imaging cells, and a power source wire 36 for supplying power supply voltage AVDD to the imaging cells 10Ax and 10Ay. The drain of the above-mentioned signal detection transistor 21 is connected to the power source wire 36, and the source of the signal detection transistor 21 is connected to a corresponding one of multiple vertical signal lines 34 via the address transistor 23.

As schematically illustrated in FIG. 2, the gate of the signal detection transistor 21 of the imaging cell 10Ax is connected to the photoelectric converter PCx. The gate of the signal detection transistor 21 is coupled to the pixel electrode 61x of the photoelectric converter PCx. The signal charges generated by the photoelectric converter PCx is temporarily accumulated in the charge accumulation region in the imaging cell 10x. The charge accumulation region of the imaging cell 10x includes a charge accumulation node FDx between the gate of the signal detection transistor 21 and the photoelectric converter PCx. The charge accumulation node is also called a floating diffusion node. The signal detection transistor 21 of the charge detector CDx outputs a signal generated by the photoelectric converter PCx with the power source wire 36 serving as a source follower power supply. In other words, a voltage according to the signal charges accumulated in the charge accumulation region is read to the vertical signal line 34. It is to be noted that the connection terminal of the signal detection transistor 21 connected to the photoelectric converter PCx is not limited to the gate electrode. For instance, the connection terminal may be the source or the drain according to the circuit configuration of a charge detection circuit.

The circuit configuration of the imaging cell 10Ay is substantially the same as the circuit configuration of the imaging cell 10Ax. The gate of the signal detection transistor 21 of the imaging cell 10Ay is connected to the pixel electrode 61y of the photoelectric converter PCy. The signal charges generated by the photoelectric converter PCy are temporarily accumulated in the charge accumulation region that includes a charge accumulation node FDy between the gate of the signal detection transistor 21 and the photoelectric converter PCy. The signal detection transistor 21 of the charge detector CDy outputs a signal generated by the photoelectric converter PCy.

The vertical signal line 34 is connected to a column signal processing circuit 44 which is also called a row signal accumulation circuit. The column signal processing circuit 44 performs noise suppression signal processing represented by Correlated Double Sampling, and analog-to-digital conversion. The column signal processing circuit 44 is provided for each row of the imaging cells 10A in the pixel array PA. These column signal processing circuits 44 are connected to a horizontal signal read circuit 46 which is also called a column scanning circuit. The horizontal signal read circuit 46 successively reads signals from multiple column signal processing circuits 44 to the horizontal common signal line 45.

The imaging device 100A further has a first voltage supply circuit 41 and a second voltage supply circuit 42. In the configuration illustrated in FIG. 2, the first voltage supply circuit 41 is connected to a first voltage line 31 and a second voltage line 32. The first voltage line 31 has connection with each imaging cell 10Ax, and the second voltage line 32 has connection with each imaging cell 10Ay. Therefore, the first voltage supply circuit 41 can supply voltage a predetermined $V_{RST}1$ to each imaging cell 10Ax via the first voltage line 31, and can supply voltage a predetermined $V_{RST}2$ to each imaging cell 10Ay via the second voltage line 31. Here, the voltage $V_{RST}2$ supplied to each imaging cell 10Ay has an absolute value different from the absolute value of the voltage $V_{RST}1$ supplied to each imaging cell 10Ax. The first voltage line 31 is not limited to a single wire. The first voltage line 31 may be a structure that is electrically coupled or connected to an imaging cell to which a voltage is to be supplied, for instance, may be a grid-like structure. This also applies to the second voltage line 32 which may be a structure that is electrically coupled or connected to an imaging cell to which a voltage is to be supplied. The second voltage line 32 is also not limited to a single wire, and may be a grid-like structure. This also applies to other voltage lines, signal lines, control lines, and wires in the present disclosure. In the present description, the term "line" or "wire" used as the name of a member is only for the sake of convenience of description, and it is not intended to limit a specific structure, such as a voltage line, a signal line, a control line, and a wire, to a single linear conductor.

In this example, the voltage supply circuit 41 includes a voltage supply circuit 41a connected to the first voltage line 31, and a voltage supply circuit 41b connected to the second voltage line 32. At the time of operation of the imaging device 100A, the voltage supply circuit 41a applies the voltage $V_{RST}1$ to the first voltage line 31, and the voltage supply circuit 41b applies the voltage $V_{RST}2$ to the second voltage line 32. Each of the voltage supply circuits 41a and 41b may be an independent separate voltage supply circuit, or may be part of a single voltage supply circuit.

In the configuration illustrated to FIG. 2, the first voltage line 31 is connected to the source of the reset transistor 22 of the charge detector CDx. The drain of the reset transistor 22 of the charge detector CDx is connected to the charge accumulation node FDx. That is, the first voltage line 31 supplies a voltage $V_{RST}1$ to be applied from the first voltage supply circuit 41 to the charge detector CDx of each imaging cell 10Ax, the voltage $V_{RST}1$ serving as a reset voltage for resetting the potential of the charge accumulation node FDx. The second voltage line 32 is connected to the source of the reset transistor 22 of the charge detector CDy. The drain of the reset transistor 22 of the charge detector CDy is connected to the charge accumulation node FDy. That is, the second voltage line 32 supplies a voltage $V_{RST}2$ to be applied from the first voltage supply circuit 41 to the charge detector CDy of each imaging cell 10Ay, the voltage $V_{RST}2$ serving as a reset voltage for resetting the potential of the charge accumulation node FDy.

In the configuration illustrated to FIG. 2, the second voltage supply circuit 42 is connected to an accumulation control line 35 that has connection with the opposite electrode 62 (see FIG. 1) of the photoelectric converter PC. That is, in this example, the voltage supply circuit 42 supplies a common predetermined voltage $V_{OPP}$ to the opposite electrode 62x of the photoelectric converter PCx of each imaging cell 10Ax and the opposite electrode 62y of the photoelectric converter PCy of each imaging cell 10Ay via the accumulation control line 35. Hereinafter, for the sake of convenience of description, the voltage supplied by the voltage supply circuit 42 may be called "opposite electrode voltage". The opposite electrode voltage $V_{OPP}$ is fixed to a certain voltage at the time of operation of the imaging device 100A.

The imaging device 100A has a reset signal line 38 and an address signal line 39 which are provided for each row of the imaging cell 10A. The reset signal line 38 and the address signal line 39 are connected to a vertical scanning circuit 48 which is also called a row scanning circuit. As illustrated, the reset signal line 38 is connected to the gate of the reset transistor 22 of the imaging cells (here, the imaging cells 10Ax and 10Ay) belonging to the same row. The vertical scanning circuit 48 controls the potential of the reset signal line 38 and turns on the reset transistor 22, thereby making it possible to collectively reset the potentials of the charge accumulation nodes (here, the charge accumulation nodes FDx and FDy) of the imaging cells belonging to the same row. In contrast, the address signal line 39 is connected to the gate of the address transistor 23 of each of the multiple imaging cells (here, the imaging cells 10Ax and 10Ay) belonging to the same row. The vertical scanning circuit 48 can select the multiple imaging cells belonging to the same row on a row-by-row basis by controlling the potential of the address signal line 39. The multiple imaging cells belonging to the same row are selected on a row-by-row basis, thus the outputs of the signal detection transistors 21 of the imaging cells belonging to the same row can be collectively read to a corresponding vertical signal line 34.

Figure 3:
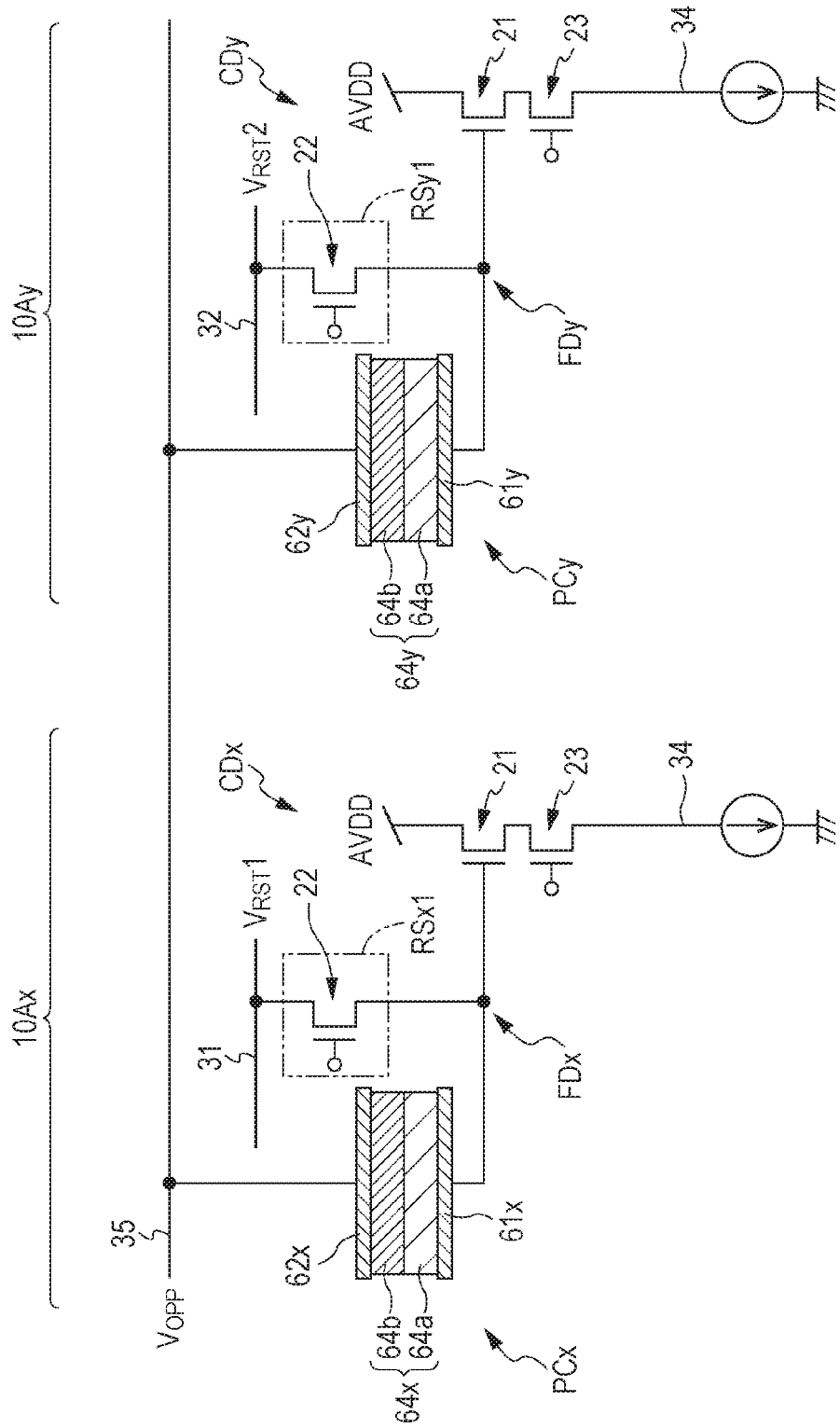
FIG. 3 selectively illustrates imaging cells adjacent in the row direction in a pixel array illustrated in FIG. 2.

FIG. 3 selectively illustrates the imaging cells 10Ax and 10Ay adjacent in the row direction in the pixel array PA illustrated in FIG. 2. As described with reference to FIG. 2, the accumulation control line 35 is connected in common to the opposite electrode 62x of the imaging cell 10Ax and the opposite electrode 62y of imaging cell 10Ay. Thus, in this example, at the time of operation of the imaging device 100A, a common opposite electrode voltage $V_{OPP}$ is applied from the voltage supply circuit 42 to the opposite electrodes 62x and 62y via the accumulation control line 35. Therefore, the opposite electrodes 62x and 62y have the same potential.

The voltage supply circuit 42 applies the opposite electrode voltage $V_{OPP}$ to the opposite electrodes 62x and 62y so that the potential of the opposite electrodes 62x and 62y is higher than the potential of the pixel electrodes 61x and 61y, for instance. For instance, when the potential of the opposite electrode 62x is made higher than the potential of the pixel electrode 61x, the positive charges in the positive and negative charges generated in the photoelectric conversion structure 64x by photoelectric conversion can be collected by the pixel electrode 61x. Similarly, when the potential of the opposite electrode 62y is made higher than the potential of the pixel electrode 61y, the positive charges in the positive and negative charges generated in the photoelectric conversion structure 64y by photoelectric conversion can be collected by the pixel electrode 61y. Hereinafter, a case will be illustrated where a positive hole is utilized as a signal charge. Needless to say, it is also possible to utilize an electron as a signal charge. When an electron is utilized as signal charge, it is only necessary to perform control to make the potential of the opposite electrodes 62x and 62y lower than the potential of the pixel electrodes 61x and 61y.

As illustrated in FIG. 3, the charge detector CDx of the imaging cell 10Ax has a reset circuit RSx1 that includes the reset transistor 22 having a source connected to the first voltage line 31. Similarly, the charge detector CDy of the imaging cell 10Ay has a reset circuit RSy1 that includes the reset transistor 22 having a source connected to the second voltage line 32. When the reset transistor 22 of the reset circuit RSx1 is turned on, the potential of the pixel electrode 61x is reset by a potential corresponding to the reset voltage $V_{RST}1$ applied to the first voltage line 31. Similarly, when the reset transistor 22 of the reset circuit RSy1 is turned on, the potential of the pixel electrode 61y is reset by a potential corresponding to the reset voltage $V_{RST}2$ applied to the second voltage line 32.

The potential of the pixel electrode 61x and the potential of the pixel electrode 61y at the start of a period of accumulation of signal charges can be made different by supplying the reset voltages $V_{RST}1$ and $V_{RST}2$ with different absolute values to the reset circuit RSx1 and the reset circuit RSy1, respectively. Hereinafter, a period of accumulation of signal charges is simply called a "charge accumulation period". After the reset of the potential of the pixel electrode 61x, the potential difference Φx between the opposite electrode 62x and the pixel electrode 61x immediately after turning off the reset transistor 22 of the charge detector CDx is expressed by $V_{OPP}-V_{RST}1$. Similarly, after the reset of the potential of the pixel electrode 61y, the potential difference Φy between the opposite electrode 62y and the pixel electrode 61y immediately after turning off the reset transistor 22 of the charge detector CDy is expressed by $V_{OPP}-V_{RST}2$. Here, the opposite electrode voltage $V_{OPP}$ is nearly constant over the charge accumulation period, and $V_{RST}1 \ne V_{RST}2$. Therefore, at the start of the charge accumulation period, in other words, at a time point immediately after the reset of the potential of the pixel electrode and before start of accumulation of charges in the charge accumulation region, the relationship Φx≠Φy holds. In other words, the bias voltage applied to the photoelectric conversion structure 64 at the start of accumulation of signal charges can be made different between the imaging cell 10Ax and the imaging cell 10Ay. When the imaging cell 10Ax and the imaging cell 10Ay are arranged close to each other, for instance, adjacent to each other, the quantities of light incident to the imaging cell 10Ax and the imaging cell 10Ay are approximately equal. Therefore, in this case, when the charge accumulation region is in common with these, it can be said that the difference between the amounts of electrical change in each charge accumulation region is small, and the relationship of Φx≠Φy holds over the charge accumulation period. What is noteworthy here is that conditions are intentionally made such that the relationship of Φx≠Φy holds between the imaging cell 10Ax and imaging cell 10Ay at the start of accumulation of signal charges. When the photoelectric conversion structure is not irradiated with light at all during the charge accumulation, the potential difference Φx between the opposite electrode 62x and the pixel electrode 61x at the start of the charge accumulation period is maintained until the end of the charge accumulation period. Similarly, the potential difference Φy between the opposite electrode 62y and the pixel electrode 61y at the start of the charge accumulation period is maintained until the end of the charge accumulation period. This also applies to other embodiments described below.

In this embodiment, the photoelectric conversion structure 64 of the photoelectric converter PC includes a multilayer structure having the first photoelectric conversion layer 64a and the second photoelectric conversion layer 64b. The first photoelectric conversion layer 64a and the second photoelectric conversion layer 64b include the first material and the second material, respectively. Electron-donating molecules are typically selected as the first material and the second material.

Appropriate materials are used as the first material and the second material according to a wavelength range to be detected. Different spectral sensitivity characteristics can be achieved between the photoelectric converter PCx and the photoelectric converter PCy, for instance, by setting the impedance of the first photoelectric conversion layer 64a to be greater than the impedance of the second photoelectric conversion layer 64b. Let D1 and Z1 be respectively the thickness and the impedance of the first photoelectric conversion layer 64a, and D2 and Z2 be respectively the thickness and the impedance of the second photoelectric conversion layer 64b, then magnitude E1 of the electric field applied to the first photoelectric conversion layer 64a and magnitude E2 of the electric field applied to the second photoelectric conversion layer 64b are given by the following Expressions (1) and (2).

$$E1=(Z1/(Z1+Z2))(\Phi/D1) \quad (1)$$

$$E2=(Z2/(Z1+Z2))(\Phi/D2) \quad (2)$$

Here, $\Phi$ represents the potential difference applied across the pixel electrode and the opposite electrode.

As described above, excitons generated by incident light to the photoelectric conversion structure 64 are efficiently separated into charges by the electric field caused by the potential difference applied across the pixel electrode and the opposite electrode, and for instance, positive charges are collected as signal charges by the pixel electrode. Here, let $E_{TH}$ be the magnitude of electric field necessary for separation of charges and movement of charges in the photoelectric conversion structure. For instance, when the thicknesses D1 and D2 are substantially equal and Z1 is sufficiently greater than Z2, the potential difference applied to the second photoelectric conversion layer 64b is relatively low, and the magnitude E2 of the electric field shown by the above-mentioned Expression (2) may fall below a threshold value $E_{TH}$. That is, when the potential difference $\Phi$ applied across the pixel electrode and the opposite electrode is relatively small, the charges generated in the first photoelectric conversion layer 64a are selectively detectable. On the other hand, when the potential difference $\Phi$ is relatively large, both the charges generated in the first photoelectric conversion layer 64a and the charges generated in the second photoelectric conversion layer 64b are detectable.

For instance, a case is assumed in which a material having a high absorption coefficient in a first wavelength range and a material having a high absorption coefficient in a second wavelength range are used as the first material and the second material, respectively. For instance, when the visible range is selected as the first wavelength range and the infrared range is selected as the second wavelength range, when the potential difference $\Phi$ is relatively high, the photoelectric converter has sensitivity to the visible range and the infrared range. On the other hand, when the potential difference $\Phi$ is relatively low, the photoelectric converter has sensitivity to the visible range. In the present description, the infrared range refers to a wavelength range of approximately 750 nm or greater, and particularly, near-infrared range refers to a wavelength range of 750 nm or greater and less than 2500 nm, for instance.

In this manner, the photoelectric conversion structure 64 is a multilayer structure having the first photoelectric conversion layer 64a and the second photoelectric conversion layer 64b, and appropriate materials are used as the first material and the second material according to a wavelength range to be detected. Thus, the spectral sensitivity characteristic of the photoelectric conversion structure 64 can be changed by changing the potential difference $\Phi$. It is to be noted that the above-mentioned magnitude relationship of the potential difference $\Phi$ indicates relative relationship, and a relatively high potential difference $\Phi$ may be less than 10 V.

In the configuration illustrated to FIG. 3, reset is executed using reset voltages having different absolute values between the pixel electrodes 61x and 61y while the opposite electrode voltage $V_{OPP}$ is used in common. Thus, at the start of a charge accumulation period, the bias voltage applied to the photoelectric conversion structure is made different between the imaging cell 10Ax and the imaging cell 10Ay. Therefore, different spectral sensitivity characteristics are obtained between the imaging cell 10Ax and the imaging cell 10Ay.

As described later, it is possible to change the spectral sensitivity characteristic of the photoelectric converter according to the potential difference $\Phi$ by setting the ionization potential of the first material to be greater than the ionization potential of the second material by 0.2 eV or more. The details of the photoelectric conversion structure will be described later.

(Device Structure of Imaging Cell)

Figure 4:
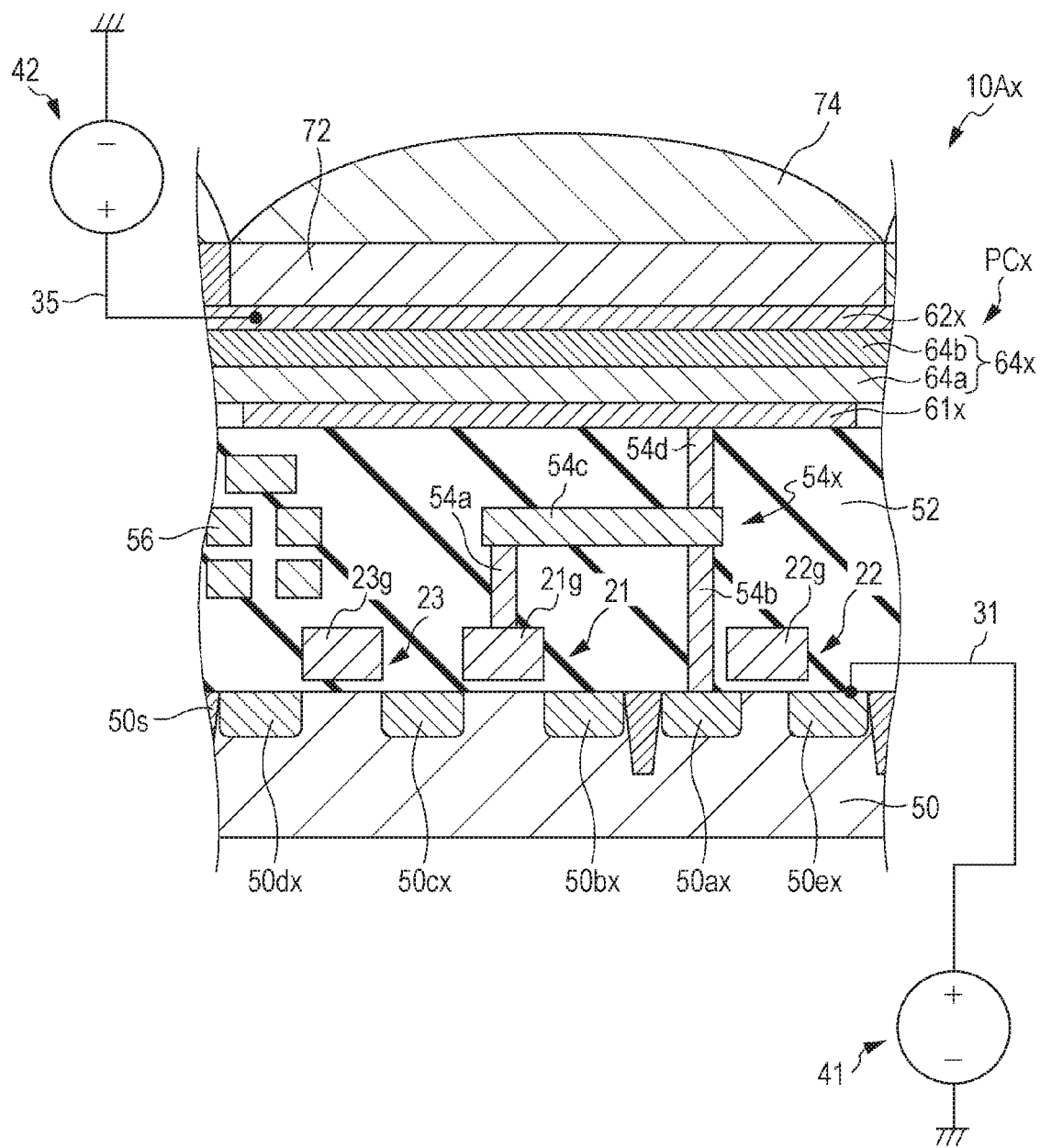
FIG. 4 is a schematic sectional view illustrating an exemplary device structure of an imaging cell included in the pixel array.

Here, the details of the device structure in an imaging cell will be described. FIG. 4 schematically illustrates an exemplary device structure of the imaging cell 10Ax or 10Ay included in the pixel array PA. The device structure of the imaging cell 10Ay illustrated in FIG. 3 is essentially the same as the device structure of the imaging cell 10Ax. Thus, the device structure is described using the imaging cell 10Ax as an example. FIG. 4 schematically illustrates the arrangement of the units included in the imaging cell. The dimension in the units illustrated in FIG. 4 does not necessarily match the dimension in an actual device. This applies to other drawings of the present disclosure.

As illustrated in FIG. 4, the imaging cell 10Ax includes part of the semiconductor substrate 50 that supports the photoelectric converter PC. The semiconductor substrate 50 is not limited to a substrate which is a semiconductor in its entirety, and may be an insulation substrate in which a semiconductor layer is provided on the surface on which the photoelectric converter PC is disposed. Hereinafter, P-type silicon (Si) substrate is exemplified as the semiconductor substrate 50. The interlayer insulation layer 52 positioned between the semiconductor substrate 50 and the photoelectric converter PCx is typically a silicon dioxide layer, and may have a multilayer structure of multiple insulation layers. The photoelectric conversion structure 64x in the photoelectric converter PCx includes a multilayer structure having the first photoelectric conversion layer 64a and the second photoelectric conversion layer 64b.

The semiconductor substrate 50 has impurity regions (here, N-type regions) 50ax to 50ex, and a device separation region 50s for electrical separation from adjacent another imaging cell (the imaging cell 10Ax or 10Ay). The impurity regions 50ax to 50ex are typically diffusion layers formed in the semiconductor substrate 50. The device separation region 50s is formed by, for instance, ion implantation of donor on predetermined implantation conditions. In this example, the device separation region 50s is also provided between the impurity region 50ax and the impurity region 50bx. It is to be noted that the center-to-center distance between two adjacent imaging cells in the row direction or the column direction may be on the order of 2 μm, for instance.

The above-described signal detection transistor 21 includes the impurity regions 50bx and 50cx formed in the semiconductor substrate 50, and a gate electrode 21g positioned above the region between the impurity regions 50b and 50c out of the major surface of the semiconductor substrate 50. The gate electrode 21g is typically a polysilicon electrode. The impurity regions 50bx and 50cx respectively serve as the drain region and the source region of the signal detection transistor 21. Although not illustrated in FIG. 4, the impurity region 50bx is connected to the power source wire 36 (see FIG. 2).

As schematically illustrated in FIG. 4, the gate electrode 21g of the signal detection transistor 21 is connected to the pixel electrode 61x and the impurity region 50ax via the connector 54x disposed in the interlayer insulation layer 52. In the example illustrated, the connector 54x includes a contact plug 54ax having one end connected to the gate electrode 21g, a contact plug 54b having one end connected to the impurity region 50a, a wiring layer 54c, and a plug 54d. The wiring layer 54c connects the other ends of the contact plugs 54a and 54b. The pixel electrode 61x, the connector 54x, and the impurity region 50ax form at least part of the charge accumulation region of the imaging cell 10Ax.

The contact plugs 54a, 54b and the wiring layer 54c are typically composed of polysilicon. The plug 54d disposed between the wiring layer 54c and the pixel electrode 61x is composed of copper, for instance. It is to be noted that in addition to the connector 54s, a wiring layer 56 including the vertical signal line 34 (see FIG. 2) is disposed in the interlayer insulation layer 52. The number of insulation layers in the interlayer insulation layer 52, and the number of layers included in wiring layers 56 disposed in the interlayer insulation layer 52 can be set to any number.

In the semiconductor substrate 50, not only the signal detection transistor 21, but also other transistors, such as the address transistor 23, and the reset transistor 22 are also formed. The address transistor 23 includes the impurity regions 50cx and 50dx, and a gate electrode 23g positioned above the region between the impurity regions 50c and 50d out of the major surface of the semiconductor substrate 50. The gate electrode 23g is typically a polysilicon electrode. The gate electrode 23g is connected to the address signal line 39 (not illustrated in FIG. 4, see FIG. 2). The impurity regions 50cx and 50dx respectively serve as the drain region and the source region of the address transistor 23. Here, the address transistor 23 is electrically connected to the signal detection transistor 21 by sharing the impurity region 50cx with the signal detection transistor 21. The impurity region 50dx is connected to the vertical signal line 34 via a plug which is not illustrated in FIG. 4.

The reset transistor 22 includes the impurity regions 50ax and 50ex, and a gate electrode 22g which is positioned above the region between the impurity regions 50ax and 50ex and is connected to the reset signal line 38 (see FIG. 2). The gate electrode 22g is also typically a polysilicon electrode. The impurity region 50ax serves as one of the drain region and the source region of the reset transistor 22, and the impurity region 50ex serves as the other of the drain region and the source region of the reset transistor 22. Here, the impurity region 50ex is connected to the first signal line 31.

As described above, the photoelectric converter PCx includes the pixel electrode 61x, the opposite electrode 62x, and the photoelectric conversion structure 64x interposed between the pixel electrode 61x and the opposite electrode 62x. Upon receiving incident light, the photoelectric conversion structure 64x generates positive and negative charges (typically positive hole-electron pairs) by photoelectric conversion. When a potential difference is applied across the pixel electrode 61x and the opposite electrode 62x, positive and negative charges are moved according to the electric field generated between the pixel electrode 61x and the opposite electrode 62x. For instance, it is assumed that the potential of the opposite electrode 62x is higher than the potential of the pixel electrode 61x, and the potential difference (13x between the opposite electrode 62x and pixel electrode 61x is high to some extent. In this situation, the positive charges out of the positive and negative charges generated in the photoelectric conversion structure 64x can be collected by the pixel electrode 61x, and the collected charges can be accumulated in the charge accumulation node FDx as signal charges.

The opposite electrode 62x of the photoelectric converter PCx is typically a transparent electrode composed of a transparent conductive material. Therefore, the opposite electrode 62 having the opposite electrodes 62x and 62y is typically a transparent electrode. The opposite electrode 62x is arranged on the light incident side of the photoelectric conversion structure 64x. In other words, the opposite electrode 62x is positioned more distant from the semiconductor substrate 50 than the pixel electrode 61x. For instance, transparent conducting oxide (TCO), such as ITO, IZO, AZO, FTO, $SnO_2$, $TiO_2$, $ZnO_2$ may be used as the material of the opposite electrode 62x. It is to be noted that "transparent" in the present description means that at least part of light with a wavelength range to be detected can transmit, and it is not required that light can transmit for the entire wavelength range of visible light. In the present description, visible light refers to light with a wavelength in a range of 380 nm or greater and less than 750 nm. In the present description, entire electromagnetic wave including infrared light and ultraviolet rays is represented by "light" for the sake of convenience. The light detected by the imaging device in the present disclosure is not limited to the light with a wavelength range of visible light.

In this example, the opposite electrode 62 that includes, in part, the opposite electrodes 62x and 62y forms a single continuous electrode between multiple imaging cells. Therefore, it is possible to apply an opposite electrode voltage with a desired amplitude collectively from the voltage supply circuit 42 to the opposite electrode 62x and 62y of the multiple imaging cells via the accumulation control line 35.

In contrast, the pixel electrode 61x is provided independently for each imaging cell 10Ax. The pixel electrode 61x is spatially separated from the pixel electrode (the pixel electrode 61x or 61y) of another adjacent imaging cell, and thus is electrically separated from the pixel electrode of another imaging cell. The pixel electrode 61x is composed of metal such as aluminum, copper, and titanium, metal nitride, or polysilicon to which conductivity is imparted by doping impurities. The pixel electrode 61x may be a single electrode or may include multiple electrodes. For instance, TiN or TaN may be used as the material for the pixel electrode 61x, which may serve as a light-blocking electrode.

The signal charges (for instance, positive holes) collected by the pixel electrode 61x are accumulated in the charge accumulation region including the charge accumulation node FD. The accumulation of signal charges in the charge accumulation node FDx causes a voltage according to the amount of the accumulated signal charges to be applied to the gate of the signal detection transistor 21 of the charge detector CDx. A voltage amplified by the signal detection transistor 21 is selectively read in the form of signal voltage via the address transistor 23. It is to be noted that the charge accumulation region may include a capacitor, for instance. That is, the charge detector CDx may include not only the impurity region 50ax in which signal charges are accumulated, but also a capacitor (not illustrated in FIG. 4) in which signal charge can be accumulated, for instance. This also applies to the charge detector CDy of the imaging cell 10Ay.

In the example illustrated in FIG. 4, a color filter 72 and a microlens 74 are disposed above the opposite electrode 62x. As a replacement for the color filter 72 or along with the color filter 72, an infrared transmissive filter, a protection layer, or the like is disposed between the microlens 74 and the opposite electrode 62x. It is not required to dispose a microlens 74 corresponding to each of the imaging cells 10Ax and Ay. For instance, as illustrated in FIG. 5, one microlens may be shared by the imaging cells 10Ax and Ay.

Figure 5:
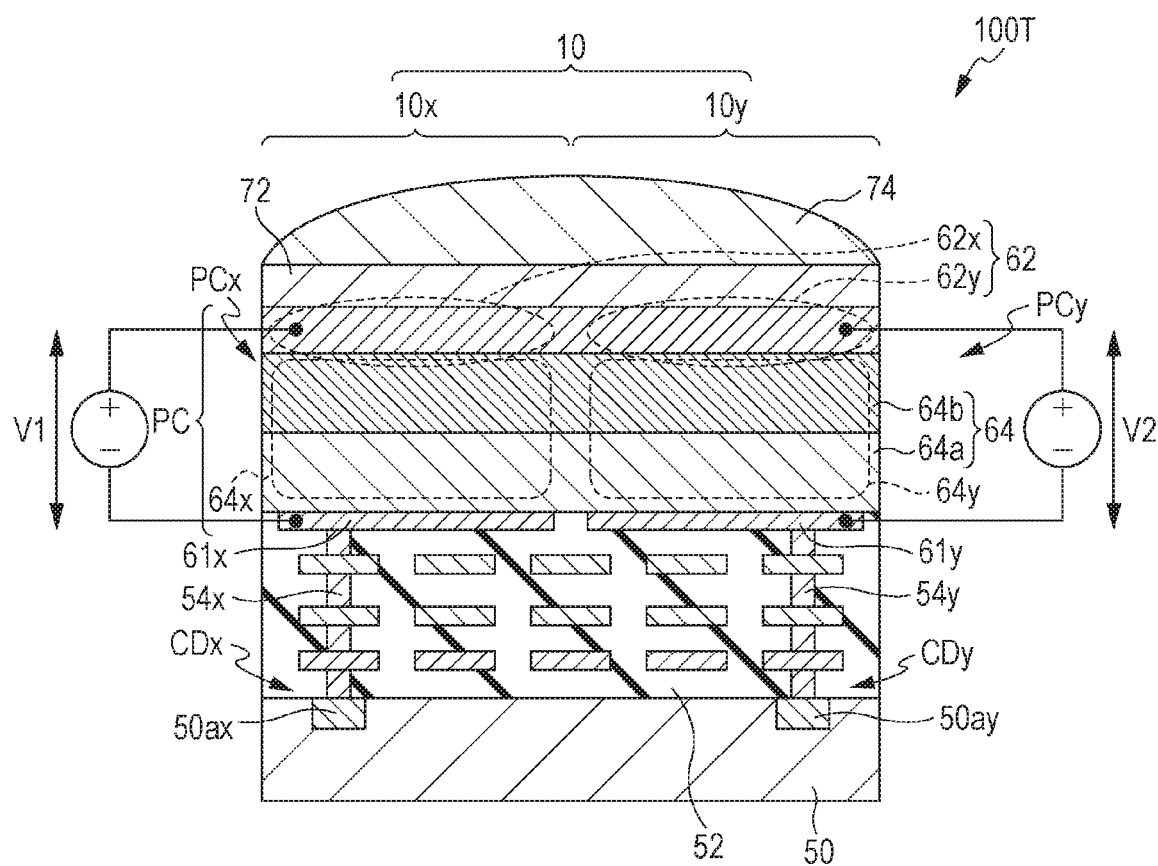
FIG. 5 is a schematic sectional view illustrating an example of configuration in which one microlens and color filter are shared between the imaging cells adjacent to each other.

An imaging device 100T illustrated in FIG. 5 includes a pair of adjacent imaging cells 10Ax and Ay, and one microlens 74 and one color filter 72 are shared between these imaging cells 10Ax and 10Ay. The pixel value of one pixel in an image may be determined by an image signal obtained by a pair of these imaging cells.

For instance, it is assumed that the imaging cell 10Ax outputs an image signal based on visible light and infrared light, and the imaging cell 10y outputs an image signal based on visible light. In this case, when each of pairs of the imaging cells 10Ax and 10Ay included in the pixel array is associated with each pixel, the output of the imaging cell 10Ay is extracted from each pair, and the pixel value of each pixel is determined, then an image based on visible light can be formed. Alternatively, when the pixel value of each pixel is determined by the difference between the output of the imaging cell 10Ax and the output of the imaging cell 10Ay, an image based on visible light can be formed. Although image signals obtained from both of the imaging cells 10Ax and 10Ay arranged close to each other in the pixel array are signals based on light with different wavelength ranges, synchronization is guaranteed. That is, it is possible to obtain multiple signals based on light with different wavelength ranges.

Figure 6:
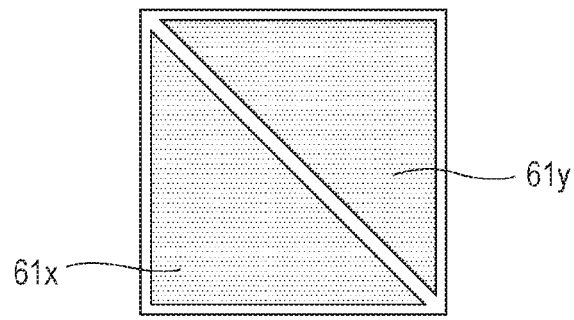
FIG. 6 is a plan view illustrating an example of the shape of pixel electrodes as seen in the normal direction of a semiconductor substrate.
Figure 7:
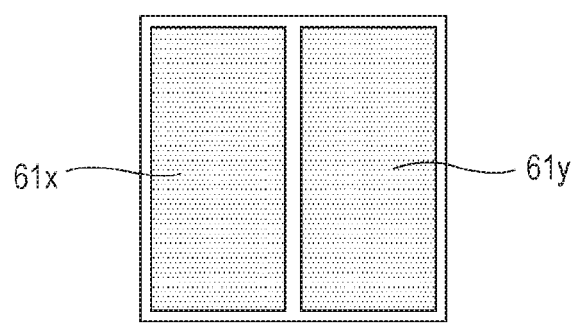
FIG. 7 is a plan view illustrating another example of the shape of pixel electrodes as seen in the normal direction of the semiconductor substrate.
Figure 8:
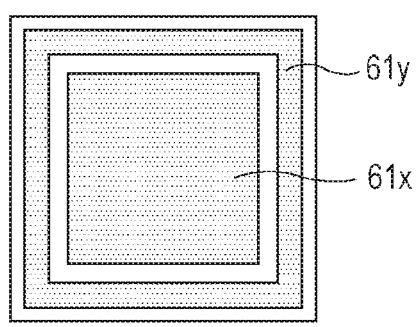
FIG. 8 is a plan view illustrating still another example of the shape of pixel electrodes as seen in the normal direction of the semiconductor substrate.

FIGS. 6 to 8 illustrate an example of the shape of pixel electrodes 61x and 61y. In the embodiment of the present disclosure, the pixel electrodes 61x and 61y may have any shape when viewed in a normal direction of the semiconductor substrate 50. For instance, as illustrated in FIG. 6, the contours of the pixel electrodes 61x and 61y may be right triangles, and the pixel electrodes 61x and 61y may be arranged so that hypotenuses face each other. A single microlens and/or a color filter with a certain color may be disposed so as to cover these pixel electrodes 61x and 61y. The areas of the pixel electrodes 61x and 61y may be the same, and may be different. As illustrated in FIG. 7, the contours of the pixel electrodes 61x and 61y may be rectangles, and the pixel electrodes 61x and 61y may be arranged in a square region. Alternatively, as illustrated in FIG. 8, as the geometry of the pixel electrodes 61x and 61y, one of the electrodes 61x and 61y may surround the other. The contour of the "pixel" defined by a pair of imaging cells 10Ax and 10y is not limited to the square as illustrated.

Variation of First Embodiment

Figure 9:
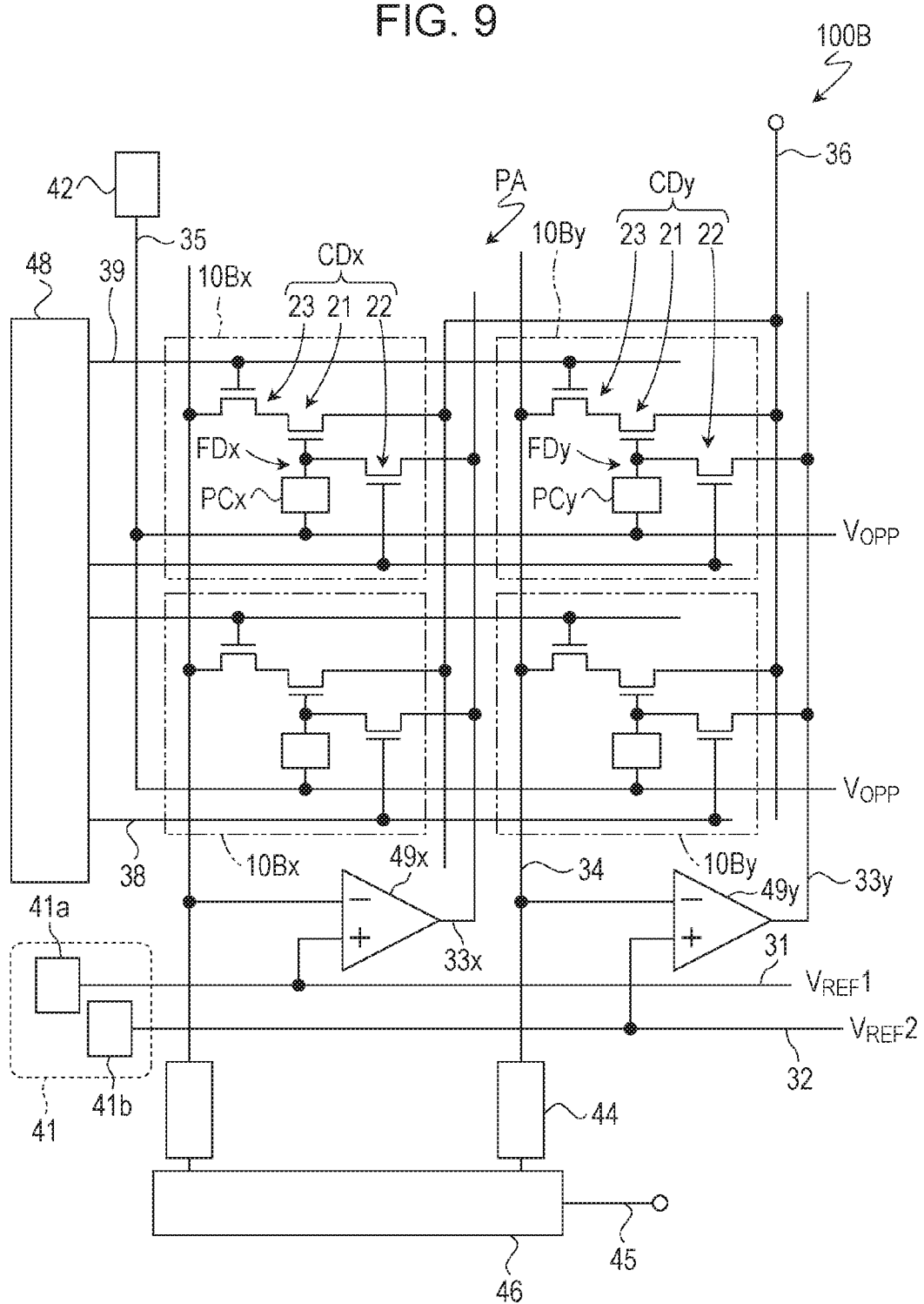
FIG. 9 is a diagram illustrating an exemplary circuit configuration of an imaging device according to a variation of the first embodiment.

FIG. 9 illustrates an exemplary circuit configuration of an imaging device according to a variation of the first embodiment. The pixel array PA of an imaging device 100B illustrated in FIG. 9 has multiple imaging cells each including at least one pair of the imaging cells 10Bx and 10By. Similarly to FIG. 2, in FIG. 9, a pixel block including four imaging cells arranged in two rows by two columns among the multiple imaging cells is taken and illustrated. In this example, two imaging cell 10Bx are arranged in the first column of the pixel block, and two imaging cells 10By are arranged in the second column.

As illustrated in FIG. 9, the imaging device 100B has an inverting amplifier for each column of the multiple imaging cells. First, attention is focused on the first column of the pixel block. An inverting amplifier 49x is arranged in the first column of the pixel block, and the inverting input terminal is connected to the vertical signal line 34 of the first column. That is, the inverting input terminal of the inverting amplifier 49x receives the output of the imaging cell 10Bx positioned in the first column. The output terminal of the inverting amplifier 49x is connected to a feedback line 33x. In this example, the source of the reset transistor 22 of the imaging cell 10Bx is connected to the feedback line 33x instead of the first voltage line 31. As seen from FIG. 9, one of the imaging cell 10Bx belonging to the first column is selected, and the reset transistor 22 and the address transistor 23 are turned on, thereby forming a feedback loop for causing negative feedback of the signal generated by the photoelectric converter PCx of the imaging cell 10Bx. The effect of random noise can be canceled by utilizing the negative feedback as described in International Publication No. WO 2014/024581.

Next, when attention is focused on the second column of the pixel block, an inverting amplifier 49y having an inverting input terminal connected to the vertical signal line 34 of the second column is disposed in the second column of the pixel block. The output terminal of the inverting amplifier 49y is connected to the feedback line 33y which is connected to the source of the reset transistor 22 of the imaging cell 10By.

In this example, the first voltage line 31 is connected to the non-inverting input terminal of the inverting amplifier 49x in the first column, and the second voltage line 32 is connected to the non-inverting input terminal of the inverting amplifier 49y in the second column. Here, the voltage supply circuit 41a supplies a reference voltage $V_{REF}1$ to the non-inverting input terminal of the inverting amplifier 49x via the first voltage line 31. In contrast, the voltage supply circuit 41b supplies a reference voltage $V_{REF}2$ to the non-inverting input terminal of the inverting amplifier 49y via the second voltage line 32. Here, the reference voltage $V_{REF}2$ has an absolute value different from the absolute value of the reference voltage $V_{REF}1$.

As described later, in the configuration illustrated to FIG. 9, the voltage level of the pixel electrode that gives a level of image signal at a dark time is dependent on and determined by the reference voltage $V_{REF}$ applied to the non-inverting input terminal of the inverting amplifier disposed in each column. That is, in this example, at the time of operation of the imaging device 100B, the voltage supply circuit 41 supplies the reference voltage $V_{REF}1$ for resetting the potential of the charge accumulation node FDx to the inverting amplifier 49x in the first column via the first signal line 31. Also, the voltage supply circuit 41 supplies the reference voltage $V_{REF}2$ for resetting the potential of the charge accumulation node FDy to the inverting amplifier 49y in the second column via the second signal line 32.

Figure 10:
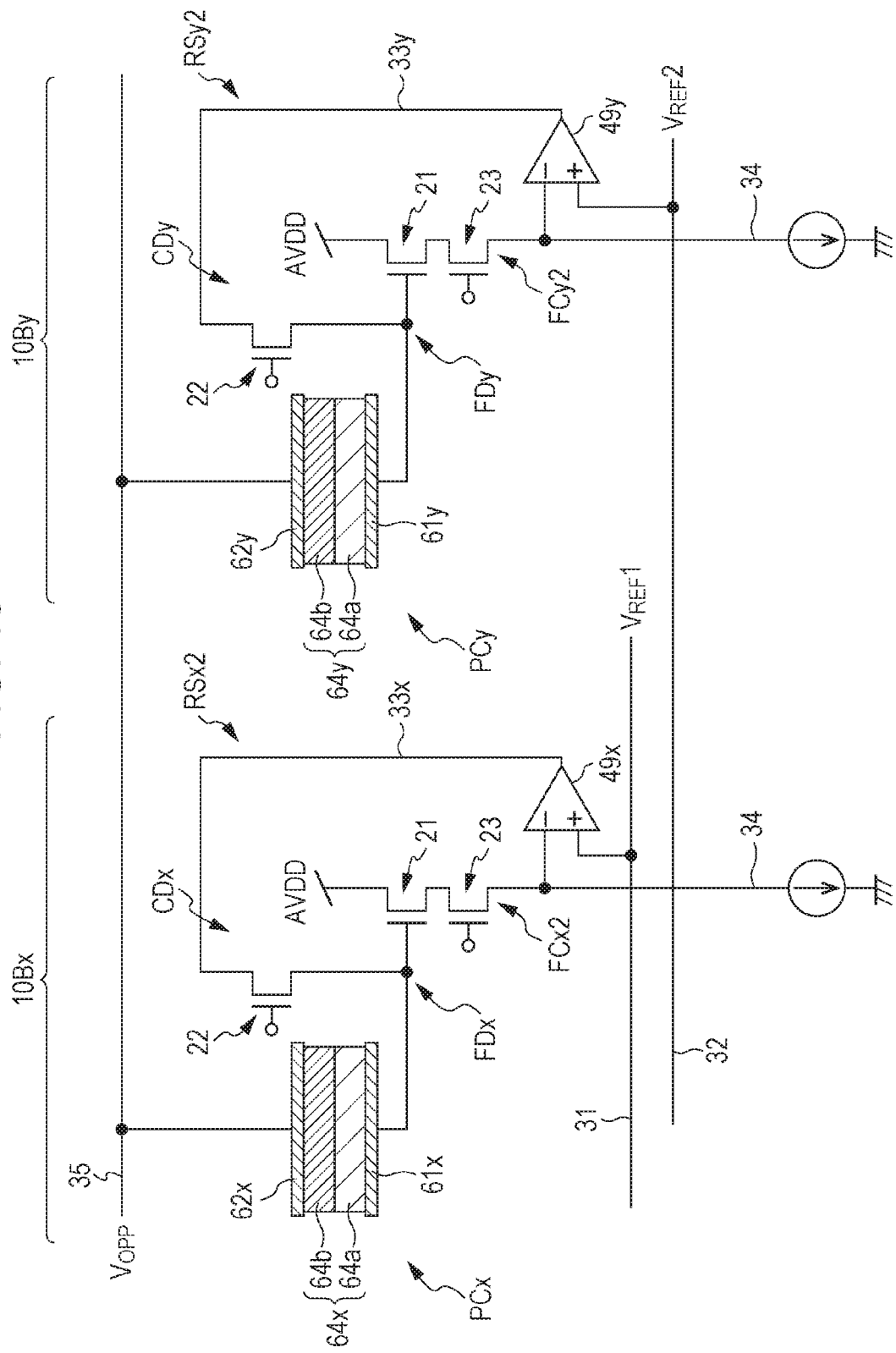
FIG. 10 selectively illustrates imaging cells adjacent in the row direction in the pixel array illustrated in FIG. 9.

FIG. 10 selectively illustrates the imaging cells 10Bx and 10By adjacent in the row direction in the pixel array PA illustrated in FIG. 9. As illustrated in FIG. 10, the charge detector CDx of the imaging cell 10Bx includes a reset circuit RSx2. The reset circuit RSx2 has a feedback circuit FCx2 including the inverting amplifier 49x. The inverting input terminal of the inverting amplifier 49x is electrically connected to the source of the signal detection transistor 21 via the address transistor 23. The feedback circuit FCx2 forms a feedback loop, thereby causing negative feedback of the electrical signals generated in the photoelectric converter PCx. The charge detector CDy of the imaging cell 10By includes a reset circuit RSy2. The reset circuit RSy2 has a feedback circuit FCy2 including the inverting amplifier 49y. The inverting input terminal of the inverting amplifier 49y is electrically connected to the source of the signal detection transistor 21 via the address transistor 23. The feedback circuit FCy2 forms a feedback loop, thereby causing negative feedback of the electrical signals generated in the photoelectric converter PCy.

Here, an overview of noise cancellation utilizing negative feedback will be described. Noise cancellation utilizing negative feedback is executed before signal charges are accumulated in a charge accumulation region. Such an operation is also called an "electronic shutter". Thus, the potential of the pixel electrode after the noise cancellation gives the voltage level of an image signal at a dark time.

In the configuration illustrated to FIGS. 9 and 10, reset and noise cancellation are executed as follows. Here, the operation of reset and noise cancellation is described with attention focused on the imaging cell 10Bx.

First, the reset transistor 22 and the address transistor 23 are turned on. When the reset transistor 22 and the address transistor 23 are turned on, a feedback loop including the inverting amplifier 49x in the path is formed. Due to the formation of a feedback loop, the voltage of the charge accumulation node FDx converges to a voltage that causes zero difference between the voltage of the vertical signal line 34, and the voltage applied to the non-inverting input terminal of the inverting amplifier 49x. Here, the non-inverting input terminal of the inverting amplifier 49x is connected to the first signal line 31. Therefore, at the time of formation of a feedback loop, the voltage of the charge accumulation node FDx converges to a voltage that equate the voltage of the vertical signal line 34, and the reference voltage $V_{REF}1$. That is, the reset circuit RSx2 resets the potential of the pixel electrode 61x to a predetermined potential.

Subsequently, the reset transistor 22 is turned off and noise cancellation is executed. At this point, the potential of the reset signal line 38 (not illustrated in FIG. 10, see FIG. 9) connected to the gate of the reset transistor 22 is gradually reduced from a high level to a low level to cross a threshold voltage of the reset transistor 22. When the potential of the reset signal line 38 is gradually reduced from a high level to a low level, the reset transistor 22 gradually changes from an ON state to an OFF state. While the reset transistor 22 is on, the formation of a feedback loop is maintained. In this situation, as the voltage applied to the reset signal line 38 decreases, the resistance of the reset transistor 22 increases. When the resistance of the reset transistor 22 increases, the operation range of the reset transistor 22 is reduced, and the frequency domain of returned signals is reduced.

When the voltage applied to the reset signal line 38 reaches a low level, the reset transistor 22 is turned off. In short, formation of a feedback loop is eliminated. The reset transistor 22 is turned off with the operation range of the reset transistor 22 lower than the operation range of the signal detection transistor 21, and thus kTC noise which remains in the charge accumulation node FDx can be reduced. At this time, the potential of the charge accumulation node FDx is at a predetermined potential. After the reduction of the kTC noise remained in the charge accumulation node FDx, the address transistor 23 is turned off, and accumulation of signal charges is started.

As is clear from the description of the aforementioned operation, with the configuration illustrated in FIG. 10, the voltage level of the pixel electrode 61x, which gives a level of image signal at a dark time of each imaging cell 10Bx belonging to the first column, is dependent on and determined by the reference voltage $V_{REF}1$ applied to the first voltage line 31. Since the operations of reset and noise cancellation itself are in common between the first column and the second column, the voltage level of the pixel electrode 61y, which gives a level of image signal at a dark time of each imaging cell 10By belonging to the second column is dependent on and determined by the reference voltage $V_{REF}2$ applied to the second voltage line 32. Here, the absolute value of the reference voltage $V_{REF}2$ is different from the absolute value of the reference voltage $V_{REF}1$. Therefore, the reset circuit RSy2 of the imaging cell 10By resets the potential of the pixel electrode 61y to a potential different from the potential after the reset of the pixel electrode 61x of the imaging cell 10Bx.

Since a common opposite electrode voltage $V_{OPP}$ is applied to the opposite electrode 62x and the opposite electrode 62y, the opposite electrode 62x and the opposite electrode 62y have the same potential. Therefore, the relationship of $\Phi x \neq \Phi y$ holds at the start of the charge accumulation period for the potential difference $\Phi x=(V_{OPP}-V_{REF}1)$ between the opposite electrode 62x and the pixel electrode 61x, and the potential difference $\Phi y=(V_{OPP}-V_{REF}2)$ between the opposite electrode 62y and the pixel electrode 61y.

In this manner, the pixel electrode 61x of the imaging cell 10Bx and the pixel electrode 61y of the imaging cell 10By can be reset to different potentials by making the reference voltage $V_{REF}$ different between the imaging cells 10Bx and 10By, the bias voltage applied to the photoelectric conversion structure at the start of a charge accumulation period can be made different between the imaging cell 10Bx and the imaging cell 10By. Therefore, the imaging cells with different spectral sensitivity characteristics can be mixed in the pixel array. As in the example illustrated in FIG. 9, when the inverting amplifiers, to which the reference voltages $V_{REF}1$ and $V_{REF}2$ with different absolute values are respectively supplied, are alternately disposed column by column in the multiple imaging cells, an output, in which an image signal based on light with a certain wavelength range, and an image signal based on light with another wavelength range are interleaved column by column, is obtained.

Second Embodiment

Instead of making the potential of the pixel electrode immediately before the start of accumulation of signal charges different between the multiple imaging cells as in the embodiment described above, the potential of the opposite electrode may be made different between the multiple imaging cells. As illustrated in FIG. 1, the opposite electrode 62 of the photoelectric converter PC is typically formed over the multiple imaging cells. However, it is not required for the imaging device in the present disclosure to form the opposite electrode 62 over the multiple imaging cells.

Figure 11:
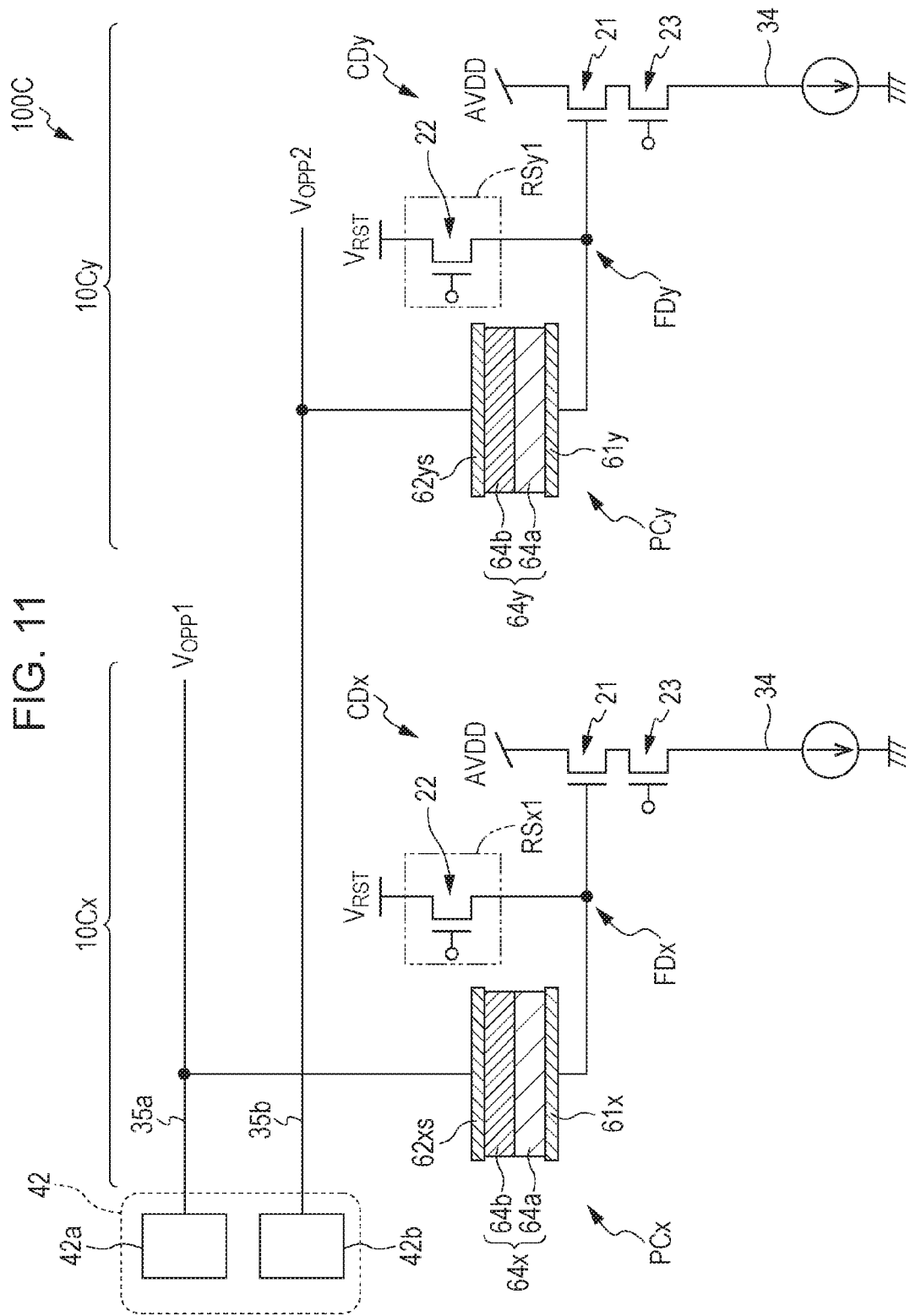
FIG. 11 is a diagram illustrating the circuit configuration of two imaging cells taken from the imaging cells included in the pixel array of the imaging device according to a second embodiment of the present disclosure.

FIG. 11 illustrates an exemplary circuit configuration of an imaging cell of an imaging device according to a second embodiment of the present disclosure. FIG. 11 illustrates the circuit configuration of two imaging cells taken from the imaging cells included in the pixel array PA.

An imaging device 100C illustrated in FIG. 11 has imaging cells 10Cx and 10Cy. Similarly to the example described with reference to FIG. 3, the charge detector CDx of the imaging cell 10Cx and the charge detector CDy of the imaging cell 10Cy respectively include reset circuits RSx1 and RSy1 that each include the reset transistor 22. Here, the potential of the pixel electrode 61 of the imaging cell 10Hx and the potential of the pixel electrode 61 of the imaging cell 10Hy after the reset are the same. In other words, in this example, the potential of the pixel electrode 61x of the imaging cell 10cx and the potential of the pixel electrode 61y of the imaging cell 10cy after the reset are the same.

A photoelectric converter PCx of the imaging cell 10Cx has an opposite electrode 62xs, and a photoelectric converter PCy of the imaging cell 10Cy has an opposite electrode 62ys electrically separated from the opposite electrode 62xs. As illustrated in FIG. 11, the opposite electrode 62xs and the opposite electrode 62ys are connected to the first voltage line 35a and the second voltage line 35b, respectively. The first voltage line 35a and the second voltage line 35b are connected to the voltage supply circuit 42.

In the configuration illustrated to FIG. 11, the voltage supply circuit 42 includes voltage supply circuits 42a and 42b. Here, the first voltage line 35a and the second voltage line 35b are connected to the voltage supply circuits 42a and 42b, respectively. The voltage supply circuit 42a supplies a first opposite electrode voltage $V_{OPP}1$ to the first voltage line 35a. The voltage supply circuit 42b supplies a second opposite electrode voltage $V_{OPP}2$ to the second voltage line 35b. That is, in this example, the imaging device 100C is configured to allow different voltages to be independently applied to the opposite electrode 62xs connected to the first voltage line 35a, and the opposite electrode 62ys connected to the second voltage line 35b. The voltage supply circuits 42a and 42b may be separate independent voltage supply circuits, or may be part of a single voltage supply circuit.

At the time of operation of the imaging device 100C, each of the opposite electrode voltage $V_{OPP}1$ and the opposite electrode voltage $V_{OPP}2$ may be fixed to a constant value, or may vary periodically or quasi-periodically. For instance, in the charge accumulation period of an imaging cell 10Cx, the opposite electrode voltage $V_{OPP}1$ may be supplied to the first voltage line 35a, and in the charge accumulation period of the imaging cells 10Cy belonging to the same row as the imaging cell 10Cx, the opposite electrode voltage $V_{OPP}2$ with an absolute value different from the absolute value of the opposite electrode voltage $V_{OPP}1$ may be supplied to the second voltage line 35b. The opposite electrode voltage applied to the opposite electrode in the charge accumulation is made different between the imaging cell 10Cx and the imaging cell 10Cy, and thus the potential of the opposite electrode 62xs of the imaging cell 10Cx, and the potential of the opposite electrode 62ys of the imaging cell 10Cy can be made different in the charge accumulation. For instance, when a common reset voltage is used as in this example, the bias voltage applied to the photoelectric conversion structure in the charge accumulation can be made different between the imaging cell 10Cx and the imaging cell 10Cy. Consequently, the sensitivity of the imaging cell 10Cx and the sensitivity of the imaging cell 10Cy can be made different.

In this manner, separation of the opposite electrode 62 between the imaging cell 10Cx and the imaging cell 10Cy allows the opposite electrode voltages with different absolute values to be independently applied to the opposite electrode 62xs of the imaging cell 10Cx and the opposite electrode 62ys of the imaging cell 10Cy. Consequently, similarly to the first embodiment, the imaging cells with different spectral sensitivity characteristics can be mixed in the pixel array PA.

For instance, by applying photolithography, the opposite electrode 62xs and the opposite electrode 62ys can be formed with spatially separated, and these opposite electrodes can be electrically separated. For instance, multiple opposite electrodes may be formed in which the imaging cells are spatially separated column by column. In this case, multiple strip-shaped opposite electrodes each extending in the column direction are arranged in the row direction, and the first voltage line 35a and the second voltage line 35b may be alternately connected to these multiple opposite electrodes. Specifically, the imaging cells 10Cx and 10Cy are arranged in, for instance, the odd columns and the even columns of the pixel array PA, respectively, and different opposite electrode voltages may be applied to the odd columns and the even columns of the pixel array PA. In this case, for instance, an output, in which an image signal based on light with a certain wavelength range, and an image signal based on light with another wavelength range are interleaved column by column, is obtained. Alternatively, the opposite electrodes may be electrically separated row by row in the multiple imaging cells. In this case, multiple strip-shaped opposite electrodes each extending in the row direction are formed in the column direction, and the first voltage line 35a and the second voltage line 35b may be alternately connected to these multiple opposite electrodes. The latter is more advantageous than the former from the viewpoint of reduction in the number of wires per row.

In the latter case, the imaging cells 10Cx and 10Cy are adjacent to each other in the column direction. Therefore, in this case, the start timing of the charge accumulation period of the imaging cell 10Cx does not match the start timing of the charge accumulation period of the imaging cell 10Cy. For instance, when a rolling shutter operation is applied, the start timing of the charge accumulation period of the imaging cell 10Cx belonging to a certain row may not match the start timing of the charge accumulation period of the imaging cell 10Cx belonging to another row. However, even in this case, the vertical signal line 34 is independently provided to each of the imaging cell 10Cx and the imaging cell 10Cy that are adjacent in the column direction, and thus the start timings of the charge accumulation periods between these imaging cells can be matched.

The opposite electrode voltages $V_{OPP}1$ and $V_{OPP}2$ to be supplied to the first voltage line 35a and the second voltage line 35b, respectively in a period other than the charge accumulation period may be the same. In a period other than the charge accumulation period, for instance, a period for reset, an opposite electrode voltage $V_{OPP}$ substantially equivalent to the reset voltage VRST may be applied in common to the first voltage line 35a and the second voltage line 35b. Consequently, in the period, the first bias voltage V1 applied to the photoelectric conversion structure 64x, and the second bias voltage V2 applied to the photoelectric conversion structure 64y can be a value near 0 V. When the potential difference Φ applied across a pair of electrodes, by which the photoelectric conversion structure is interposed, is substantially 0 V, even when light enters the photoelectric conversion structure, the positive charges generated in the photoelectric conversion structure are not collected by the pixel electrode. Also, backflow of charge from the charge accumulation region to the photoelectric conversion structure hardly occurs. That is, a state can be achieved in which substantially no charges are moved between the photoelectric conversion structure and the electrodes by making the potential difference Φ nearly 0 V, and even when the photoelectric conversion structure is irradiated with light, the potential of the charge accumulation node hardly changes and the sensitivity is substantially zero. In other words, a state with a shutter closed can be electrical control. The details of the configuration of the photoelectric conversion structure 64, which gives such a characteristic, will be described later.

Third Embodiment

Figure 12:
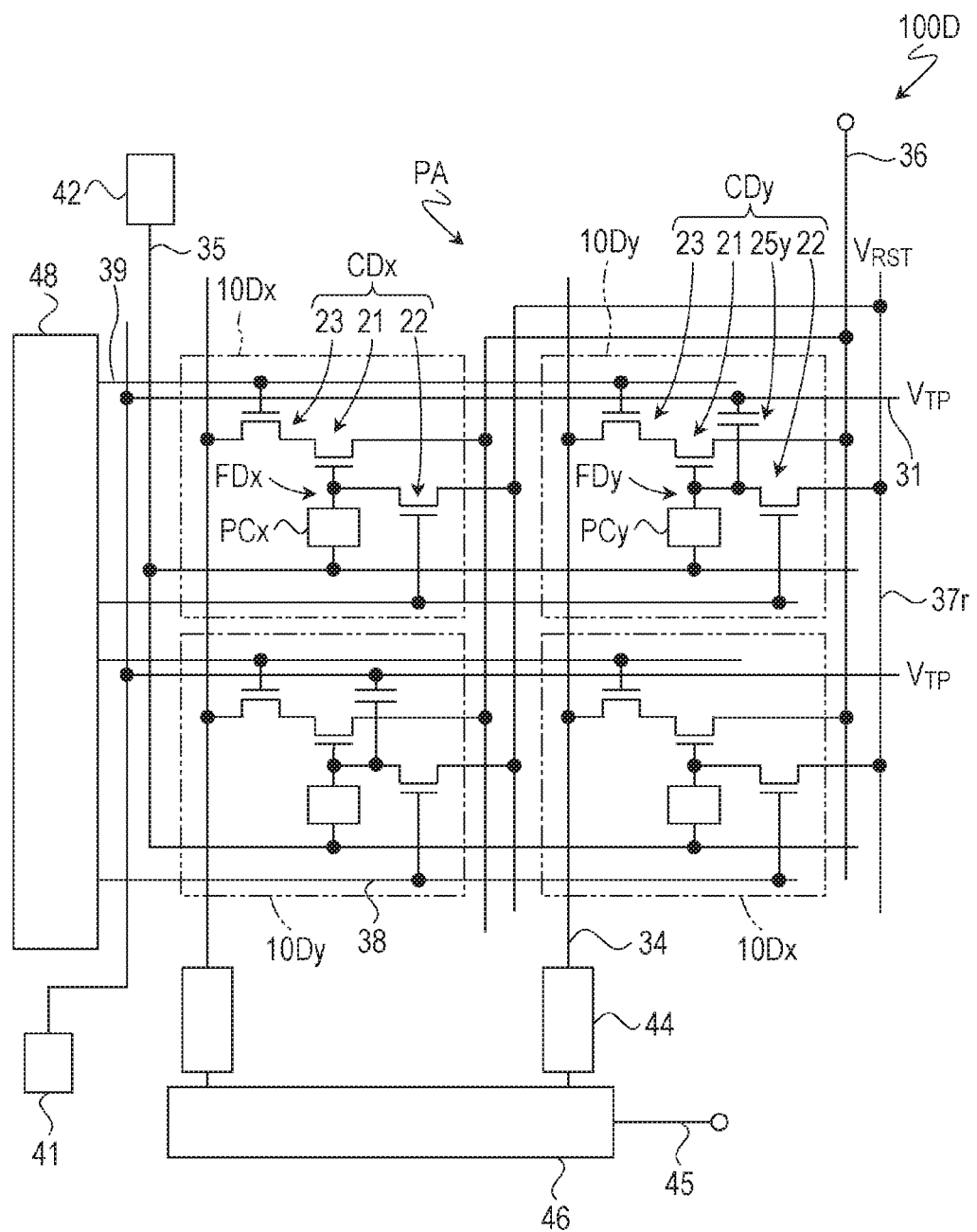
FIG. 12 is a diagram illustrating an exemplary circuit configuration of an imaging device according to a third embodiment of the present disclosure.

FIG. 12 illustrates an exemplary circuit configuration of an imaging device according to a third embodiment of the present disclosure. A pixel array PA of imaging devices 100D illustrated in FIG. 12 has multiple imaging cells each including at least one pair of the imaging cells 10Dx and 10Dy.

Similarly to FIGS. 2 and 9, in FIG. 12, a pixel block including four imaging cells arranged in two rows by two columns among the multiple imaging cells is taken and illustrated. The pixel block illustrated in FIG. 12 has two imaging cells 10Dx and two imaging cells 10Dy. In this example, the imaging cells 10Dx and 10Dy are adjacent to each other in the row direction as well as in the column direction.

The circuit configuration of imaging cell 10Dx is substantially the same as the circuit configuration of imaging cell 10Ax, which has been described with reference to FIG. 2. However, in this example, the source of the reset transistor 22 of the charge detector CDx is not connected to the first voltage line 31 but is connected to a reset voltage line 37r that receives supply of the reset voltage VRST at the time of operation of the imaging device 100D.

The source of the reset transistor 22 of the charge detector CDy of the imaging cell 10Dy is also connected to the reset voltage line 37r. Therefore, in this example, the potential of the pixel electrode of the imaging cell 10Dy after reset is the same as the potential of the pixel electrode of the imaging cell 10Dx after reset.

The charge detector CDy of the imaging cell 10Dy has a capacitor 25y having one of electrodes connected to charge accumulation node FDy, in addition to the signal detection transistor 21, the reset transistor 22, and the address transistor 23. The other electrode of the capacitor 25y is connected to the first voltage line 31 which is connected to voltage supply circuit 41. That is, the capacitor 25y is connected between the first voltage line 31 and the pixel electrode of the photoelectric converter PCy. It is to be noted that in this example, a parasitic capacitance may exist between the first voltage line 31 and the charge accumulation node FDx, however, the capacitive value of the parasitic capacitance is so small to be neglectable compared with the capacitive value of the charge accumulation node FDx. That is, the first signal line 31 has no intentional electrical coupling between the imaging cell 10Dx and itself. In the configuration illustrated to FIG. 12, the voltage supply circuit 41 selectively supplies a voltage $V_{TP}$ to the capacitor 25y of the imaging cell 10Dy via the first voltage line 31. In the following description, the voltage $V_{TP}$ may be called the "offset voltage $V_{TP}$".

Figure 13:
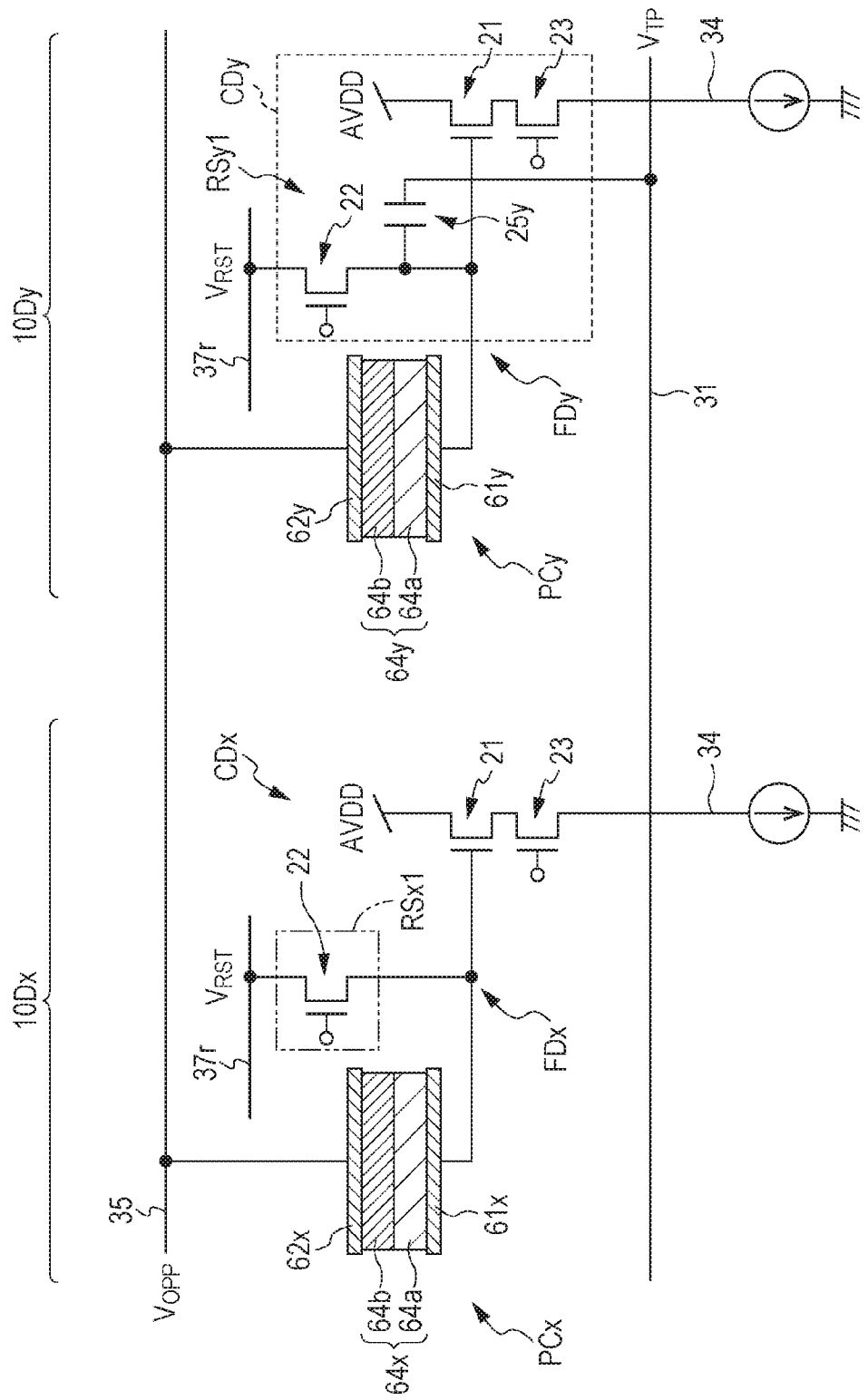
FIG. 13 selectively illustrates imaging cells adjacent in the row direction in the pixel array illustrated in FIG. 12.

FIG. 13 selectively illustrates the imaging cells 10Dx and 10Dy adjacent in the row direction in the pixel array PA illustrated in FIG. 12. As illustrated in FIG. 13, here, the opposite electrode 62x of the imaging cell 10Dx and the opposite electrode 62y of the imaging cell 10Dy are connected to a common accumulation control line 35 to which the opposite electrode voltage $V_{OPP}$ is applied. Therefore, the potential of the opposite electrode 62x in a charge accumulation period is equal to the potential of the opposite electrode 62y in the charge accumulation period. Also, the source of the reset transistor 22 of each of the charge detectors CDx and CDy is connected to the common reset voltage line 37r. Therefore, the reset circuit RSx1 of the imaging cell 10Dx resets the potential of the pixel electrode 61x to the potential according to the reset voltage VRST supplied to the reset voltage line 37r. The reset circuit RSy1 of the imaging cell 10Dy resets the potential of the pixel electrode 61y to the same potential as the potential of the pixel electrode 61x after the reset.

In the configuration illustrated to FIG. 13, the capacitor 25y is connected between the pixel electrode 61y of the imaging cell 10Dy and the first voltage line 31, thereby electrically coupling the pixel electrode 61y of the imaging cell 10Dy and the first voltage line 31 via the capacitor 25y. Due to the electrical coupling between the pixel electrode 61y and the first voltage line 31 connected to the voltage supply circuit 41, the potential of the charge accumulation node FDy including pixel the electrode 61y can be changed by changing the voltage of the first voltage line 31.

The voltage supply circuit 41 may be configured to switch between at least two voltages with different absolute values and to allow a voltage to be applied to the first signal line 31. The voltage supply circuit 41 may apply a voltage higher in a charge accumulation period than in other periods included in a frame to the first voltage line 31. That is, the voltage supply circuit 41 temporarily increases the offset voltage $V_{TP}$ to be supplied to the first voltage line 31 in the charge accumulation period in the frame period. The offset voltage $V_{TP}$ is temporarily increased in a charge accumulation period, and the potential of the pixel electrode 61y thereby can be temporarily increased by electrical coupling between the first voltage line 31 and the charge accumulation node FDy via the capacitor 25y in a charge accumulation period. It is to be noted that the other periods included in the frame period are, for instance, a reset period, and a read period.

(Electrical Coupling via Capacitor)

The change in the potential of the pixel electrode 61y by switching the offset voltage $V_{TP}$ applied to the first voltage line 31 will be described. For instance, it is assumed that after the potential of the charge accumulation node FDy is reset, the reset transistor 22 of the charge detector CDy is turned off, and accumulation of signal charges is started by switching the offset voltage $V_{TP}$ from the low-level voltage $V_L$ to the high-level voltage $V_H$. For instance, the power supply voltage, or a voltage decreased or increased from the power supply voltage may be used as the voltage $V_H$. This also applies to the voltage $V_L$.

The offset voltage $V_{TP}$ to be applied to the first voltage line 31 is changed from the voltage $V_L$ to the voltage $V_H$. At this point, the voltage of the charge accumulation node FDy is changed from the voltage VRST immediately after the reset by electrical coupling between the first voltage line 31 and the charge accumulation node FDy via the capacitor 25y. The amount of change then in the voltage of the charge storage node FDy is determined by the following manner.

Let $C_{FDy}$ be the capacitive value of the charge accumulation node FDy, Cy be the capacitive value of the capacitor 25y, and VRST be the voltage of the charge accumulation node FDy immediately after the reset. At this point, the charge quantity Q accumulated in the charge accumulation node FDy immediately before switching of the offset voltage $V_{TP}$ can be expressed by Q=$C_{FDy}$VRST−Cy ($V_L$−VRST). Let $V_{FD}$ be the voltage of the charge accumulation node FDy immediately after the switching of the offset voltage $V_{TP}$ to the voltage $V_H$, then Q=$C_{FDy}V_{FD}$−Cy ($V_H$−$V_{FD}$) holds. When an equation is formed by equating these right-hand sides because of the condition of charge neutrality, and the equation is solved for $V_{FD}$, $V_{FD}$=(Cy/(Cy+$C_{FDy}$))($V_H$−$V_L$)+ VRST is obtained. Thus, the amount of change in the voltage of the charge accumulation node FDy by switching the offset voltage $V_{TP}$ from the voltage $V_L$ to the voltage $V_H$ is expressed by the following Expression (3).

$$(Cy/(Cy+C_{FDy}))(V_H-V_L) \qquad (3)$$

When a capacitive value C1y of the capacitor 25y is sufficiently large with respect to $C_{FDy}$, from the above-mentioned Expression (3), Expression (3) approximately gives ($V_H$−$V_L$). That is, the voltage $V_{FD}$ of the charge accumulation node FDy can be changed by an amount approximately equal to ($V_H$−$V_L$) which is the change in the offset voltage $V_{TP}$ by switching of the offset voltage $V_{TP}$. Therefore, the potential difference Φ between the opposite electrode 62y and the pixel electrode 61y is reduced by an amount approximately equal to ($V_H$−$V_L$) by switching the offset voltage $V_{TP}$ from the voltage $V_L$ to the voltage $V_H$.

With the electrical coupling via the capacitor 25y, the change in the voltage applied to the first voltage line 31 is accompanied by the above-described change in the potential of the pixel electrode 61y. When the voltage applied to the first voltage line 31 is returned to the original voltage, the potential of the pixel electrode 61y is also returned to the voltage before the change of the voltage applied to the first voltage line 31. That is, it is possible to change the potential of the pixel electrode 61y by selectively changing the voltage applied to the first voltage line 31 in a charge accumulation period without affecting the charge quantity accumulated in the charge accumulation node FDy.

In this manner, according to the third embodiment, the bias voltage applied to the photoelectric conversion structure 64y can be selectively changed in a charge accumulation period by using the reset voltage VRST in common between the imaging cells 10Dx and 10Dy. Thus, the bias voltage applied to the photoelectric conversion structure at the start of a charge accumulation period can be made different between the imaging cells 10Dx and 10Dy. Therefore, for instance, the spectral sensitivity characteristics of the imaging cells 10Dx and 10Dy can be made different by switching the offset voltage $V_{TP}$ applied to the first voltage line 31 between multiple voltages with different absolute values.

The capacitor 25y may be a device having a metal-insulator-semiconductor (MIS) structure, for instance, or may be formed as metal-insulator-metal (MIM) structure in the interlayer insulation layer 52. The MIM structure refers to a structure in which a dielectric substance is interposed between two electrodes which are composed of a metal or a metal compound. $SiO_2$, $Al_2O_3$, SiN, $HfO_2$, $ZrO_2$ may be used as the dielectric substance interposed between two electrodes. Alternatively, the capacitor 25y may have a structure in which a parasitic capacitance between wires is intentionally utilized. In this case, the capacitive value of the parasitic capacitance between the first voltage line 31 and the charge accumulation node FDy has a significantly large value compared with the capacitive value of the charge accumulation node FDy. The capacitor 25y may include two or more capacitors.

(Example of Operation of Imaging Device)

Figure 14:
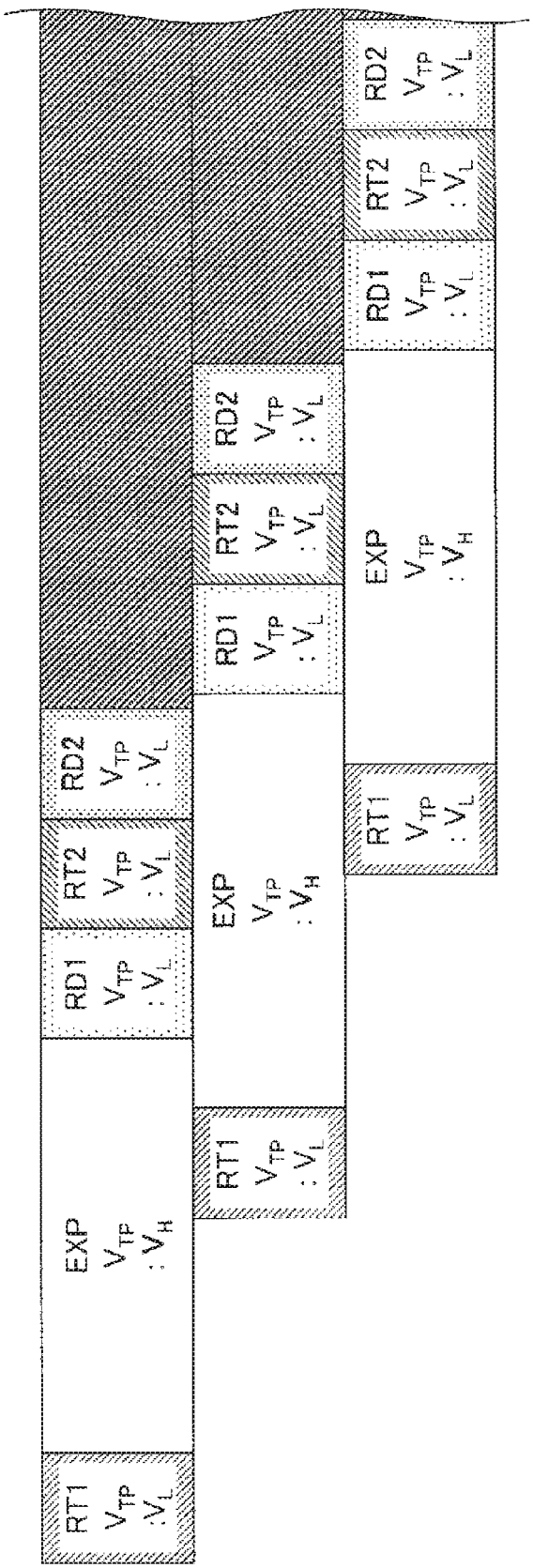
FIG. 14 is a diagram for explaining the operation of the imaging device according to an embodiment of the present disclosure when a rolling shutter is applied to the imaging device.

Here, the relationship between a frame period and a charge accumulation period will be described briefly. FIG. 14 illustrates a typical example of an operation of an imaging device when a rolling shutter is applied to the imaging device according to an embodiment of the present disclosure. Although the actual number of rows included in the pixel array PA may reach several hundreds to several thousand rows, here, the three rows of the first, second, and third rows are taken and the operation of the imaging cells is schematically illustrated due to limitations of space. Here, an example of the operation of the imaging cell 10Dy illustrated in FIG. 13 will be described.

When an image signal is obtained, first, the potential of the charge accumulation node FDy is reset. In other words, the reset transistor 22 is turned on, and the charge in the charge accumulation node FDy is discharged. Due to the turning on of the reset transistor 22, the potential of the pixel electrode 61y is reset to e level according to the reset voltage VRST. The voltage level of the pixel electrode 61y then determines a level of the image signal at a dark time. The first reset period corresponds to what is called an electronic shutter. In the first reset period, for instance, the low-level voltage $V_L$ is applied to the first voltage line 31. In FIG. 14, a hatched rectangle RT1 at the left end represents the first reset period.

Next, the reset transistor 22 is turned off. At this point, in synchronization with the turning off of the reset transistor 22, the offset voltage $V_{TP}$ applied to the first voltage line 31 is switched to the high-level voltage $V_H$, for instance. Accumulation of signal charges in the charge accumulation node FDy is started by turning off the reset transistor 22. Subsequently, the address transistor 23 is turned on at a desired timing, the offset voltage $V_{TP}$ is returned to the low-level voltage $V_L$, and a signal is read to the vertical signal line 34. The level of a signal read at this point corresponds to the amount of signal charges accumulated in the charge accumulation region in the period from the initial reset of the charge accumulation node FD until turning on of the address transistor 23. In FIG. 14, a lightly hatched rectangle RD1 represents a period in which a signal is read (first signal read period) according to the amount of signal charges accumulated in the charge accumulation region. In FIG. 14, a white rectangle EXP represents a period from a state of dark level of the potential of the charge accumulation node FD until the first signal read period, and the period corresponds to the above-described "charge accumulation period". The charge accumulation period is a period in which signal charges are essentially accumulated in the charge accumulation region, and may also be called an exposure period. Here, the reset transistor 22 is turned off, and the offset voltage $V_{TP}$ is switched to high-level. Thus, at the time of start of a charge accumulation period, the potential difference between the pixel electrode 61y and the opposite electrode 62y is different from the potential difference between the pixel electrode 61x and the opposite electrode 62x.

As illustrated in FIG. 14, in synchronization with completion of a charge accumulation period, the offset voltage $V_{TP}$ to be applied to the first voltage line 31 is switched to the low-level $V_L$. Switching of the offset voltage $V_{TP}$ may be performed simultaneously with the turning on of the address transistor 23. Subsequently, the reset transistor 22 is turned on again, and the potential of the pixel electrode 61y is thereby reset again to a level corresponding to the reset voltage VRST. In FIG. 14, a hatched rectangle RT2 represents the reset period following the first signal read period.

Subsequently, the address transistor 23 is turned on again, and a signal after the reset is read again. Here, the voltage applied to the first voltage line 31 from the voltage supply circuit 41 is the low-level voltage $V_L$, and the level of a signal read here corresponds to a level at a dark time. Thus, an image signal with fixed noise removed is obtained by calculating the difference between the level of a signal read at this point and the level of a signal read in the first signal read period represented by the rectangle RD1. In FIG. 14, a relatively dark hatched rectangle RD2 represents a period in which a signal is read (second signal read period) after the potential of the charge accumulation node is reset. After a signal corresponding to a level at a dark time, the address transistor 23 is turned off. The time taken for reading a signal is relatively short, thus the potential of the charge accumulation region hardly changes before and after the signal is read. In the present description, the "frame period" indicates the period from the start of the charge accumulation period in the start row to the end of a second signal read period in the last row.

Variation of Third Embodiment

Figure 15:
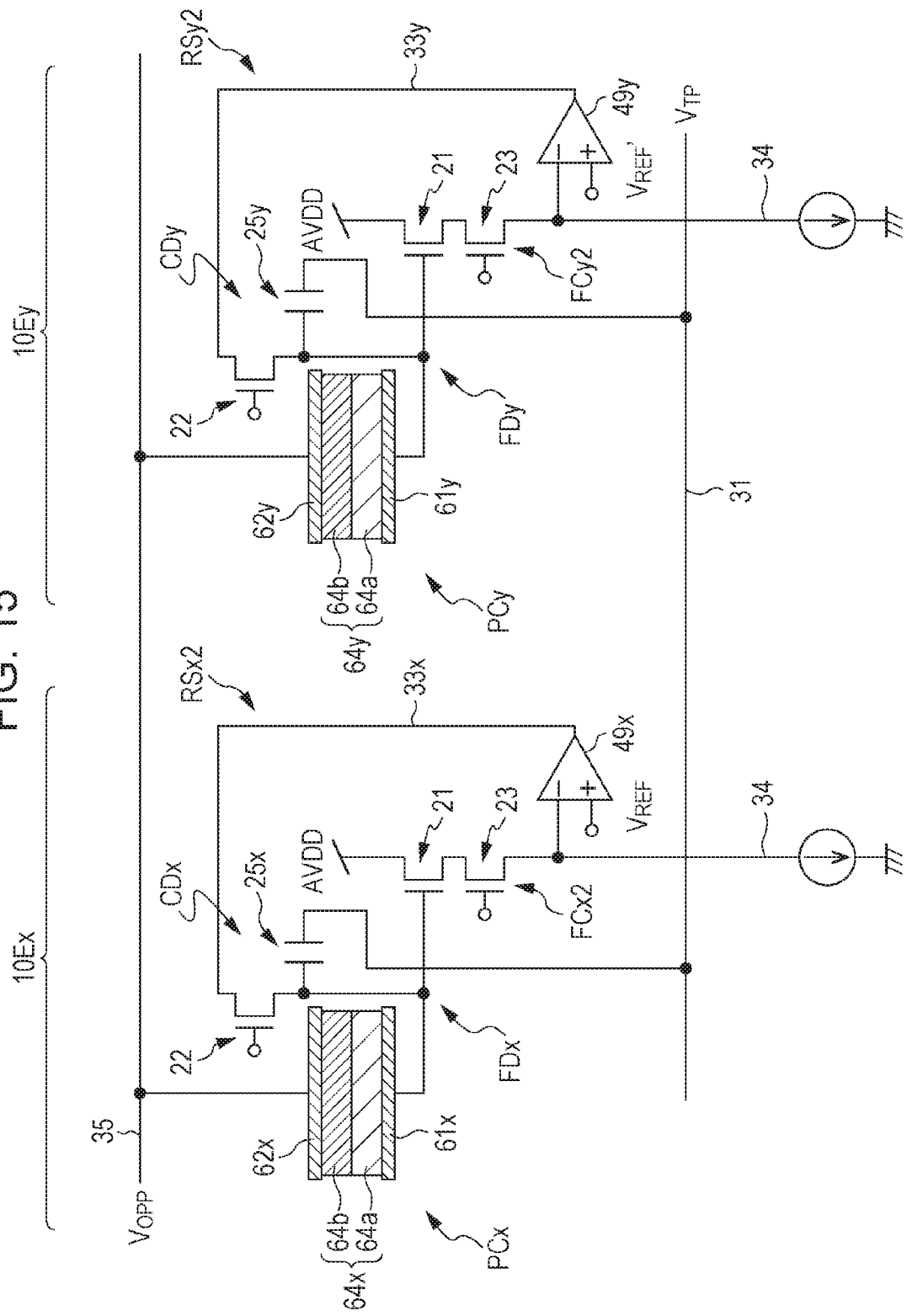
FIG. 15 is a diagram illustrating the circuit configuration of two imaging cells taken from the imaging cells included in the pixel array of the imaging device according to a variation of the third embodiment.

FIG. 15 illustrates the circuit configuration of two imaging cells taken from the imaging cells included in the pixel array PA of an imaging device according to a variation of the third embodiment. Similarly to the imaging cell 10Bx described with reference to FIG. 10, an imaging cell 10Ex illustrated in FIG. 15 includes the reset circuit RSx2 which has the feedback circuit FCx2. An imaging cell 10Ey also has the reset circuit RSy2 which has the feedback circuit FCy2. However, in this example, the non-inverting input terminal of the inverting amplifier 49x in the feedback circuit FCx2 is not connected to the first voltage line 31, and receives supply of a predetermined reference voltage $V_{REF}$ from a voltage line which is not illustrated. Similarly, the non-inverting input terminal of the inverting amplifier 49y in the feedback circuit FCy2 is not connected to the second voltage line 32, and receives supply of a predetermined reference voltage $V_{REF}'$ from a voltage line which is not illustrated. The potential of the pixel electrode 61x after reset can be substantially the same as the potential of the pixel electrode 61y after reset by adjusting the reference voltage $V_{REF}$ and the reference voltage $V_{REF}'$ appropriately. The reference voltage $V_{REF}$ and the reference voltage $V_{REF}'$ may be the same voltage.

In addition to the reset circuit RSx2, the charge detector CDx of the imaging cell 10Ex has a capacitor 25x connected between the charge accumulation node FDx and the first voltage line 31. That is, in this example, the pixel electrode 61x of the imaging cell 10Ex and the first voltage line 31 are electrically coupled to each other via the capacitor 25x. The charge detector CDy of the imaging cell 10Ey includes the capacitor 25y connected between the charge accumulation node FDy and the first voltage line 31. The capacitor 25x of the charge detector CDx and the capacitor 25y of the charge detector CDy typically have different capacitive values.

In the example illustrated in FIG. 15, the capacitor 25x of the charge detector CDx and the capacitor 25y of the charge detector CDy are both connected to the same first voltage line 31. Therefore, change in the potential of the side of the electrode, connected to the first voltage line 31 is in common with the capacitor 25x and the capacitor 25y. However, here, the capacitive value of the capacitor 25x and the capacitive value of the capacitor 25y of the imaging cell 10Ey are different from each other. Therefore, even though the change in the offset voltage $V_{TP}$ is in common, the change in the voltage of the charge accumulation node is different between the imaging cells 10Ex and 10Ey. Hereinafter, this point will be described.

Here, for the sake of simplicity, it is assumed that the voltages of the charge accumulation node FDx and the charge accumulation node FDy after the reset are the same voltage. Let $C_{FDx}$ be the capacitive value of the charge accumulation node FDx, and Cx be the capacitive value of the capacitor 25x, then the amount of change in the voltage of the charge accumulation node FDx when the offset voltage $V_{TP}$ applied to the first voltage line 31 is switched from the voltage $V_L$ to the voltage $V_H$ is expressed by the $(Cx/(Cx+C_{FDx}))(V_H-V_L)$ based on the above-mentioned Expression (3).

Here, when the capacitive value Cx of the capacitor 25x is smaller than the capacitive value Cy of the capacitor 25y of the imaging cell 10Ey, and is approximately equal to the $C_{FDx}$, for instance, the amount of change in the voltage of the charge accumulation node FDx is approximately only half of $(V_H-V_L)$. When the capacitive value Cx is sufficiently smaller than the $C_{FDx}$, it is found from Expression (3) that even if the offset voltage $V_{TP}$ is changed, the voltage of the charge accumulation node FDx hardly changes.

In this manner, with the electrical coupling via a capacitor, the capacitive value of the capacitor, which electrically couples the first voltage line 31 to the pixel electrode, is made different between the imaging cells, and thereby the change in the potential difference Φ between the pixel electrode and the opposite electrode can be made different between the two imaging cells while the offset voltage $V_{TP}$ applied to the first signal line 31 is used in common. It is to be noted that reducing the capacitive value of the capacitor interposed between the first voltage line 31 and the pixel electrode 61 is advantageous for miniaturization of pixel size. On the other hand, interposing a capacitor having a larger capacitive value between the first voltage line 31 and the pixel electrode 61 allows the potential of the charge accumulation node FD to be changed by switching the voltage applied to the first voltage line 31 without unnecessarily increasing the amount of change in the voltage applied to the first voltage line 31.

With the electrical coupling via a capacitor, the change in the potential difference J between the pixel electrode and the opposite electrode can be made different between multiple imaging cells without making the configuration and wiring of the voltage supply circuit complicated. Thus, an imaging cell in which the potential difference L shows a relatively large change, and an imaging cell in which the potential difference Φ shows substantially no change for a change in the voltage applied to the first voltage line 31 can be mixed in the pixel array. Therefore, it is possible to achieve a state in which for instance, the photoelectric converter PCy of the imaging cell 10Ey has sensitivity in the wavelength range of visible light, and the photoelectric converter PCx of the imaging cell 10Ex also has sensitivity to the wavelength range of infrared light in addition to the wavelength range of visible light by switching the offset voltage $V_{TP}$ while the offset voltage $V_{TP}$ applied to the first voltage line 31 is used in common. In other words, the imaging cells with different spectral sensitivity characteristics can be mixed in the pixel array PA while the offset voltage $V_{TP}$ applied to the first voltage line 31 is used in common. The first voltage line 31 may be provided independently for each column or each row of the pixel array PA, and may be connected to all the imaging cells included in the pixel array PA.

With the electrical coupling via a capacitor, even when the potential of the pixel electrode 61 is increased through the change in the voltage applied to the first voltage line 31 at the time of start of a charge accumulation period, when the voltage applied to the first signal line 31 is returned to the original voltage, the potential of the pixel electrode 61 is also returned to the voltage before the change of the voltage applied to the first signal line 31. Therefore, a signal can be read by changing the voltage applied to the first voltage line 31 in a signal read period back to the voltage applied to the first voltage line 31 in a reset period. In other words, this is advantageous from the viewpoint of reduction in power consumption because it is not necessary to use a higher power supply voltage AVDD to read a signal.

As is seen from Expressions (3), the above-mentioned effect is achieved when the ratio of the capacitive value of the capacitor that electrically couples the first voltage line 31 and the pixel electrode with respect to the capacitive value of the charge accumulation node is different between the imaging cells. Thus, the change in the voltage of the charge accumulation node can be made different between the imaging cells, while the change in the offset voltage $V_{TP}$ is in common. Therefore, it is not required that the capacitive value of the capacitor that electrically couples the first voltage line 31 and the pixel electrode is made different between adjacent imaging cells. For instance, the capacitive value of the capacitor that electrically couples the first voltage line 31 and the pixel electrode 61 may be made common between the multiple imaging cells, and the capacitive value of the charge accumulation node may be made different between the multiple imaging cells.

For instance, the area of the portion where the pixel electrode and the opposite electrode overlap may be made different between the photoelectric converter PCx of the imaging cell 10Ex, and the photoelectric converters PCy of the imaging cell 10Ey. The photoelectric converter itself has a capacitive, and it can be said that for instance, an imaging cell including a pixel electrode having a larger area is less affected by switching of the voltage applied to the first voltage line 31.

Figure 16:
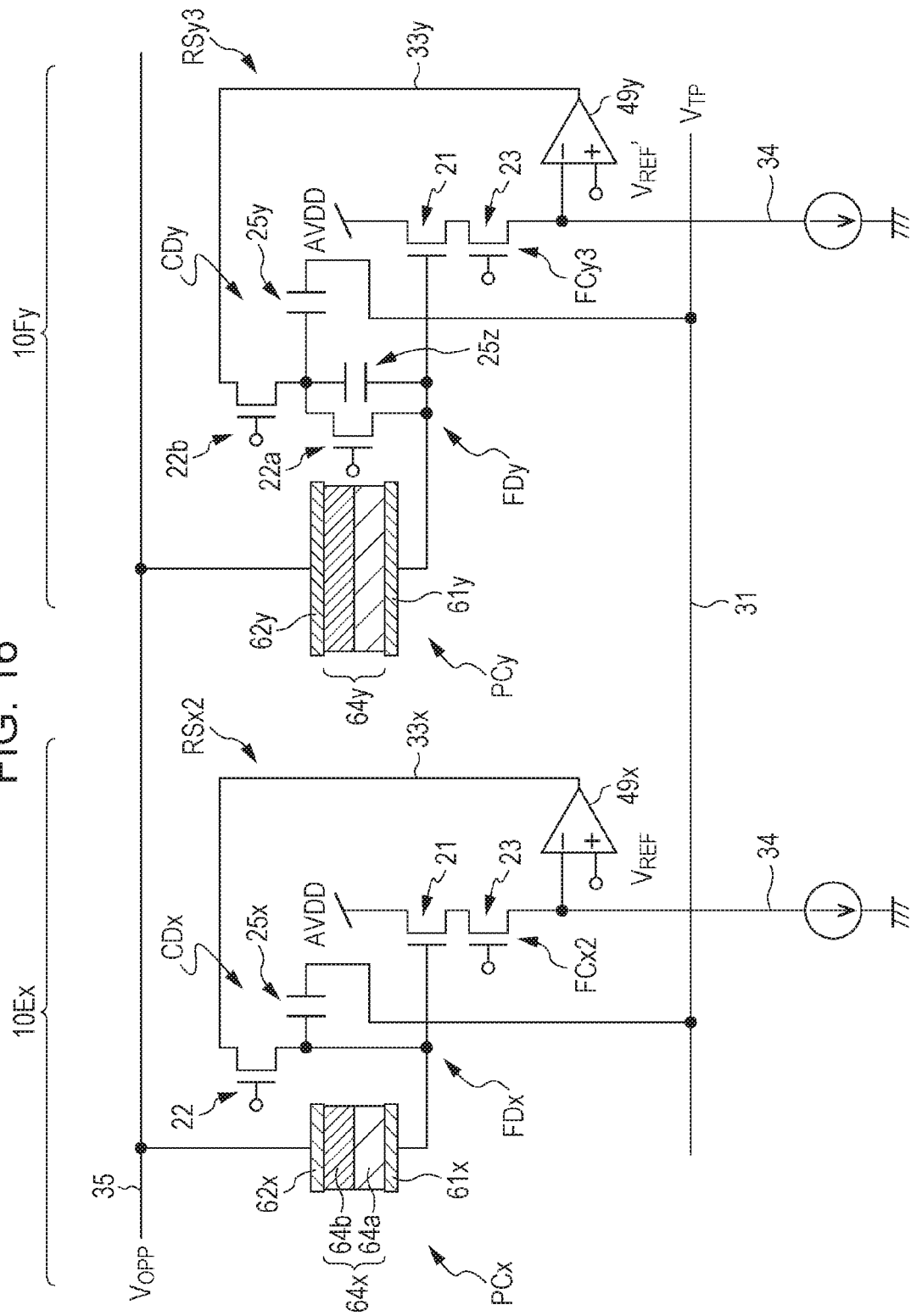
FIG. 16 is a diagram illustrating the circuit configuration of two imaging cells taken from the imaging cells included in the pixel array of the imaging device according to another variation of the third embodiment.

FIG. 16 illustrates the circuit configuration of two imaging cells taken from the imaging cells included in the pixel array PA of the imaging device according to another variation of the third embodiment. In contrast to the example illustrated in FIG. 15, in the example illustrated in FIG. 16, instead of the imaging cell 10Ey, the imaging cell 10Fy is arranged adjacent to the imaging cell 10Ex.

The charge detector CDy of the imaging cell 10Fy has a reset circuit RSy3. The reset circuit RSy3 includes a reset transistor 22a, and a feedback circuit FCy3 having the inverting amplifier 49y and a feedback transistor 22b. The feedback transistor 22b is connected between the source of the reset transistor 22a, and feedback line 33y connected to an output terminal of the inverting amplifier 49y. A common signal line may be connected to the gate of the feedback transistor 22b and the gate of the reset transistor 22 of the imaging cell 10Ex. In other words, the on and off operations of the feedback transistor 22b can be similar to the on and off operations of the reset transistor 22 of the imaging cell 10Ex.

The imaging cell 10Fy includes a capacitive circuit having the capacitor 25y and a second capacitor 25z between the pixel electrode 61y and the first voltage line 31. One of the electrodes of the capacitor 25z is connected to the pixel electrode 61y, and the other electrode is connected to the source of reset transistor 22a. In short, the capacitor 25z is connected in parallel to the reset transistor 22a. In this example, the charge detector CDy includes not only the impurity region 50ay (for instance, see FIG. 1), but also the capacitors 25y and 25z in part. The capacitor 25z has a capacitive value smaller than the capacitive value of the capacitor 25y. Accumulation of signal charges with the offset voltage $V_{TP}$ changed is executed with the reset transistor 22a off.

An increase in the synthetic capacity of the entire charge accumulation region can be reduced by connecting the capacitor 25y to the charge accumulation node FDy via the capacitor 25z. In other words, the effect of the change in the voltage applied to the first voltage line 31 on the potential difference Φy between the pixel electrode 61y and the opposite electrode 62y is reduced. Also, since the capacitive circuit connected between the pixel electrode 61y and the first voltage lines 31 includes the capacitor 25z, the effect of noise cancellation can be improved by reducing the decrease in the conversion gain. Hereinafter, an overview of noise cancellation by the feedback circuit FCy3 will be described.

For instance, the reset of a signal charge after the first signal read period is executed as follows. First, a feedback loop is formed by turning on the reset transistor 22a and the feedback transistor 22b with the address transistor 23 on. The formation of a feedback loop causes negative feedback of an output of the signal detection transistor 21. Due to the negative feedback of the output of the signal detection transistor 21, the potential of the charge accumulation node FDy converges a potential such that the voltage of the vertical signal line 34 is equalized to the $V_{REF}'$.

Next, the reset transistor 22a is turned off. kTC noise occurs by turning off of the reset transistor 22a. Therefore, the voltage of the charge accumulation node FDy after the reset includes the kTC noise that accompanies the turning off of the reset transistor 22a. After the turning off of the reset transistor 22a, cancellation of the kTC noise is executed.

While the feedback transistor 22b is on, the formation of the feedback loop is maintained. Thus, the kTC noise generated by turning off the reset transistor 22a is reduced to the magnitude of 1/(1+A), where A is the gain of the feedback circuit FCy. In this example, the voltage of the vertical signal line 34 immediately before the turning off the reset transistor 22a, that is, immediately before the start of noise cancellation is approximately equal to the reference voltage $V_{REF}'$ which is applied to the positive-side input terminal of the inverting amplifier 49y. The kTC noise can be canceled in a relatively short time by setting the voltage of the vertical signal line 34 at the start of noise cancellation to a level close to the reference voltage $V_{REF}'$.

Next, the feedback transistor 22b is turned off. The kTC noise occurs accompanying the turning off of the feedback transistor 22b. However, the size of kTC noise added to the voltage of the charge accumulation node FDy due to the turning off of the feedback transistor 22b is $(C_{FDy}/Cy)^{1/2} \times (Cz/(Cz+C_{FDy}))$ times greater than the size of kTC noise when the feedback transistor 22b is directly connected to the charge accumulation node FDy without providing the capacitor 25y and the capacitor 25z in the imaging cell 10Fy. In the above Expression, Cz indicates the capacitive value of the capacitor 25z, and "x" indicates multiplication.

From the above Expression, it is seen that larger the capacitive value Cy of the capacitor 25y, smaller the generated noise itself, and smaller the capacitive value Cz of the capacitor 25z, lower the attenuation rate. The kTC noise generated by turning off the feedback transistor 22b can be sufficiently reduced by setting the capacitive values Cy and Cz appropriately. After the feedback transistor 22b is turned off, a signal, in which the kTC noise has been canceled, is read.

The capacitor 25y is connected to the charge accumulation node FDy via the capacitor 25z with the reset transistor 22a and the feedback transistor 22b turned off. Here, it is assumed that the charge accumulation node FDy and the capacitor 25y are directly connected, not via the capacitor 25z. In this case, the capacitive value of the signal charges in the entire accumulation region when the capacitor 25y is directly connected is ($C_{FDy}$±Cy). That is, when the capacitor 25y has a relatively large capacitive value Cy, the capacitive value of the signal charges in the entire accumulation region also becomes large, and a high conversion gain (may be referred to a high S/N ratio) is not obtained. On the other hand, when the capacitor 25y is connected to the charge accumulation node FDy via the capacitor 25z as illustrated in FIG. 16, the capacitive value of the signal charges in the entire accumulation region in this configuration is expressed by ($C_{FDy}$+(CyCz)/(Cy+Cz)). Here, when the capacitor 25z has a relatively small capacitive value Cz, and the capacitor 25y has a relatively large capacitive value Cy, the capacitive value of the signal charges in the entire accumulation region is approximately ($C_{FDy}$+Cz). That is, the increase in the capacitive value of the signal charges in the entire accumulation region is small. In this manner, decrease in the conversion gain can be reduced by connecting the capacitor 25y to the charge accumulation node FDy via the capacitor 25z having a relatively small capacitive value.

In addition, the effect is achieved that the change in the potential of the charge accumulation node FDy with respect to the change in the offset voltage $V_{TP}$ is changed by connecting the capacitor 25y to the charge accumulation node FDy via the capacitor 25z having a relatively small capacitive value. In the example illustrated in FIG. 16, the pixel electrode 61y and the opposite electrode 62y of the imaging cell 10Fy has an electrode area larger than the electrode area of the pixel electrode 61x and the opposite electrode 62x of the imaging cell 10Ex. Therefore, the imaging cell 10Fy including the pixel electrode 61y having a larger area is less affected than the imaging cell 10Ex by switching of the voltage applied to the first voltage line 31.

It can be said that an imaging cell having a relatively low capacitive value of the charge accumulation region has a high conversion gain, and a high sensitivity. On the other hand, when the capacitive value of the charge accumulation region is increased, the conversion gain is reduced, thus it is advantageous for photographing under high illumination. Composing the image data obtained by two imaging cells having different capacitive values of the charge accumulation region allows an image with no blown out highlights and blocked up shadows to be formed even for a scene with a large contrast ratio. Such image formation is called "high dynamic range imaging".

Other Embodiments

Figure 17:
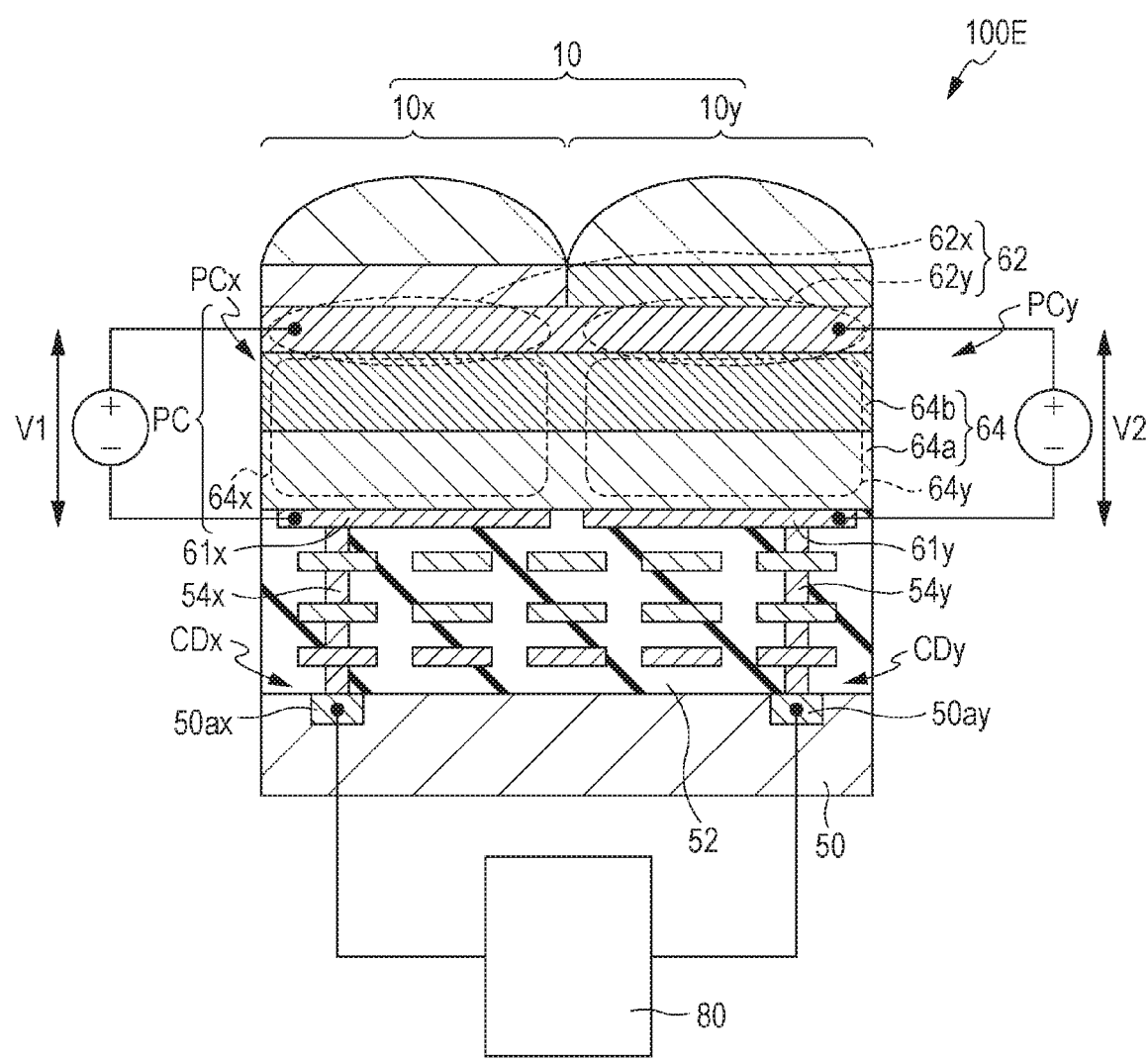
FIG. 17 is a diagram schematically illustrating an exemplary configuration of an imaging device according to another Example of the present disclosure.

FIG. 17 schematically illustrates an exemplary configuration of an imaging device according to another embodiment of the present disclosure. An imaging device 100E illustrated in FIG. 17 has a pair of the imaging cells 10x and 10y, and a subtraction circuit 80.

The imaging cell 10x may be one of the above-described imaging cells 10Ax to 10Ex, and the imaging cell 10y may be one of the above-described imaging cells 10Ay to 10Fy.

Here, the imaging cells 10Ex and 10Ey described with reference to FIG. 15 are illustrated as the imaging cells 10x and 10y.

The offset voltage $V_{TP}$ supplied to the first voltage line 31 (not illustrated in FIG. 17, see FIG. 15) is selectively increased, for instance, in a charge accumulation period. Consequently, in the imaging cell 10y, the absolute value of the potential difference Φy between the pixel electrode 61y and the opposite electrode 62y is reduced, and the imaging cell 10y loses the sensitivity to the wavelength range of infrared light, and selectively has sensitivity to the wavelength range of visible light. On the other hand, in the imaging cell 10x, even when the offset voltage $V_{TP}$ supplied to the first voltage line 31 is increased, the absolute value of the potential difference Φx between the pixel electrode 61x and the opposite electrode 62x hardly changes, and thus the imaging cell 10x has sensitivity in the wavelength range of visible light and infrared light.

In this example, the imaging cell 10x has sensitivity in the wavelength range of visible light and infrared light in a charge accumulation period, and the charge detector CDx outputs a first image signal based on visible light and infrared light. Therefore, it is possible to form an image based on visible light and infrared light from the first image signal obtained by the imaging cell 10x. On the other hand, the imaging cell 10y selectively has sensitivity in the wavelength range of visible light in the charge accumulation period, and the charge detector CDy outputs a second image signal based on visible light. Therefore, it is possible to form an image based on visible light from the second image signal obtained by the imaging cell 10y.

The subtraction circuit 80 is configured to be connected to the charge detector CDx and the charge detector CDy, and to output the difference between the first image signal and the second image signal. It is possible to form an image based on infrared light by calculating the difference between the level of an output signal of the imaging cell 10x and the level of an output signal of imaging cell 10y. The output signal of the imaging cell 10x and/or the output signal of the imaging cell 10y may be amplified by a predetermined gain, and subtraction processing may be performed. In this case, the gain does not need to be matched between the imaging cells 10x and 10y. It is sufficient that a ratio of gains be determined for each pair of the imaging cells 10x and 10y.

With the technique described in Japanese Unexamined Patent Application Publication No. 2008-227092, one of a monochrome image and an infrared image is selectively obtained, thus synchronization between these images is guaranteed. Therefore, the technique is not suitable for photographing an object moving at a high speed, for instance. In contrast, the first and second image signals obtained from the imaging cells 10x and 10y, respectively can be signals based on the signal charges accumulated in the same charge accumulation period. In other words, synchronization between the image based on the first image signal and the image based on the second image signal can be guaranteed. In particular, when the pixel array PA is formed as a repetitive structure in which a cell pair including the imaging cells 10x and 10y is repeated, imaging cells with different spectral sensitivity characteristics can be uniformly arranged, and thus it is advantageous for color resolution.

The subtraction circuit 80 may be an analog subtraction circuit, or a digital subtraction circuit. The subtraction circuit 80 may be implemented as a micro controller including one or more memories and a processor, for instance. Alternatively, the subtraction circuit 80 may be part of the horizontal signal read circuit 46 (see, for instance, FIG. 2).

Figure 36:
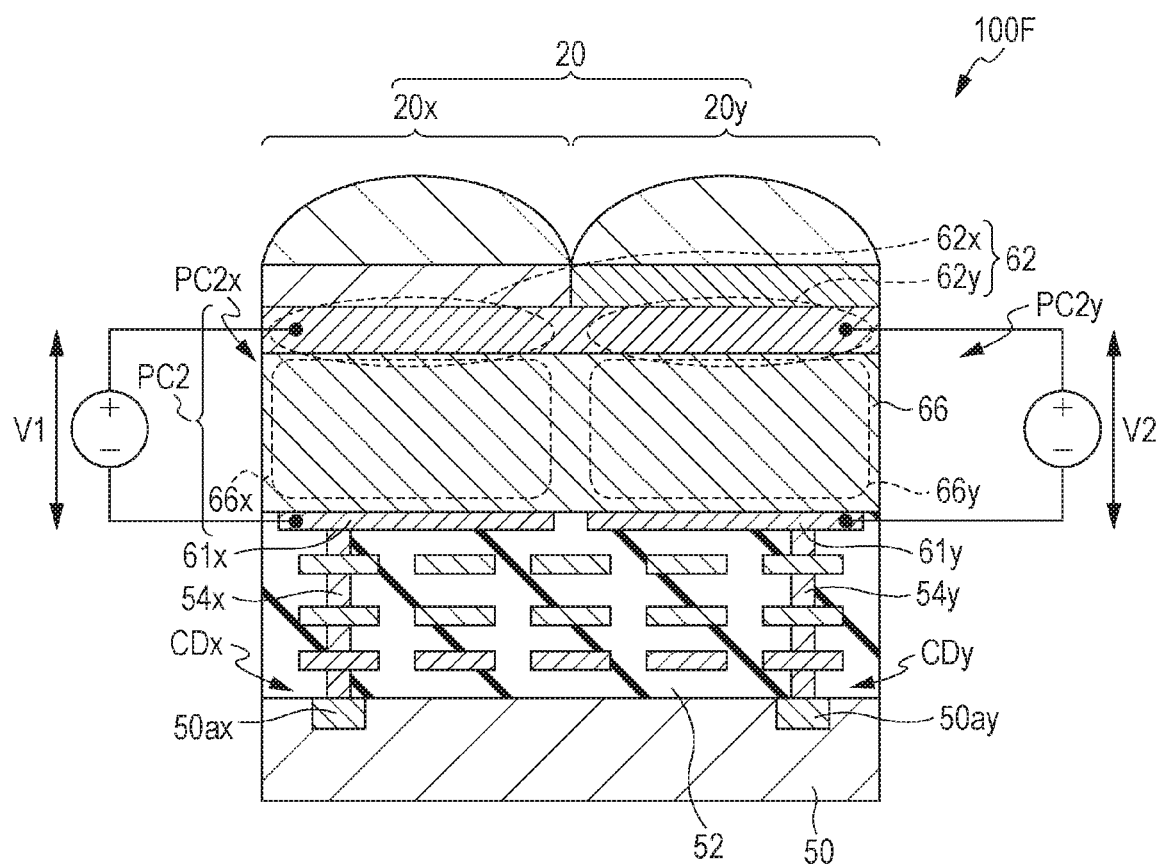
FIG. 36 is a diagram schematically illustrating an exemplary configuration of an imaging device according to still another embodiment of the present disclosure.

As described above, according to the embodiment of the present disclosure, imaging cells with different spectral sensitivity characteristics can be mixed in the pixel array while reducing the complexity of circuits. FIG. 36 illustrates an exemplary configuration of an imaging device according to still another embodiment of the present disclosure. In contrast to the example described with reference to FIG. 1, the pixel array PA of the imaging device 100F illustrated in FIG. 36 has multiple imaging cells 20 each including a pair of the imaging cells 20x and 20y. The imaging cells 20x and 20y is a pair of imaging cells arranged adjacent to each other in the row direction or the column direction in the pixel array PA. The imaging region of the imaging device 100F typically includes a repetitive structure in which a unit formed by a pair of cells 20x and 20y is repeated. The imaging cells 20x and 20y may be arranged diagonally adjacent to each other in the pixel array PA. As schematically illustrated in FIG. 36, the imaging device 100F has a photoelectric converter PC2 including the pixel electrodes 61x and 61y, the opposite electrode 62, and a photoelectric conversion structure 66. The imaging cell 20x has a photoelectric converter PC2x including an opposite electrode 62x which is part of the opposite electrodes 62, a photoelectric conversion structure 66x and the pixel electrode 61x. Similarly, the imaging cell 20y has a photoelectric converter PC2y including an opposite electrode 62y which is part of the opposite electrodes 62, a photoelectric conversion structure 66y and the pixel electrode 61y. Similarly to the above-described examples, the pixel electrode 61x is connected to the gate of the signal detection transistor 21 of the charge detector CDx, and the pixel electrode 61y is connected to the gate of the signal detection transistor 21 of the charge detector CDy.

The photoelectric conversion structures 66x and 66y are different portions in a common photoelectric conversion layer disposed over multiple imaging cells 20. That is, unlike the examples described above, the photoelectric conversion structures 66x and 66y in the configuration illustrated to FIG. 36 do not include a multilayer structure such as the photoelectric conversion structure 64 having the first photoelectric conversion layer 64a and the second photoelectric conversion layer 64b. Therefore, in this example, the spectral sensitivity characteristic of the photoelectric converter PC2x and the spectral sensitivity characteristic of the photoelectric converter PC2y show the same change for a change in the voltage applied across a pair of electrodes by which the photoelectric conversion structure 66 is interposed. In other words, the wavelength range to which the imaging cell 20x has sensitivity, and the wavelength range to which the imaging cell 20y has sensitivity are in common. However, as described below, the sensitivity can be made different between the imaging cell 20x and the imaging cell 20y by making the potential difference Φx between the opposite electrode 62x and the pixel electrode 61x different from the potential difference Φy between the opposite electrode 62y and the pixel electrode 61y.

in a process of forming the photoelectric converter PC2, the photoelectric conversion structures 66x and 66y are simultaneously formed by formation of the photoelectric conversion structure 66, and are positioned in the same layer in a section perpendicular to the major surface of the semiconductor substrate 50. The photoelectric conversion structure 66 is typically composed of a photoelectric conversion material including at least two types of materials that are a first material serving as a donor and a second material serving as an acceptor.

Figure 37:
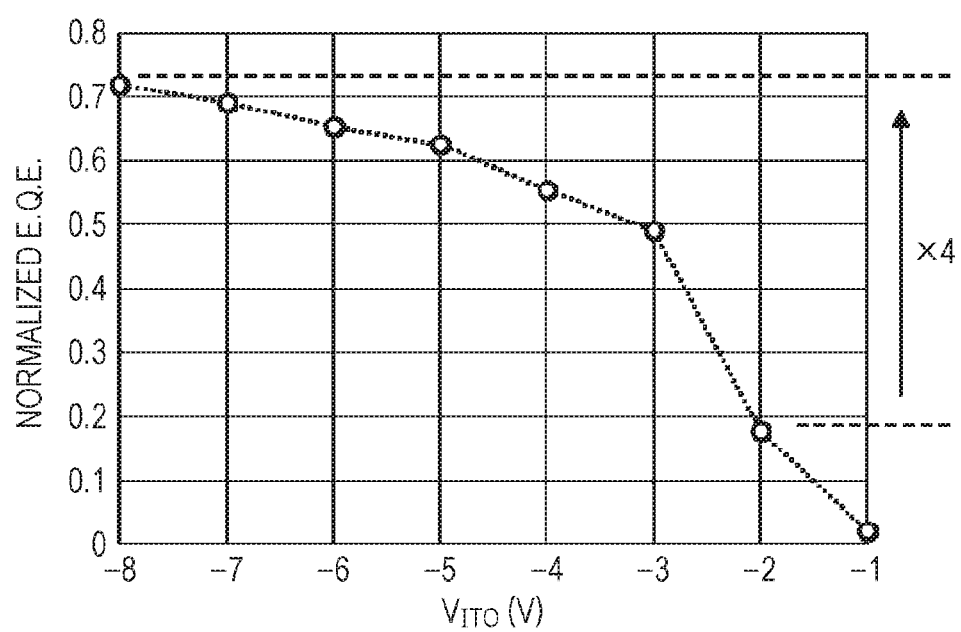
FIG. 37 is a graph for explaining the voltage dependence of external quantum efficiency of a photoelectric conversion structure.

FIG. 37 illustrates an example of the voltage dependence of external quantum efficiency of the photoelectric conversion structure 66. FIG. 37 illustrates a result of measurement of an external quantum efficiency of a sample for light with a wavelength of 880 nm when the potential difference applied across the upper-surface electrode and the lower-surface electrode is changed, the sample being produced by sequentially depositing an ITO film serving as a lower-surface electrode, an electronic blocking layer, a photoelectric conversion layer, and an Al film serving as an upper-surface electrode on a glass substrate by vacuum deposition. For the measurement of an external quantum efficiency, spectral sensitivity measuring device CEP-25RR manufactured by Bunkoukeiki Co., Ltd was used.

Here, a photoelectric conversion layer was formed by co-evaporating tin naphthalocyanine (SnNc) and C70 so that the volume ratio between SnNc and C70 becomes 1:1. In the obtained photoelectric conversion layer, SnNc serves as electron-donating molecules, and C70 serves as electron-accepting molecules. As the material of the electronic blocking layer, bis (carbazolyl) benzodifuran (CZBDF) which is an ambipolar organic semiconductor is used. The thicknesses of the lower-surface electrode, the electronic blocking layer, the photoelectric conversion layer, and the upper-surface electrode are 150 nm, 10 nm, 60 nm, and 80 nm, respectively.

In FIG. 37, the horizontal axis indicates the voltage VITO applied to the lower-surface electrode relative to the potential of the upper-surface electrode. For instance, a state where the voltage applied to the lower-surface electrode is −2 V corresponds to a state where a positive voltage of 2V is applied to the opposite electrode 62 relative to the potential of the pixel electrode 61x or 61y. Referring to the plots when a voltage of −2V is applied to the lower-surface electrode, in this example, approximately 18% of the external quantum efficiency was obtained.

Here, when the voltage applied to the lower-surface electrode is reduced to −8V, the external quantum efficiency of 72% was obtained, and as compared with the case where a voltage of −2 V was applied to the lower-surface electrode, the external quantum efficiency was increased by approximately 4 times. This corresponds to an increase of sensitivity by 4 times. Since 20 log of 104=12 dB, this result demonstrates that when the same configuration as in the sample of this example is applied to the photoelectric conversion structure 66, the dynamic range can be expanded by approximately 12 dB by increasing the potential difference applied across the pixel electrode and the opposite electrode from 2 V to 8 V.

FIG. 36 is referred to again. Also in the embodiment described here, before an accumulation of signal charges is started, the bias voltage applied to the photoelectric conversion structure are made different between the imaging cell 20x and the imaging cell 20y adjacent to each other. That is, at the time of start of a charge accumulation period, in other words, immediately after reset of the potential of a pixel electrode and before start of accumulation of charges in the charge accumulation region, the relationship Φx≠Φy holds. For instance, when Φx=8V and Φy=2V, it is possible to improve the sensitivity of the imaging cell 20x, for instance, by approximately 4 times than the sensitivity of the imaging cell 20y, thus the imaging cells 20x and 20y can serve as a cell with high sensitivity and a cell with low sensitivity, respectively.

A high S/N ratio is achieved by the imaging cell 20x with relatively high sensitivity even under low illumination. On the other hand, blown out highlights is prevented even under high illumination by the imaging cell 20y with relatively low sensitivity. Therefore, high dynamic range imaging is possible by synthesizing image data based on the image signals obtained by the imaging cells 20x and 20y. Furthermore, in this embodiment, the imaging cells 20x and 20y are arranged adjacent to each other in the pixel array PA, thus, an image signal based on the light coming from substantially the same azimuth can be obtained by a pair of imaging cells 20x and 20y, and synchronization between the image signal obtained by the imaging cell 20x and the image signal obtained by the imaging cell 20y adjacent to the imaging cell 20x can be guaranteed. In other words, the pixel value of one pixel in an image is determined by the image signal obtained by the pair of the imaging cells 20x and 20y adjacent to each other, and thereby a high dynamic range image with guaranteed synchronization can be obtained.

In this manner, a photoelectric conversion layer, in which the external quantum efficiency is changed according to a change in the bias voltage applied, is applied to the photoelectric conversion structure, and thereby it is possible to electrically change the sensitivity without adding a new circuit device to the imaging cell. From FIG. 37, it is found that in order to obtain a photoelectric conversion structure having such a property, it is not required to form a multilayer structure such as the photoelectric conversion structure 64 having the first photoelectric conversion layer 64a and the second photoelectric conversion layer 64b.

With the configuration illustrated to FIG. 36, the sensitivity between these can be made different by intentionally creating a state such that the relationship of $\Phi x \neq \Phi y$ holds between the imaging cells 20x and 20y immediately before accumulation of signal charges. Therefore, the effect of expanded dynamic range is obtained with a relatively simple circuit configuration, and multiple image signals obtained with changed sensitivities can be collectively obtained by the imaging device 100F. Therefore, a high dynamic range image with guaranteed synchronization can be formed based on, for instance, the image signal obtained from a pair of imaging cells 20x and 20y arranged adjacent to each other.

The configuration of any one of the examples described above may be applied to the configuration to form a state of $\Phi x \neq \Phi y$ immediately before the accumulation of signal charges. For instance, the circuit configuration described with reference to FIG. 3 may be applied to the charge detectors CDx and CDy. The opposite electrode voltage $V_{OPP}$ is used in common and $V_{RST}1 \neq V_{RST}2$ is set over the charge accumulation period, and thereby the bias voltage applied to the photoelectric conversion structure before accumulation of signal charges is started can be made different between the imaging cell 20x and the imaging cell 20y. The circuit configuration described with reference to FIG. 10 may be applied to the charge detectors CDx and CDy, and the reference voltage $V_{REF}$ can be made different between the imaging cells 20x and 20y. Even with this configuration, the bias voltage applied to the photoelectric conversion structure at the time of start of a charge accumulation period can be made different between the imaging cell 20x and imaging cell 20y.

The opposite electrode may be electrically separated between the imaging cell 20x and the imaging cell 20y by using the circuit configuration as illustrated in FIG. 11, and the potential of the opposite electrode immediately before the start of accumulation of signal charges may be made different between the imaging cell 20x and the imaging cell 20y. Even with this configuration, the state of $\Phi x \neq \Phi y$ can be achieved.

Alternatively, the potential of the pixel electrode 61x and/or the pixel electrode 61y may be temporarily increased in a charge accumulation period in a frame period by using the circuit configuration illustrated in FIGS. 13, 15, and 16. With this configuration, for one of both of the imaging cell 20x and the imaging cell 20y, the bias voltage applied to the photoelectric conversion structure 64 in a charge accumulation period can be selectively changed, and different sensitivities between these cells are obtained. One of the imaging cells 20x and 20y may serve as the imaging cell that shows a relatively large change in the potential difference $\Phi$ for a change in the voltage applied to the first voltage line 31, and the other imaging cell may serve as the imaging cell that shows almost no change in the potential difference $\Phi$.

Instead of disposing a microlens independently on each of the imaging cells 20x and 20y arranged adjacent to each other, a microlens and/or a color filter may be shared between these cells as described with reference to FIG. 5.

It is to be noted that the above-mentioned the voltage supply circuit 41 may be configured to apply a predetermined voltage to the first voltage line 31 at the time of operation of the imaging device and is not limited to a specific power supply circuit. The voltage supply circuit 41 may be a circuit that generates a predetermined voltage, or a circuit that converts a voltage supplied from another power supply into a predetermined voltage. Similarly, the voltage supply circuit 42 may be configured to allow a predetermined voltage to be applied to, for instance, the accumulation control line 35 at the time of operation of the imaging device. Each of the voltage supply circuits 41 and 42 may be part of a single voltage supply circuit, or a separate independent voltage supply circuit. It is to be noted that one or both of the voltage supply circuits 41 and 42 may be part of the vertical scanning circuit 48. Alternatively, a voltage from the voltage supply circuit 41 and/or an opposite electrode voltage from the voltage supply circuit 42 may be supplied to each imaging cell via the vertical scanning circuit 48.

(Photoelectric Conversion Structure)

As described above, in Embodiments of the present disclosure, the photoelectric conversion structure 64 in the photoelectric converters PCx and PCy includes a multilayer structure that has the first photoelectric conversion layer 64a and the second photoelectric conversion layer 64b. The photoelectric conversion structure 64 has a thickness in a range 100 nm or greater and 1000 nm or less, for instance. The first photoelectric conversion layer 64a and the second photoelectric conversion layer 64b include the first material and the second material, respectively, and in an aspect of the present disclosure, the first photoelectric conversion layer has a greater impedance than the second photoelectric conversion layer has. With this configuration, it is possible to switch the spectral sensitivity characteristic in the photoelectric converter PC by changing the voltage applied across the pixel electrode and the opposite electrode. It is possible to switch the wavelength range of an obtainable image by switching the spectral sensitivity characteristic in the imaging cell 10. It is to be noted that in the present description, for the sake of simplicity, the term of "impedance" may be used to indicate "absolute value of impedance".

In another aspect in the present disclosure, the ionization potential of the first material is greater than the ionization potential of the second material by 0.2 eV or more. As described later, when the difference between the ionization potentials of the first material Included in the first photoelectric conversion layer 64a and the second material included in the second photoelectric conversion layer 64b is high to some extent, even when the impedance difference between the first photoelectric conversion layer 64a and the second photoelectric conversion layer 64b is small, the spectral sensitivity characteristic in the photoelectric converter PC can be changed by changing the voltage applied across the pixel electrode and the opposite electrode.

Figure 18:
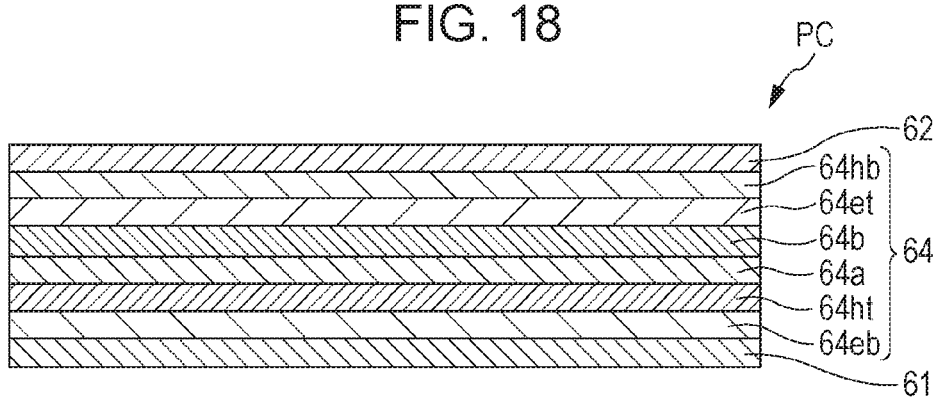
FIG. 18 is a schematic sectional view illustrating an instance of a photoelectric converter.

FIG. 18 illustrates an example of a sectional structure of the photoelectric converter. It is to be noted that the fundamental configuration of the above-described photoelectric converters PCx and PCy is in common. Therefore, hereinafter, the pixel electrode 61x of the photoelectric converter PCx and the pixel electrode 61y of the photoelectric converter PCy are simply called a pixel electrode 61 without distinguishing between the pixel electrodes 61x and 61y.

As already described, the photoelectric converter PC includes the pixel electrode 61, the opposite electrode 62, and the photoelectric conversion structure 64 interposed therebetween. The photoelectric conversion structure 64 typically has multiple layers including an organic material. In the configuration illustrated to FIG. 18, the photoelectric conversion structure 64 includes a multilayer structure of the first photoelectric conversion layer 64a and the second photoelectric conversion layer 64b. As illustrated, in this instance, the second photoelectric conversion layer 64b is positioned between the first photoelectric conversion layer 64a and the opposite electrode 62.

In the configuration illustrated to FIG. 18, the photoelectric conversion structure 64 includes an electronic blocking layer 64eb and a positive hole transport layer 64ht between the first photoelectric conversion layer 64a and the pixel electrode 61. The electronic blocking layer 64eb is adjacent to the pixel electrode 61, and the positive hole transport layer 64ht is adjacent to the first photoelectric conversion layer 64a. Also, the photoelectric conversion structure 64 includes an electron transport layer 64et and a positive hole blocking layer 64hb between the second photoelectric conversion layer 64b and the opposite electrode 62. The positive hole blocking layer 64hb is adjacent to the opposite electrode 62, and the electron transport layer 64et is adjacent to the second photoelectric conversion layer 64b.

The electronic blocking layer 64eb illustrated in FIG. 18 is provided to reduce dark current caused by injection of electrons from the pixel electrode 61, and the positive hole blocking layer 64hb is provided to reduce dark current caused by injection of positive holes from the opposite electrode 62. It is to be noted that the electronic blocking layer 64eb and the positive hole blocking layer 64hb each have a function of selectively transporting charges, and therefore are not insulation layers. The positive hole transport layer 64ht and the electron transport layer 64et are provided to efficiently transport positive and negative charges generated in the first photoelectric conversion layer 64a and/or the second photoelectric conversion layer 64b to the pixel electrode 61 and the opposite electrode 62, respectively. The materials of which the electronic blocking layer 64eb, the positive hole blocking layer 64hb, the positive hole transport layer 64ht, and the electron transport layer 64et are composed can be selected from publicly known materials in consideration of bonding strength, stability, a difference between ionization potentials, and a difference between electron affinities between each layer and adjacent layer. The material for forming the first photoelectric conversion layer 64a or the material for forming the second photoelectric conversion layer 64b may be for at least one of the materials of which the electronic blocking layer 64eb, the positive hole blocking layer 64hb, the positive hole transport layer 64ht, and the electron transport layer 64et are composed.

The first photoelectric conversion layer 64a and the second photoelectric conversion layer 64b include the first material and the second material, respectively. Therefore, typically, impedance per unit thickness in the first photoelectric conversion layer 64a is different from impedance per unit thickness in the second photoelectric conversion layer 64b. The first material and the second material are typically semiconductor materials. In an aspect of the present disclosure, impedance per unit thickness in the first photoelectric conversion layer 64a is greater than impedance per unit thickness in the second photoelectric conversion layer 64b. The impedance depends on the thickness of a photoelectric conversion layer, and when a photoelectric conversion layer includes multiple materials, the impedance also depends on the volume ratio of those materials in the photoelectric conversion layer. In Embodiments of the present disclosure, a layer having a high impedance among multiple photoelectric conversion layers included in the multilayer structure can be used as the first photoelectric conversion layer 64a.

(Switching of Spectral Sensitivity Characteristic by Switching Bias Voltage Utilizing Impedance Difference)

When the photoelectric conversion structure 64 includes a multilayer structure having the first photoelectric conversion layer and the second photoelectric conversion layer which have different impedances, application of a bias voltage between the pixel electrode 61 and the opposite electrode 62 causes a voltage proportional to impedance to be applied to the first photoelectric conversion layer and the second photoelectric conversion layer. In other words, an electric field with a magnitude proportional to impedance is applied to the first photoelectric conversion layer and the second photoelectric conversion layer. An external quantum efficiency (E.Q.E.) for a wavelength range can be changed by changing the potential difference $\Phi$ to be applied across the pixel electrode 61 and the opposite electrode 62 that interpose a photoelectric conversion structure including a multilayer structure having photoelectric conversion layers with different impedances. In other words, in the imaging cell 10 having such a photoelectric conversion structure in the photoelectric converter PC, the spectral sensitivity characteristic may be electrically changed. For instance, when the potential difference to be applied is changed from potential difference $\Phi 1$ to the potential difference $\Phi 2$, an increase in the E.Q.E. in the absorption peak wavelength of the second material is greater than an increase in the E.Q.E. in the absorption peak wavelength of the first material.

For instance, let Z1 and Z2 be the impedance of the first photoelectric conversion layer 64a, and the impedance of the second photoelectric conversion layer 64b, respectively, then when Z1>Z2, a greater voltage is applied to the first photoelectric conversion layer 64a as compared with the second photoelectric conversion layer 64b. Therefore, even when the bias between the pixel electrode 61 and the opposite electrode 62 is small, an electric field having a sufficient magnitude for moving the charges generated by the photoelectric conversion to an electrode can be applied to the first photoelectric conversion layer 64a. In other words, positive and negative charges generated by the photoelectric conversion can reach the pixel electrode 61 and the opposite electrode 62, respectively. Specifically, signal charges generated by irradiation of the first photoelectric conversion layer 64a with light are collected by the pixel electrode 61, and are accumulated in the charge accumulation region.

On the other hand, the electric field applied to the second photoelectric conversion layer 64b is smaller than the electric field applied to the first photoelectric conversion layer 64a. Thus, when a smaller potential difference is applied to the photoelectric conversion structure 64 between the pixel electrode 61 and the opposite electrode 62, the electric field applied to the second photoelectric conversion layer 64b may fall below a necessary magnitude for signal charges to reach the pixel electrode 61, the signal charges being generated by irradiation of the second photoelectric conversion layer 64b with light. If signal charges do not reach the pixel electrode 61, even when signal charges are generated in the second photoelectric conversion layer 64b, the signal charges are not accumulated in the charge accumulation region. Therefore, the imaging cell 10 does not have sufficient sensitivity to the light with a wavelength range corresponding to the absorption spectrum of the material of which the second photoelectric conversion layer 64b is composed, particularly the absorption spectrum of the second material.

When the voltage applied across the opposite electrode 62 and the pixel electrode 61 is increased, the voltage applied to the second photoelectric conversion layer 64b is also increased. That is, the electric field applied to the second photoelectric conversion layer 64b is increased, and the signal charges reach the pixel electrode 61, for instance, by supplying a voltage with a larger absolute value to pixel electrode 61 or the opposite electrode 62. Therefore, the imaging cell 10 has sensitivity to the light with a wavelength range corresponding to the absorption spectrum of the material (particularly, the second material) of which the second photoelectric conversion layer 64b, in addition to the light with a wavelength range corresponding to the absorption spectrum of the material (particularly, the first material) of which the first photoelectric conversion layer 64a is composed.

In this manner, a multilayer structure having the first photoelectric conversion layer, and the second photoelectric conversion layer which has impedance smaller than the impedance of the first photoelectric conversion layer is applied, and thus the spectral sensitivity characteristic can be switched by switching a voltage supplied to the pixel electrode 61 or the opposite electrode 62. The ratio of the impedance of the first photoelectric conversion layer 64a to the impedance of the second photoelectric conversion layer 64b is typically in a range of 100 times or more and $10^{10}$ times or less. When the ratio of the impedance of the first photoelectric conversion layer 64a to the impedance of the second photoelectric conversion layer 64b exceeds at least 44 times, such switching of the spectral sensitivity characteristic by switching the bias voltage can be achieved.

As the combination of the first material and the second material, for instance, a combination of a material exhibiting a high absorption coefficient in visible range and a material exhibiting a high absorption coefficient in infrared range may be used. With this combination of materials, it is possible to provide an imaging device that can obtain information on one or both of illumination of visible light and illumination of infrared light.

Typically, the first photoelectric conversion layer 64a and the second photoelectric conversion layer 64b include electron-donating (or donor property, p-type) molecules, and electron-accepting (or acceptor property, n-type) molecules.

For instance, electron-donating molecules are used as the first material Included in the first photoelectric conversion layer 64a and the second material included in the second photoelectric conversion layer 64b. A typical instance of electron-donating molecules is an organic p-type semiconductor, and is mainly represented by a positive hole transport organic compound. The electron-donating molecules have a property of being likely to donate electrons. Examples of an organic p-type semiconductor include triaryl amine compounds such as DTDCTB, benzidine compounds, pyrazoline compounds, styryl amine compounds, hydrazone compounds, triphenylmethane compounds, carbazole compounds, polysilane compounds, α-sexithiophene (hereinafter referred to as "α-6T"), thiophene compounds such as P3HT, phthalocyanine compounds, cyanine compounds, merocyanine compounds, oxonol compounds, polyamine compounds, indolic compounds, pyrrole compounds, pyrazole compounds, polyarylene compounds, condensed aromatic carbon ring compounds, (naphthalene derivatives, anthracene derivatives, phenanthrene derivatives, tetracene derivatives such as rubrene, pyrene derivatives, perylene derivatives, fluoranthene derivatives), and metal complexes having a nitrogen-containing hetero ring compound as a ligand. Examples of phthalocyanine compounds include copper phthalocyanine (CuPc), subphthalocyanine (SubPc), aluminium chloride phthalocyanine (ClAlPc), Si(OSiR3)$_2$Nc (R indicates alkyl with a carbon number of 1 to 18), turnip phthalocyanine (SnNc), and lead phthalocyanine (PbPc). Donor organic semiconductors are not limited to these, and organic compounds with an ionization potential lower than the ionization potential of organic compounds used as n-type (acceptor property) compounds can be used as donor organic semiconductors. The ionization potential is the difference between the vacuum level and the energy level of a highest occupied molecular orbital (HOMO).

A typical instance of electron-accepting molecules is an organic n-type semiconductor, and is mainly represented by an electron transport organic compound. The electron-accepting molecules have a property of being likely to accept electrons. Examples of an organic n-type semiconductor include fullerene such as $C_{60}$ and $C_{70}$, fullerene derivatives such as phenyl $C_{61}$ butyric-acid methyl ester (PCBM), condensed aromatic carbon ring compounds, (naphthalene derivatives, anthracene derivatives, phenanthrene derivatives, tetracene derivatives, pyrene derivatives, perylene derivatives, fluoranthene derivatives), 5 to 7 membered hetero ring compounds containing nitrogen atoms, oxygen atoms, and sulfur atoms (for instance, pyridine, pyrazine, pyrimidine, pyridazine, triazine, quinoline, quinoxaline, quinazoline, phthalazine, cinnoline, isoquinoline, pteridine, acridine, phenazine, phenanthroline, tetrazole, pyrazole, imidazole, thiazole, oxazole, indazole, benzimidazole, benzotriazole, benzoxazole, benzothiazole, carbazole, purine, triazolo-pyridazine, triazolo-pyrimidine, tetrazaindene, oxadiazole, imidazopyridine, pyrrolidine, pyrrolopyridine, thiadiazolopyridine, dibenzazepine, tribenzazepine), subphthalocyanine (SubPc), polyarylene compounds fluorene compounds, cyclopentadiene compounds, silyl compounds, perylene tetracarboxylic diimide compounds (PTCDI), and metal complexes having a nitrogen-containing hetero ring compound as a ligand. Acceptor organic semiconductors are not limited to these, and organic compounds with an electron affinity greater than the electron affinity of organic compounds used as p-type (donor property) compounds can be used as acceptor organic semiconductors. The electron affinity is the difference between the vacuum level and the energy level of a lowest unoccupied molecular orbital (LUMO).

Figure 19:
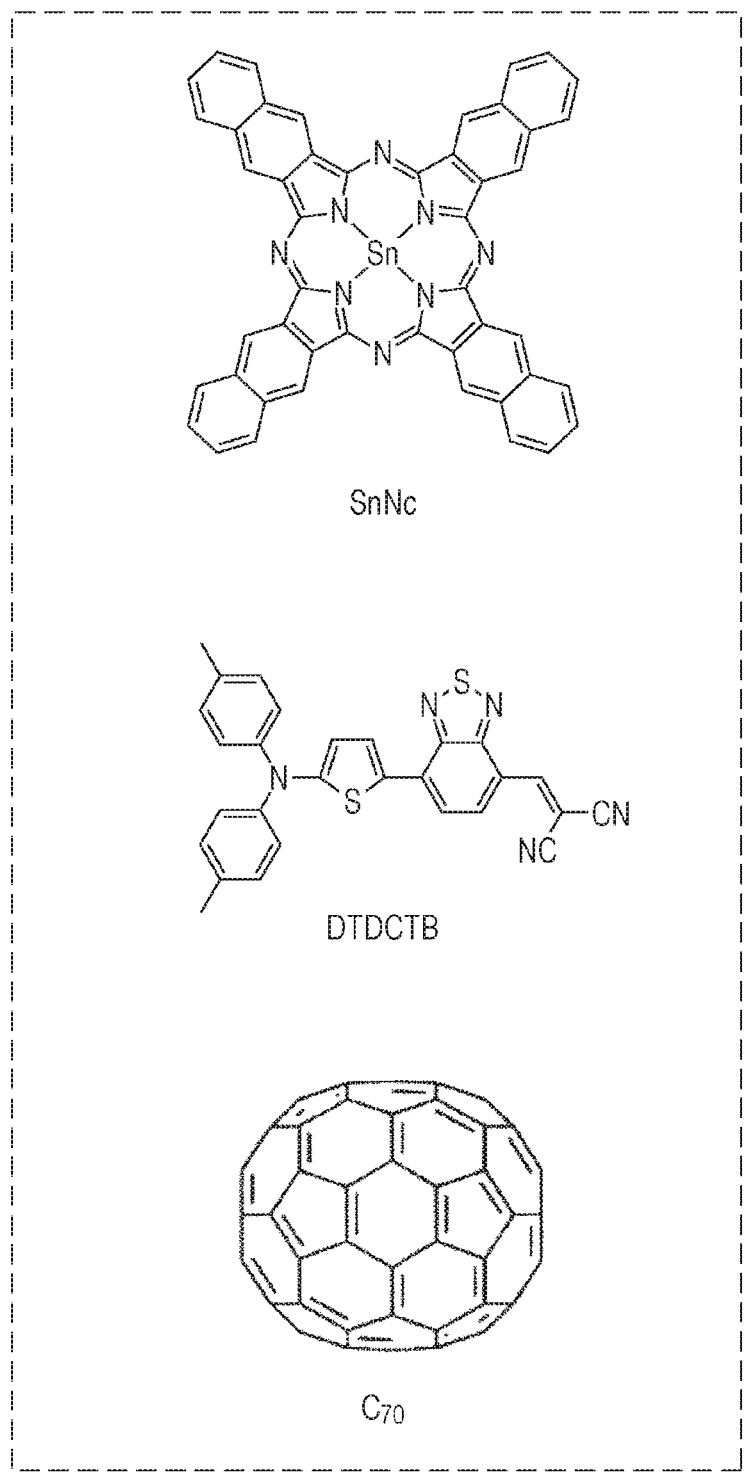
FIG. 19 is a diagram illustrating an instance of a material applicable to a photoelectric conversion layer.

FIG. 19 illustrates the chemical formulas of SnNc, DTDCTB, and $C_{70}$. Without being limited to those mentioned above, as long as organic compounds or organic molecules allows film formation by one of a dry system and a wet system, the organic compounds and organic molecules can be used as the material of which the first photoelectric conversion layer 64a is composed or the material of which the second photoelectric conversion layer 64b is composed, regardless of low-molecular or high-molecular compounds.

A photoelectric conversion structure 64 having sensitivity of a desired wavelength range can be implemented by using appropriate materials as the first material and the second material according to a wavelength range to be detected. For instance, a material having a high absorption coefficient in the visible range and a material having a high absorption coefficient in the infrared range may be used as the first material Included in the first photoelectric conversion layer 64a and the second material included in the second photoelectric conversion layer 64b, respectively. The above-mentioned DTDCTB has an absorption peak at a wavelength of approximately 700 nm, and CuPc and SubPc have absorption peaks at wavelengths of approximately 620 nm and 580 nm, respectively. Rubrene has an absorption peak at a wavelength of approximately 530 nm, and α-6T has an absorption peak at a wavelength of approximately 440 nm. In short, the absorption peaks of these materials are in the wavelength range of visible light, and can be used as the first material, for instance. In contrast, SnNc has an absorption peak at a wavelength of approximately 870 nm, and ClAlPc has an absorption peak at a wavelength of approximately 750 nm. In short, the absorption peaks of these materials are in the wavelength range of infrared light, and can be used as the second material, for instance.

The second material included in the second photoelectric conversion layer 64b includes SnNc represented by the following structural formula (1), for instance.

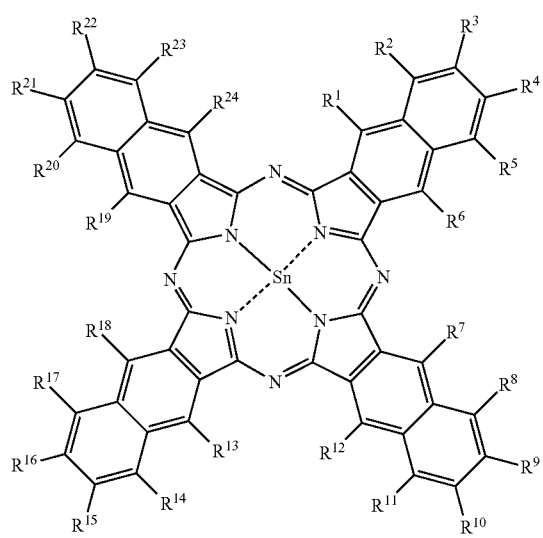

(1)

$R^1$ to $R^{24}$ in the structural formula (1) each independently indicate a hydrogen atom or a substituent. The substituent is not limited to a specific substituent. The substituent may be a deuterium atom, a halogen atom, alkyl groups (including a cycloalkyl group, a bicycloalkyl group, a tricycloalkyl group), an alkenyl group (including a cycloalkenyl group, a bicycloalkenyl group), an alkynyl group, an aryl group, a heterocyclic group (may be called a heterocyclic group), a cyano group, a hydroxy group, a nitro group, a carboxy group, an alkoxy group, an aryloxy group, a silyloxy group, a heterocyclic oxy group, a acyloxy group, a carbamoyloxy group, an alkoxy carbonyloxy group, an aryloxy carbonyloxy group, an amino group (including an anilino group), an ammonio group, an acylamino group, an aminocarbonyl amino group, an alkoxycarbonylamino group, an aryloxycarbonylamine group, an aryloxycarbonylamine group, a sulfamoylamino group, an alkylsulfonylamino group, arylsulfonylamino group, an mercapto group, an alkylthio group, an arylthio group, a heterocyclic thio group, a sulfamoyl group, a sulfonic group, an alkylsulfinyl group, an arylsulfinyl group, an alkylsulfonyl group, an arylsulfonyl group, an acyl group, an aryloxycarbonyl group, an alkoxycarbonyl group, a carbamoyl group, an arylazo group, a heterocyclic azo group, an imide group, a phosphino group, a phosphinyl group, a phosphinyloxy group, a phosphinyl amino group, a phosphono group, a silyl group, a hydrazino group, a ureido group, a boron acid group (—B(OH)$_2$), a phosphato group (—OPO(OH)$_2$), a sulphato group (—OSO$_3$H), or other publicly known substituent groups.

Commercially available products may be used as SnNc represented by the above-mentioned structural formula (1). Alternatively, for instance, as described in Japanese Unexamined Patent Application Publication No. 2010-232410, SnNc represented by the above-mentioned structural formula (1) can be synthesized using naphthalene derivative represented by the structural formula (2) below as starting material. $R^{25}$ to $R^{30}$ in the structural formula (2) can be the same substituent groups as $R^1$ to $R^{24}$ in the structural formula (1).

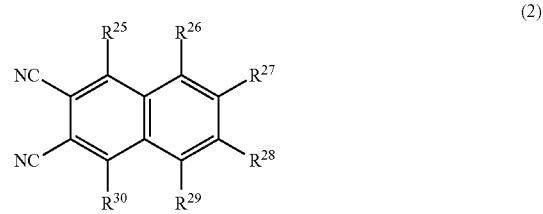

(2)

From the viewpoint of easiness of control over aggregation state of molecules in tin naphthalocyanine represented by the above-mentioned structural formula (1), it is useful when eight or more of $R^1$ to $R^{24}$ are each a hydrogen atom or a deuterium atom, and it is more useful when 16 or more of $R^1$ to $R^{24}$ are each a hydrogen atom or a deuterium, and it is further useful when all of $R^1$ to $R^{24}$ are each a hydrogen atom or a deuterium. In addition, SnNc represented by the following structural formula (3) is advantageous from the viewpoint of easiness of synthesis.

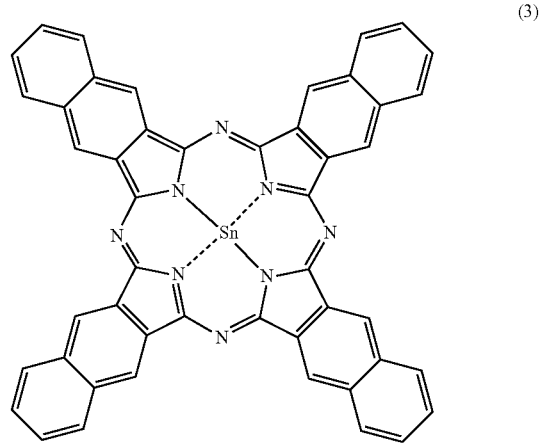

(3)

Figure 23:
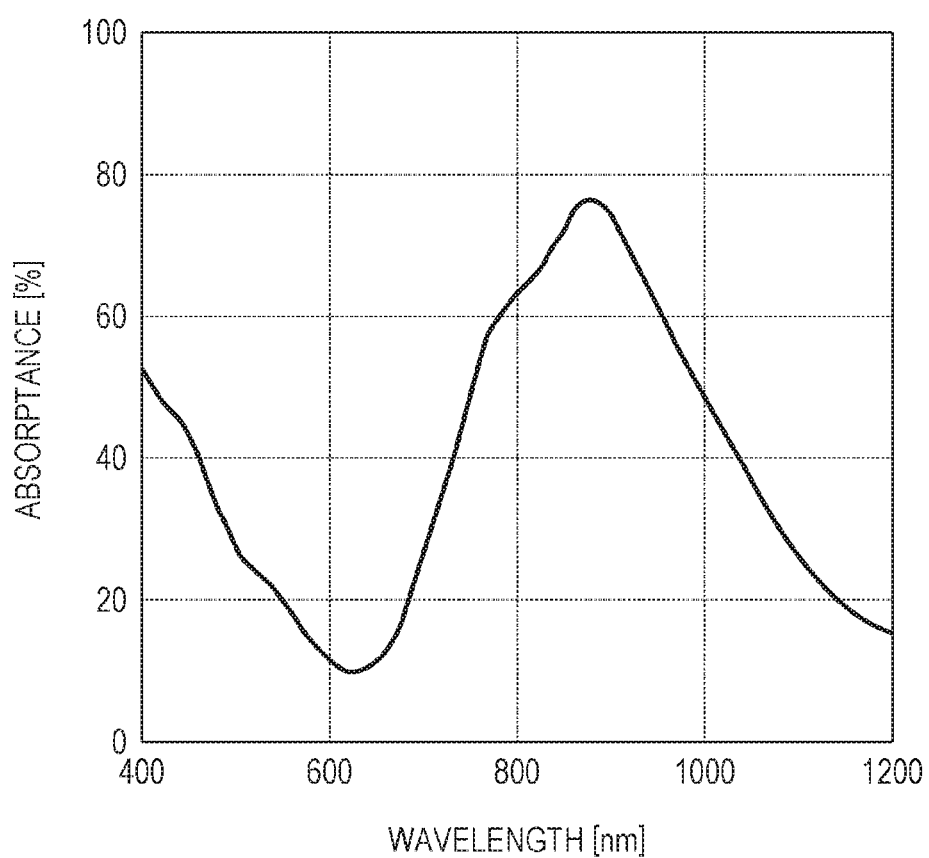
FIG. 23 is a diagram illustrating an instance of an absorption spectrum in a photoelectric conversion layer including tin naphthalocyanine.

SnNc represented by the above-mentioned structural formula (1) has an absorption peak in a wavelength range of approximately 200 nm or more and 1100 nm or less. For instance, SnNc represented by the above-mentioned structural formula (3) has an absorption peak at a wavelength of approximately 870 nm as illustrated in FIG. 23. FIG. 23 is an instance of an absorption spectrum in a photoelectric conversion layer including SnNc represented by the above-mentioned structural formula (3). It is to be noted that for the measurement of an absorption spectrum, a sample was used in which a photoelectric conversion layer with a thickness of 30 nm is stacked on a quartz substrate.

For instance, a material having an absorption peak in a first wavelength range included in the visible range is used as the first material, and a material having an absorption peak in a second wavelength range included in the infrared range is used as the second material, thereby making it possible to electrically change the sensitivity in the infrared range. Needless to say, a material having a high absorption coefficient in the infrared range and a material having a high absorption coefficient in the visible range may be used as the first material and the second material, respectively.

For instance, it is assumed that impedance Z1 of the first photoelectric conversion layer for which a material having a high absorption coefficient in the visible light is used as the first material is greater than the impedance Z2 of the second photoelectric conversion layer for which a material having a high absorption coefficient in the infrared light is used as the second material (Z1>Z2). At this point, when the voltage applied across the opposite electrode 62 and the pixel electrode 61 is lower than or equal to a threshold value, the photoelectric converter PC has a relatively high sensitivity in the visible range. Therefore, an image signal based on the visible light can be obtained. On the other hand, when the voltage applied across the opposite electrode 62 and the pixel electrode 61 is higher than a threshold value, the photoelectric converter PC has sensitivity in the visible range and the infrared range. Therefore, an image signal based on the visible light and the infrared light can be obtained. In other words, let $\Phi1$ be a voltage that allows imaging with the visible light, and let $\Phi2$ be a voltage that allows imaging with the visible light and the infrared light in the potential difference applied across the opposite electrode 62 and the pixel electrode 61, then the relationship of $\Phi1<\Phi2$ holds.

Conversely, when the impedance Z1 of the first photoelectric conversion layer is lower than the impedance Z2 of the second photoelectric conversion layer (Z1<Z2), and the voltage applied across the opposite electrode 62 and the pixel electrode 61 is lower than or equal to a threshold value, the photoelectric converter PC has a relatively high sensitivity in the infrared range. Consequently, the imaging device according to an Embodiment of the present disclosure can obtain an image signal based on the infrared light. On the other hand, when the voltage applied across the opposite electrode 62 and pixel electrode 61 higher than a threshold value, the photoelectric converter PC has sensitivity in the visible light range and the infrared light range. Therefore, an image signal based on the visible light and the infrared light can be obtained. At this point, let $\Phi3$ be a potential difference that allows imaging with the infrared light, and let $\Phi4$ be a potential difference that allows imaging with the visible light and the infrared light in the voltage applied across the opposite electrode 62 and the pixel electrode 61, then the relationship of $\Phi3<\Phi4$ holds after all. What is noteworthy here is that the wavelength range of an obtainable image can be switched by the potential difference applied across the opposite electrode 62 and the pixel electrode 61.

When the first photoelectric conversion layer 64a and the second photoelectric conversion layer 64b do not sufficiently have desired sensitivity characteristic by using a single organic material, one or both of the first photoelectric conversion layer 64a and the second photoelectric conversion layer 64b may be formed by mixing two or more organic materials. Alternatively, one or both of the first photoelectric conversion layer 64a and the second photoelectric conversion layer 64b may be formed by stacking two or more layers including different organic materials. The first photoelectric conversion layer 64a and/or the second photoelectric conversion layer 64b may be, for instance, a bulk heterojunction structure layer including a p-type semiconductor and an n-type semiconductor. The bulk heterojunction structure is described in detail in Japanese Unexamined Patent Application Publication No. 5553727. The entire contents of Japanese Unexamined Patent Application Publication No. 5553727 are incorporated herein by reference.

Figure 20:
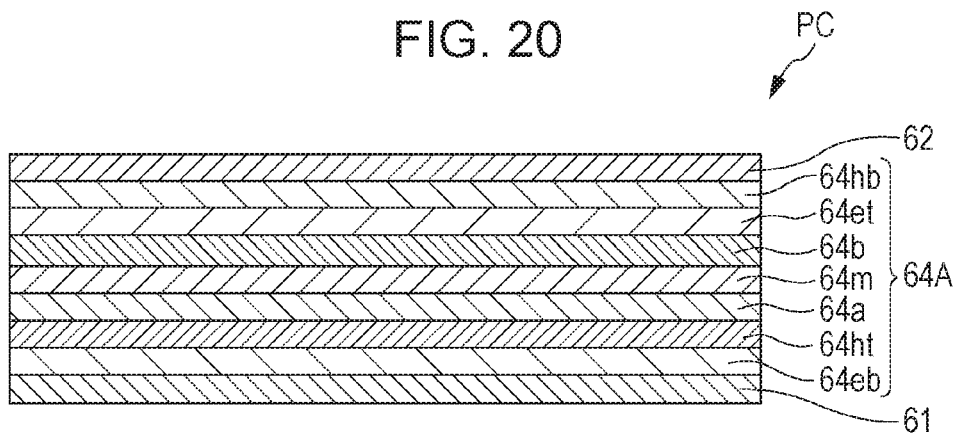
FIG. 20 is a schematic sectional view illustrating another example of the photoelectric converter.

FIG. 20 illustrates another instance of the sectional structure of the photoelectric converter PC. The photoelectric conversion structure 64A illustrated in FIG. 20 includes a multilayer structure having the first photoelectric conversion layer 64a, a mixed layer 64m, and the second photoelectric conversion layer 64b. The mixed layer 64m is a layer that includes the first material and the second material at least, and is positioned between the first photoelectric conversion layer 64a and the second photoelectric conversion layer 64b. It is to be noted that FIG. 20 and the aforementioned FIG. 18 are merely schematic diagrams, and the boundary of each layer included in the photoelectric conversion structure may not be strictly defined. The same goes with other sectional views of the present disclosure.

As just described, the configuration of the photoelectric converter PC is not limited to the configuration illustrated in FIG. 18. For instance, the arrangement of the first photoelectric conversion layer 64a and the second photoelectric conversion layer 64b and the arrangement illustrated in FIGS. 18 and 20 may be reversed. When negative charges (typically, electrons) among positive and negative charges generated in the photoelectric conversion structure 64 are used as signal charges, a positive hole blocking layer and an electron transport layer may be used instead of the electronic blocking layer 64eb and the positive hole transport layer 64ht, and a positive hole transport layer and an electronic blocking layer may be used instead of the electron transport layer 64et and the positive hole blocking layer 64hb.

The material of which the first photoelectric conversion layer 64a and the second photoelectric conversion layer 64b are composed is not limited to an organic semiconductor material, and the first photoelectric conversion layer 64a and/or the second photoelectric conversion layer 64b may include a compound semiconductor represented by hydrogenation amorphous silicon, CdSe, and an inorganic semiconductor material of a metal oxide semiconductor such as ZnO. For instance, the volume resistivity of amorphous silicon is adjustable by changing an impurity density. The first photoelectric conversion layer 64a and/or the second photoelectric conversion layer 64b may include a layer composed of an organic material and a layer composed of an inorganic material.

(Switching of Spectral Sensitivity Characteristic by Switching Bias Voltage Utilizing Ionization Potential Difference)

As described below, even when the impedance difference between the first photoelectric conversion layer 64a and the second photoelectric conversion layer 64b is small, when the difference between the ionization potentials of the first material Included in the first photoelectric conversion layer 64a and the second material included in the second photoelectric conversion layer 64b is high to some extent, the spectral sensitivity characteristic can be changed by changing the potential difference Φ between the pixel electrode 61 and the opposite electrode 62.

Figure 21:
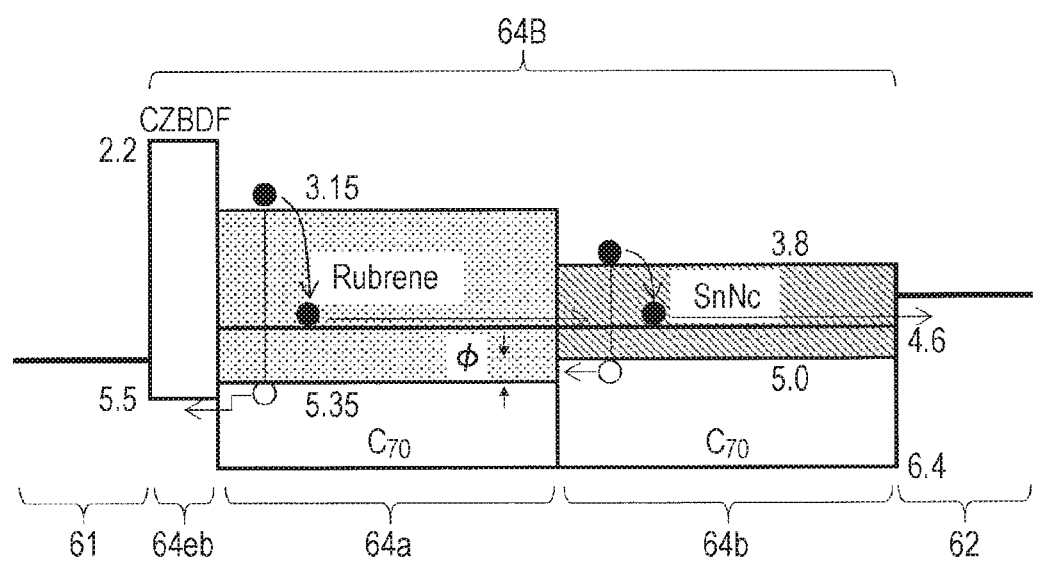
FIG. 21 is an energy diagram in still another configuration example of the photoelectric converter.

FIG. 21 is an energy diagram in still another configuration instance of the photoelectric converter PC. The rectangles in FIG. 21, schematically illustrate LUMO and HOMO in each material. The numerical value given near each of the upper sides and the lower sides of these rectangles indicates the electron affinity and the ionization potential of each material. The thick horizontal lines in FIG. 21 schematically indicate the exemplary Fermi levels of the opposite electrode 62 and the pixel electrode 61.

Figure 22:
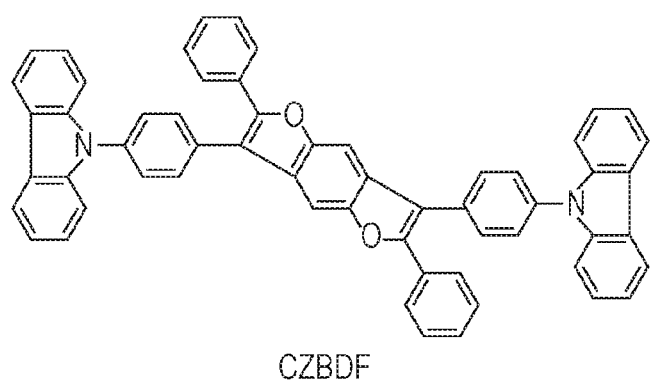
FIG. 22 is a diagram illustrating the chemical formula of CZBDF.

In the configuration illustrated to FIG. 21, the photoelectric conversion structure 64B has a multilayer structure in which the electronic blocking layer 64eb, the first photoelectric conversion layer 64a, and the second photoelectric conversion layer 64b are stacked from the pixel electrode 61 to the opposite electrode 62. In this instance, as the first material, the second material, and the material for the electronic blocking layer 64eb, rubrene, SnNc, and bis (carbazolyl) benzodifuran (CZBDF) which is an ambipolar organic semiconductor are used, respectively. FIG. 22 illustrates the chemical formula of CZBDF. AS schematically illustrated in FIG. 21, the first photoelectric conversion layer 64a and the second photoelectric conversion layer 64b include $C_{70}$ as an acceptor organic semiconductor. The first photoelectric conversion layer 64a in this instance receives the visible light to generate charge pairs by photoelectric conversion, and the second photoelectric conversion layer 64b receives the infrared light to generate charge pairs by photoelectric conversion. Each open circle "○" and solid circle "●" in FIG. 21 respectively indicate a positive charge and a negative charge generated by photoelectric conversion.

As already described, when positive charges are collected by the pixel electrode 61, a predetermined voltage is supplied to the opposite electrode 62, for instance, and the opposite electrode 62 has a potential higher than the potential of the pixel electrode 61. In this state, when the visible light is incident to the first photoelectric conversion layer 64a and positive and negative charges are generated in the first photoelectric conversion layer 64a, the positive charges are collected by the pixel electrode 61. Specifically, the imaging cell 10 has sensitivity to the wavelength range of visible light with signal charges generated by irradiation with visible light accumulated in a charge accumulation region. The negative charges transfer from the LUMO level to the LUMO level of $C_{70}$, and moves toward the opposite electrode 62 by the electric field between the pixel electrode 61 and the opposite electrode 62. Since $C_{70}$ is used in common as an acceptor organic semiconductor between the first photoelectric conversion layer 64a and the second photoelectric conversion layer 64b, the negative charges, which have transferred to the LUMO level of $C_{70}$, continuously move to the opposite electrode 62, and can be collected by the opposite electrode 62.

Here, a state is assumed in which infrared light is incident to the second photoelectric conversion layer 64b, and positive and negative charges are generated in the second photoelectric conversion layer 64b. When attention is focused on the positive charges, the positive charges move toward the pixel electrode 61 by the electric field between the pixel electrode 61 and the opposite electrode 62. However, as illustrated in FIG. 21, the ionization potential of rubrene is greater than the ionization potential of SnNc, and thus a potential barrier for the positive charges is formed between the HOMO level of SnNc and the HOMO level of rubrene. Therefore, when the bias between the pixel electrode 61 and the opposite electrode 62 is low, the positive charges cannot overcome the potential barrier, and do not reach the pixel electrode 61. This indicates a state in which the imaging cell 10 has no sensitivity to the wavelength range of infrared light.

When the bias between the pixel electrode 61 and the opposite electrode 62 is increased, and energy for overcoming the potential barrier is given to the positive charges, the positive charges overcome the potential barrier, and reach the pixel electrode 61. That is, the positive charges generated in the second photoelectric conversion layer 64b can be collected by the pixel electrode 61 by applying a greater potential difference between the pixel electrode 61 and the opposite electrode 62. In other words, sensitivity in the wavelength range of infrared light can be given to the imaging cell 10 by switching the potential difference Φ to be applied across the pixel electrode 61 and the opposite electrode 62. At this point, the imaging cell 10 has sensitivity in the wavelength ranges of visible light and infrared light, for instance.

When the difference φ from the ionization potential of the second material Included in the second photoelectric conversion layer 64b to the ionization potential of the first material Included in the first photoelectric conversion layer 64a is approximately 0.2 eV or more, the effect of such switching of spectral sensitivity characteristic by switching the potential difference Φ is obtained. At this point, as illustrated in FIG. 21, in a configuration in which the second photoelectric conversion layer 64b is positioned between the first photoelectric conversion layer 64a and the opposite electrode 62, it is only necessary to cause the opposite electrode 62 to be higher in potential than the pixel electrode 61.

Like this, when the ionization potential of the first material is greater than the ionization potential of the second material by a certain difference or more, the spectral sensitivity characteristic in the imaging cell 10 can be electrically switched even when the impedance difference between the first photoelectric conversion layer 64a and the second photoelectric conversion layer 64b is small. An impedance difference may be further provided between the first photoelectric conversion layer 64a and the second photoelectric conversion layers 64b such that the impedance difference is sufficiently large to allow the spectral sensitivity characteristic to be electrically switched.

A HOMO level of organic material can be determined, for instance, based on photoelectron spectroscopy, and photoemission yield spectroscopy. Also, a LUMO level may be determined based on inverse photoemission spectroscopy or by subtracting the energy at an absorption spectrum end from the HOMO level. [Examples]

A sample having a multilayer structure similar to an instance of the above-described photoelectric converter PC was produced, and the change of spectral sensitivity characteristic with respect to the change of the bias in the produced sample was evaluated by measuring E.Q.E. with the bias changed. The sample was produced in the following manner.

Example 1-1

First, a glass substrate was prepared. Subsequently, the materials listed in Table 1 were deposited sequentially on a glass substrate by vacuum deposition, and thus a multilayer structure is formed on the glass substrate, the multilayer structure including a lower-surface electrode, an electronic blocking layer, a lower-side photoelectric conversion layer, an upper-side photoelectric conversion layer, and an upper-surface electrode. Table 1 also illustrates the thickness of each layer formed. In the formation of the lower-side photoelectric conversion layer, SnNc and $C_{70}$ were co-evaporated. Similarly, the upper-side photoelectric conversion layer was formed by co-evaporating DTDCTB and $C_{70}$. In the formation of the lower-side photoelectric conversion layer and the formation of the upper-side photoelectric conversion layer, the conditions for vapor deposition were adjusted so that the volume ratio between SnNc and $C_{70}$, and the volume ratio between DTDCTB and $C_{70}$ become 1:1. In this manner, the sample of Example 1-1 was obtained.

TABLE 1

| LAYER | MATERIAL | THICKNESS (nm) |
|---|---|---|
| UPPER-SURFACE ELECTRODE | Al | 80 |
| UPPER-SIDE PHOTOELECTRIC CONVERSION LAYER | DTDCTB:$C_{70}$ (1:1) | 60 |
| LOWER-SIDE PHOTOELECTRIC CONVERSION LAYER | SnNc:$C_{70}$ (1:1) | 60 |
| ELECTRON BLOCKING LAYER | CZBDF | 10 |
| LOWER-SURFACE ELECTRODE | ITO | 150 |

Next, spectral sensitivity measuring device CEP-25RR manufactured by Bunkoukeiki Co., Ltd was connected to the lower-surface electrode and the upper-surface electrode, and E.Q.E. in the sample of Example 1-1 was measured while changing the bias to be applied across the lower-surface electrode and the upper-surface electrode. Here, with the quantity of light to a measurement target fixed, E.Q.E. was measured by changing the potential of the lower-surface electrode to −3 V, −5 V, −8 V, −10 V, and −11 V with the potential of the upper-surface electrode is grounded. Application of these biases corresponds to the configuration in which positive charges are collected by the pixel electrode 61 in the above-described photoelectric converter PC. Specifically, in this instance, positive charges generated by photoelectric conversion move toward the lower-surface electrode, and the lower-surface electrode and the upper-surface electrode in the sample of Example 1-1 can be associated with the pixel electrode 61 and the opposite electrode 62 in the above-described photoelectric converter PC, respectively. However, because light was incident from the glass substrate side in the measurement, ITO was used as the material for the lower-surface electrode, and Al was used as the material for the upper-surface electrode.

Figure 24:
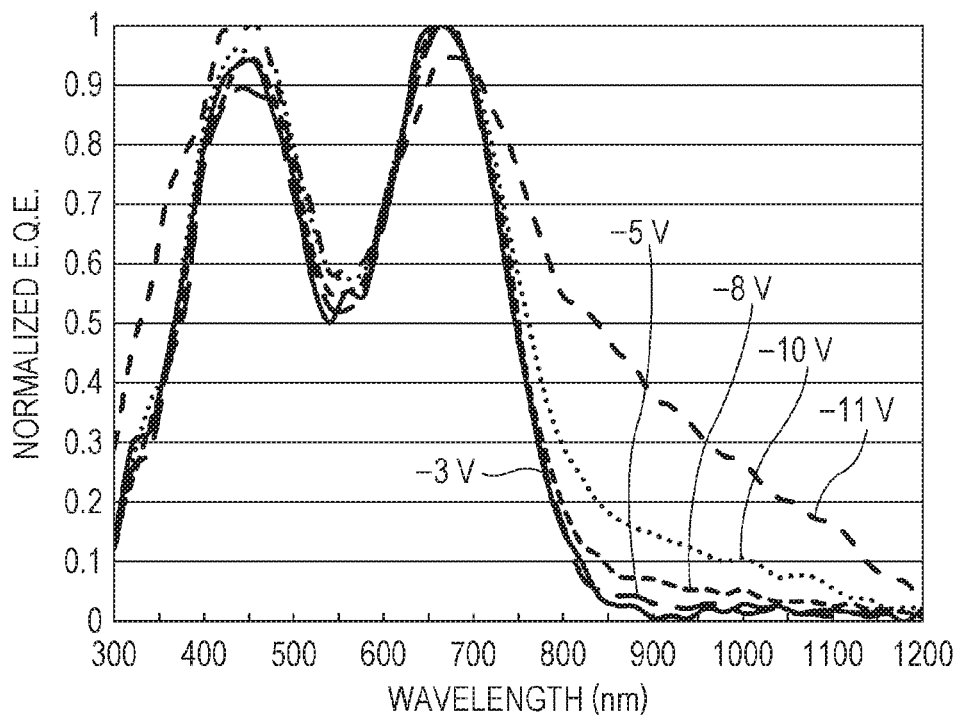
FIG. 24 is graph illustrating the voltage dependence of external quantum efficiency in a sample of Example 1-1.

FIG. 24 illustrates the voltage dependence of E.Q.E. in the sample of Example 1-1. Each of the graphs illustrated in FIG. 24 is normalized so that the peak value of E.Q.E. equals 1. It is to be noted that in each graph after FIG. 24 related to the voltage dependence of E.Q.E., is normalized so that the peak value of E.Q.E. equals 1.

When the absolute value of the bias voltage applied to the lower-surface electrode is small, in other words, when the potential difference applied across two electrodes is small, it is found from FIG. 24 that E.Q.E. in near an absorption peak position of SnNc included in the lower-side photoelectric conversion layer has a relatively small value. In short, the sensitivity in the infrared range is low. In contrast, in the visible range where DTDCTB included in the upper-side photoelectric conversion layer has an absorption peak, a relatively high E.Q.E. was obtained. Furthermore, it is found from FIG. 24 that when the absolute value of the bias voltage applied to the lower-surface electrode is increased, the E.Q.E. in the infrared range increases as the absolute value of the bias voltage is increased. Consequently, it is found that sensitivity in the wavelength range corresponding to the absorption spectrum of SnNc increases depending on the magnitude of the bias.

For instance, at the wavelength (near 870 nm) corresponding to the absorption peak of SnNc, the E.Q.E. when the potential of the lower-surface electrode was set to −3 V is compared with the E.Q.E. when the potential of the lower-surface electrode was set to −11 V, the latter was approximately 33.7 times the former. It is although it did not illustrate in FIG. 24, at the wavelength (near 870 nm) corresponding to the absorption peak of SnNc, the E.Q.E. when the potential of the lower-surface electrode was set to −15 V was approximately 33.7 times the E.Q.E. when the potential of the lower-surface electrode was set to −3 V.

Next, the impedance of the upper-side photoelectric conversion layer was compared with the impedance of the lower-side photoelectric conversion layer. For the measurement of impedance, a sample having only the upper-side photoelectric conversion layer between the lower-surface electrode and the upper-surface electrode, and a sample having only the lower-side photoelectric conversion layer between the lower-surface electrode and the upper-surface electrode were used. The configuration of the sample used for measurement of the impedance of the upper-side photoelectric conversion layer is the same as the configuration of the sample of Example 1-1 except that the lower-side photoelectric conversion layer and the electronic blocking layer were not formed, and the thickness of the upper-side photoelectric conversion layer was 200 nm. The configuration of the sample used for measurement of the impedance of the lower-side photoelectric conversion layer is the same as the configuration of the sample of Example 1-1 except that the upper-side photoelectric conversion layer and the electronic blocking layer were not formed, and the thickness of the lower-side photoelectric conversion layer was 200 nm. For the measurement and analysis of the impedance, ModuLab XM ECS manufactured by TOYO Corporation and Zplot software were used. Frequency sweep mode was used as the operation mode, the amplitude was set to 10 mV, and the frequency was changed from 1 Hz to 1 MHz. Measurement was made with start delay of 5 sec. The values of impedances were compared between the upper-side photoelectric conversion layer and the lower-side photoelectric conversion layer with the bias voltage to the lower-surface electrode with respect to the upper-surface electrode at −8 V and the frequency at 1 Hz.

The value of impedance with the bias voltage of −8 V and the frequency of 1 Hz was $7.5 \times 10^6 \Omega$ for the upper-side photoelectric conversion layer including DTDCTB, and $4.2 \times 10^3 \Omega$ for the lower-side photoelectric conversion layer including SnNc. That is, the impedance of the upper-side photoelectric conversion layer was approximately 1800 times greater than the impedance of the lower-side photoelectric conversion layer.

Figure 25:
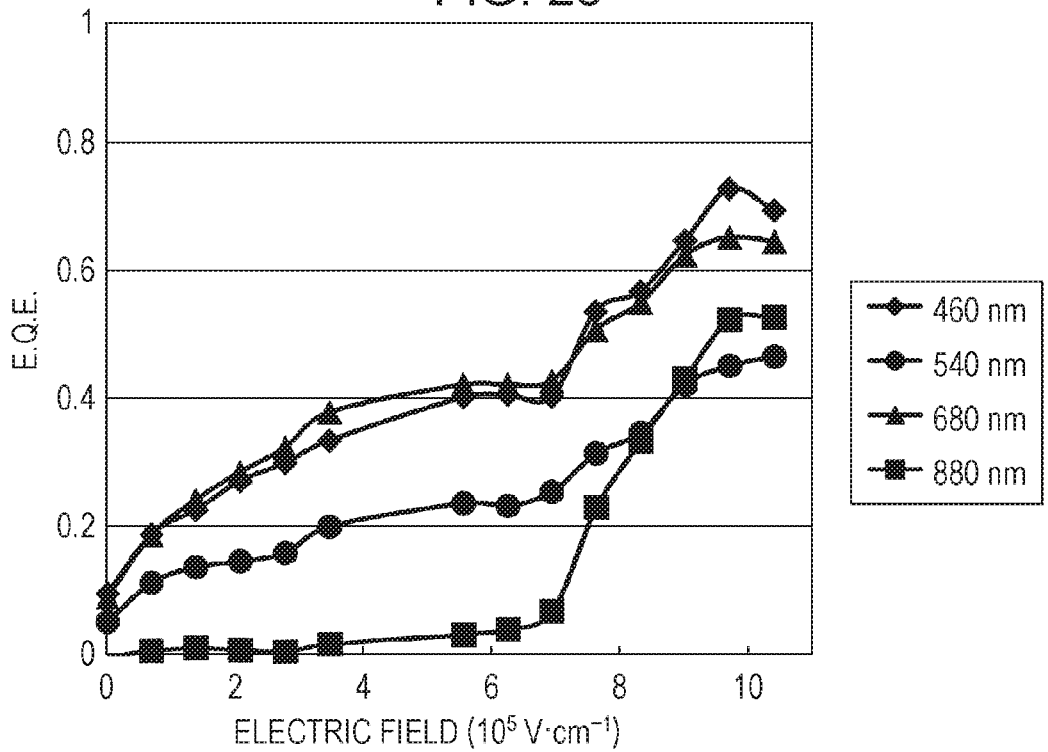
FIG. 25 is a graph illustrating the relationship between external quantum efficiency and applied electric field with wavelengths of 460 nm, 540 nm, 680 nm, and 880 nm for the sample of Example 1-1.

FIG. 25 illustrates the relationship between E.Q.E. and applied electric field with wavelengths of 460 nm, 540 nm, 680 nm, and 880 nm for the sample of Example 1-1. The horizontal axis of the graph illustrated in FIG. 25 indicates the value obtained by dividing the bias voltage applied across the upper-surface electrode and the lower-surface electrode by the sum of thicknesses of the upper-side photoelectric conversion layer, the lower-side photoelectric conversion layer, and the electronic blocking layer. That is, the horizontal axis of the graph illustrated in FIG. 25 corresponds to the magnitude of the electric field applied across the upper-surface electrode and the lower-surface electrode.

In the instance illustrated in FIG. 25, the E.Q.E. for the light with a wavelength of 880 nm is substantially zero with the electric field strength less than approximately $4 \times 10^5$ V/cm, and the E.Q.E. starts to increase with the electric field strength of a threshold value or greater, here approximately $4 \times 10^5$ V/cm or greater. A sufficiently high bias can be applied to a layer having a relatively lower impedance of two photoelectric conversion layers by applying a sufficiently high bias to the photoelectric conversion structure (for instance, see FIG. 18) including a multilayer structure having the first and second photoelectric conversion layers. From FIG. 25, it is found that when a sufficiently high bias is applied to a layer (that is, here the lower-side photoelectric conversion layer) having a relatively lower impedance between two photoelectric conversion layers, the E.Q.E. of the layer has a relatively large value. From FIG. 25, it is found that the E.Q.E. for each of wavelengths 460 nm, 540 nm, 680 nm, and 880 nm tends to be saturated when the magnitude of the electric field between the upper-surface electrode and the lower-surface electrode is approximately $9 \times 10^5$ V/cm or greater.

Reference Example 1

A sample of Reference Example 1 substantially the same as the sample of Example 1-1 was produced except that a mixed layer including SnNc and DTDCTB was disposed between the lower-side photoelectric conversion layer and the upper-side photoelectric conversion layers. Table 2 below lists the material and the thickness of each layer in the sample of Reference Example 1. The mixed layer was formed by co-evaporating three materials: SnNc, DTDCTB, and $C_{70}$. In the formation of the mixed layer, the conditions for vapor deposition were adjusted so that the volume ratio between SnNc, DTDCTB, and $C_{70}$ becomes 1:1:8. Also, in the formation of the lower-side photoelectric conversion layer and the formation of the upper-side photoelectric conversion layer, the conditions for vapor deposition were adjusted so that the volume ratio between SnNc and $C_{70}$, and the volume ratio between DTDCTB and $C_{70}$ become 1:4.

TABLE 2

| LAYER | MATERIAL | THICKNESS (nm) |
|---|---|---|
| UPPER-SURFACE ELECTRODE | Al | 80 |
| UPPER-SIDE PHOTOELECTRIC CONVERSION LAYER | DTDCTB:$C_{70}$ (1:4) | 50 |
| MIXED LAYER | SnNc:DTDCTB:$C_{70}$ (1:1:8) | 20 |
| LOWER-SIDE PHOTOELECTRIC CONVERSION LAYER | SnNc:$C_{70}$ (1:4) | 50 |
| ELECTRON BLOCKING LAYER | CZBDF | 10 |
| LOWER-SURFACE ELECTRODE | ITO | 150 |

Figure 26:
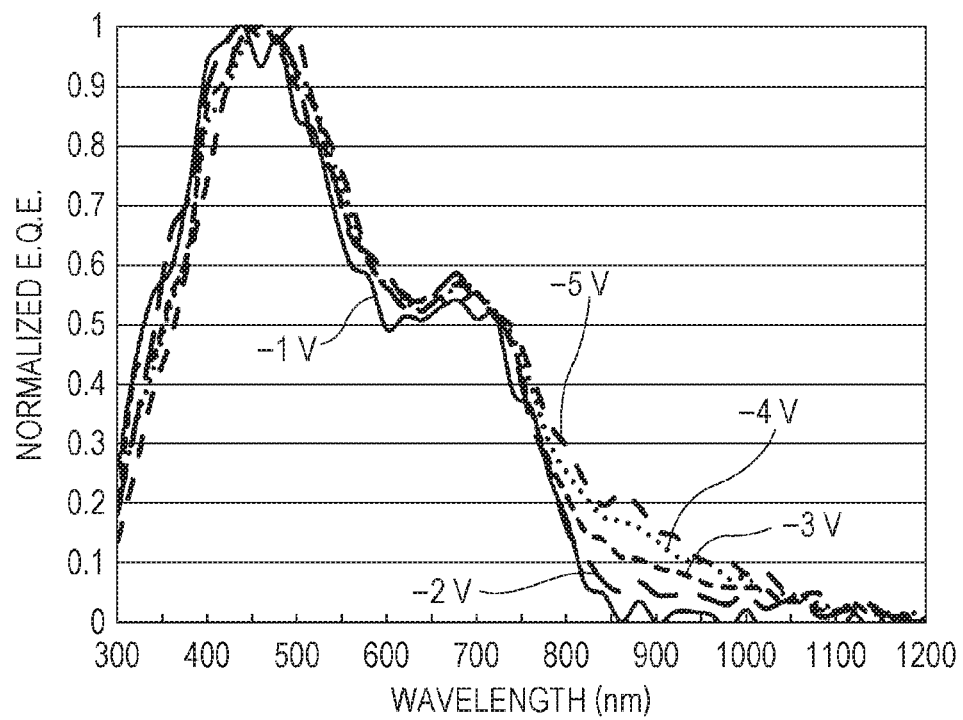
FIG. 26 is a graph illustrating the voltage dependence of external quantum efficiency in a sample of Reference Example 1.

Similarly to the sample of Example 1-1, for the sample of Reference Example 1, the voltage dependence of the E.Q.E. was measured. FIG. 26 illustrates the voltage dependence of E.Q.E. in the sample of Reference Example 1.

As illustrated in FIG. 26, similarly to the sample of Example 1-1, in the sample of Reference Example 1, due to the increase in the absolute value of the bias voltage applied to the lower-surface electrode, the E.Q.E. at near (near 870 nm) the absorption peak position of SnNc included in the lower-side photoelectric conversion layer increases. From FIG. 26, even with the configuration in which the mixed layer including both the first material and the second material is disposed between the photoelectric conversion layers in the multilayer structure having the first and second photoelectric conversion layers, the effect of sensitivity modulation can be obtained by switching the bias voltage.

Example 1-2

Similarly to the sample of Example 1-1, a sample of Example 1-2 was produced except that ClAlPc and $C_{70}$ were used as the material to form the lower-side photoelectric conversion layer. In the formation of the lower-side photoelectric conversion layer, the conditions for vapor deposition were adjusted so that the volume ratio between ClAlPc and $C_{70}$ becomes 1:9. Table 3 below lists the material and the thickness of each layer in the sample of Example 1-2.

TABLE 3

| LAYER | MATERIAL | THICKNESS (nm) |
|---|---|---|
| UPPER-SURFACE ELECTRODE | Al | 80 |
| UPPER-SIDE PHOTOELECTRIC CONVERSION LAYER | DTDCTB:$C_{70}$ (1:9) | 60 |
| LOWER-SIDE PHOTOELECTRIC CONVERSION LAYER | ClAlPc:$C_{70}$ (1:1) | 60 |
| ELECTRON BLOCKING LAYER | CZBDF | 10 |
| LOWER-SURFACE ELECTRODE | ITO | 150 |

Comparative Example 1

Similarly to the sample of Example 1-2, a sample of Comparative Example 1 was produced except that the conditions for vapor deposition were adjusted so that the volume ratio between ClAlPc and $C_{70}$, and the volume ratio between DTDCTB and $C_{70}$ become 1:4. Table 4 below lists the material and the thickness of each layer in the sample of Comparative Example 1.

TABLE 4

| LAYER | MATERIAL | THICKNESS (nm) |
|---|---|---|
| UPPER-SURFACE ELECTRODE | Al | 80 |
| UPPER-SIDE PHOTOELECTRIC CONVERSION LAYER | DTDCTB:$C_{70}$ (1:4) | 60 |
| LOWER-SIDE PHOTOELECTRIC CONVERSION LAYER | ClAlPc:$C_{70}$ (1:4) | 60 |
| ELECTRON BLOCKING LAYER | CZBDF | 10 |
| LOWER-SURFACE ELECTRODE | ITO | 150 |

Figure 27:
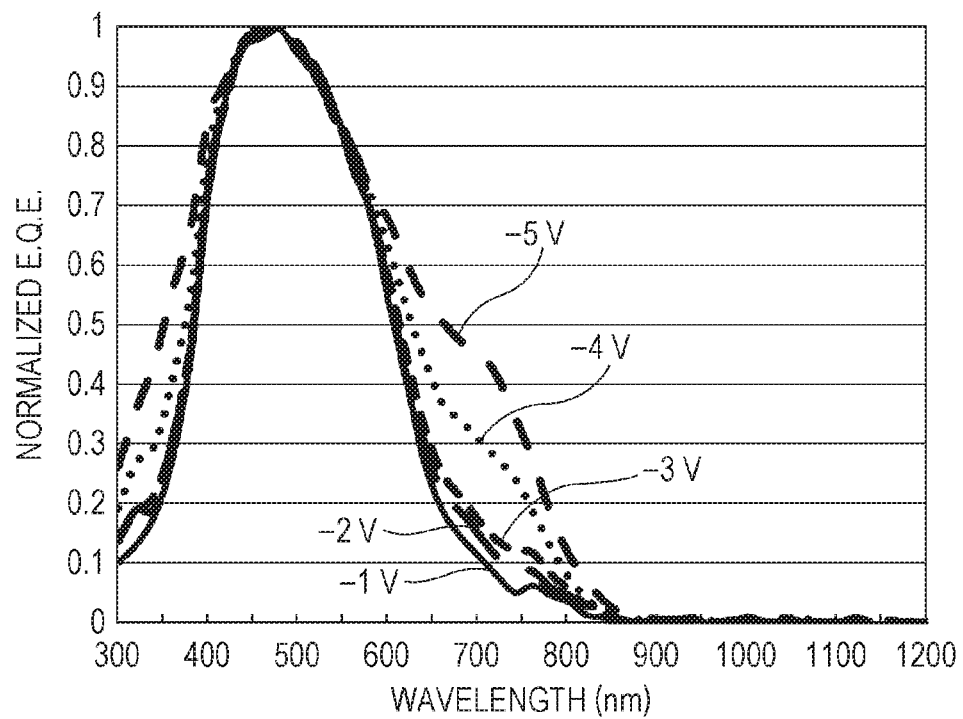
FIG. 27 is a graph illustrating the voltage dependence of external quantum efficiency in a sample of Example 1-2.
Figure 28:
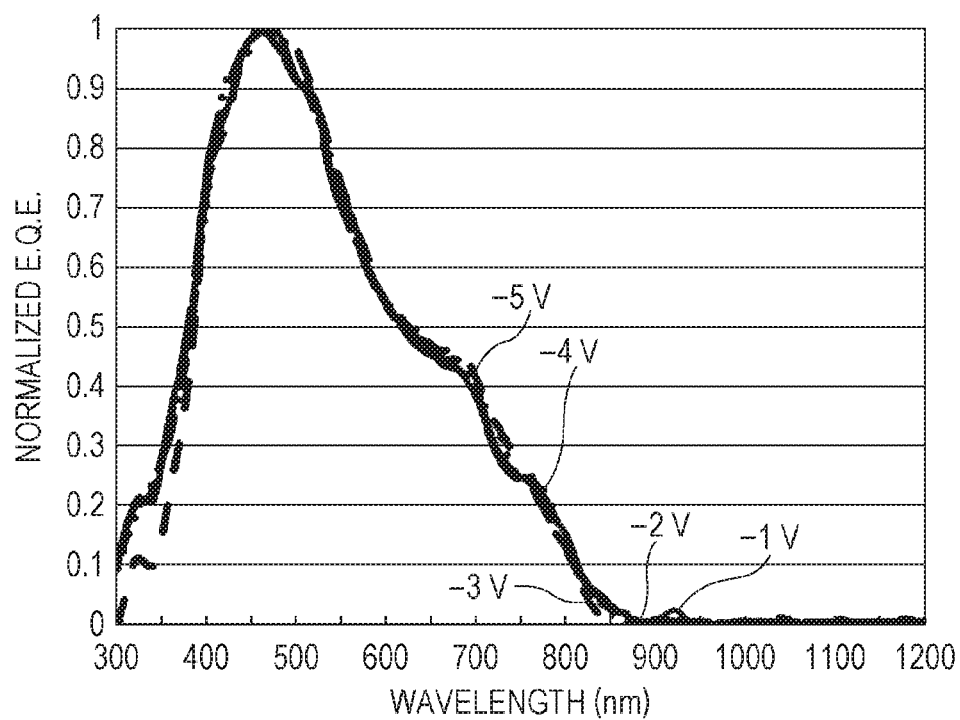
FIG. 28 is a graph illustrating the voltage dependence of external quantum efficiency in a sample of Comparative Example 1.

Similarly to the sample of Example 1-1, for the samples of Example 1-2 and Comparative Example 1, the voltage dependence of the E.Q.E. was measured. FIGS. 27 and 28 illustrate the voltage dependence of the E.Q.E. in the samples of Example 1-2 and Comparative Example 1, respectively.

As illustrated in FIG. 27, in the sample of Example 1-2, the E.Q.E. in the infrared range increases as the electric field strength applied across two electrodes increases. That is, in the sample of Example 1-2, due to the increase in the absolute value of the bias voltage applied to the lower-surface electrode, the E.Q.E. at near (near 750 nm) the absorption peak position of ClAlPc included in the lower-side photoelectric conversion layer increases. In other words, modulation of sensitivity occurred in the infrared range by switching the bias voltage. For instance, at the wavelength corresponding to the absorption peak of ClAlPc, the E.Q.E. when the potential of the lower-surface electrode was set to −1 V is compared with the E.Q.E. when the potential of the lower-surface electrode was set to −5 V, the latter was approximately 6.55 times the former. In contrast, as illustrated in FIG. 28, in the sample of Comparative Example 1, even when the bias voltage applied to the lower-surface electrode is changed, no significant change was observed in the graph of E.Q.E., and it is found that no modulation of sensitivity occurred in the infrared range by switching the bias voltage.

Next, similarly to the sample of Example 1-1, for each of the samples of Example 1-2 and the sample of Comparative Example 1, a sample having only the upper-side photoelectric conversion layer between the lower-surface electrode and the upper-surface electrode, and a sample having only the lower-side photoelectric conversion layer between the lower-surface electrode and the upper-surface electrode were produced, and the impedance of the upper-side photoelectric conversion layer and the impedance of the lower-side photoelectric conversion layer were measured. The thicknesses of the upper-side photoelectric conversion layer and the lower-side photoelectric conversion layer in the sample of a measurement target are both 200 nm. Table 5 below lists the result of measurement of impedance. Each of the values of impedance listed below is a value when the bias voltage to the lower-surface electrode with respect to the upper-surface electrode at −8 V and the frequency at 1 Hz.

TABLE 5

| SAMPLE | LAYER | DONOR-ACCEPTOR RATIO | IMPEDANCE ($\Omega$) |
|---|---|---|---|
| EXAMPLE 1-2 | UPPER-SIDE PHOTOELECTRIC CONVERSION LAYER | DTDCTB:$C_{70}$ (1:9) | $1.2 \times 10^7$ |
|  | LOWER-SIDE PHOTOELECTRIC CONVERSION LAYER | ClAlPc:$C_{70}$ (1:1) | $6.3 \times 10^4$ |
| COMPARATIVE EXAMPLE 1 | UPPER-SIDE PHOTOELECTRIC CONVERSION LAYER | DTDCTB:$C_{70}$ (1:4) | $3.0 \times 10^7$ |
|  | LOWER-SIDE PHOTOELECTRIC CONVERSION LAYER | ClAlPc:$C_{70}$ (1:4) | $1.0 \times 10^7$ |

As seen from Table 5, in the sample of Comparative Example 1, the impedance of the upper-side photoelectric conversion layer was approximately three times greater than the impedance of the lower-side photoelectric conversion layer, whereas in the sample of Example 1-2, the impedance of the upper-side photoelectric conversion layer was approximately 190 times greater than the impedance of the lower-side photoelectric conversion layer. Modulation of sensitivity by switching the bias voltage was not observed in the sample of Comparative Example 1, whereas modulation of sensitivity by switching the bias voltage was observed in the sample of Example 1-2. This is probably because the impedance difference between the upper-side photoelectric conversion layer and the lower-side photoelectric conversion layers has increased.

It is to be noted that in the samples of Example 1-1 and Example 1-2, the ionization potential of DTDCTB used for formation of the upper-side photoelectric conversion layer is approximately 5.6 eV. The ionization potential of SnNc used for formation of the lower-side photoelectric conversion layer in the sample of Example 1-1 and the ionization potential of ClAlPc used for formation of the lower-side photoelectric conversion layer in the sample of Example 1-2 are 5.0 eV and 5.5 eV, respectively. Therefore, in the samples of Example 1-1 and Example 1-2, no potential barrier for the positive charges is formed between the lower-side photoelectric conversion layer and the upper-side photoelectric conversion layers. Thus, when the impedance difference between two photoelectric conversion layers in the multilayer structure is high to some extent, modulation of sensitivity by switching the bias voltage is obtained even when no potential barrier for the positive charges is present.

Example 2-1

Similarly to the sample of Example 1-1 essentially, a sample of Example 2-1 was produced except that SnNc and $C_{70}$ were used as the material to form the upper-side photoelectric conversion layer, and rubrene and $C_{70}$ were used as the material to form the lower-side photoelectric conversion layer. The volume ratio between SnNc and $C_{70}$, and the volume ratio between rubrene and $C_{70}$ were adjusted to be 1:4. Table 6 below lists the material and the thickness of each layer in the sample of Example 2-1. As illustrated in Table 6, both the thickness of the upper-side photoelectric conversion layer and the lower-side photoelectric conversion layer were 200 nm.

TABLE 6

| LAYER | MATERIAL | THICKNESS (nm) |
|---|---|---|
| UPPER-SURFACE ELECTRODE | Al | 80 |
| UPPER-SIDE PHOTOELECTRIC CONVERSION LAYER | SnNc:$C_{70}$ (1:4) | 200 |
| LOWER-SIDE PHOTOELECTRIC CONVERSION LAYER | Rubrene:$C_{70}$ (1:4) | 200 |
| ELECTRON BLOCKING LAYER | CZBDF | 10 |
| LOWER-SURFACE ELECTRODE | ITO | 150 |

Comparative Example 2-1

Similarly to the sample of Example 2-1, a sample of Comparative Example 2-1 was produced except that Rubrene and $C_{70}$ were used as the material to form the upper-side photoelectric conversion layer, and SnNc and $C_{70}$ were used as the material to form the lower-side photoelectric conversion layer. In other words, the sample of Comparative Example 2-1 has a configuration in which the upper-side photoelectric conversion layer and the lower-side photoelectric conversion layer in the sample of Example 2-1 are swapped. Table 7 below lists the material and the thickness of each layer in the sample of Comparative Example 2-1.

TABLE 7

| LAYER | MATERIAL | THICKNESS (nm) |
|---|---|---|
| UPPER-SURFACE ELECTRODE | Al | 80 |
| UPPER-SIDE PHOTOELECTRIC CONVERSION LAYER | Rubrene:$C_{70}$ (1:4) | 200 |
| LOWER-SIDE PHOTOELECTRIC CONVERSION LAYER | SnNc:$C_{70}$ (1:4) | 200 |
| ELECTRON BLOCKING LAYER | CZBDF | 10 |
| LOWER-SURFACE ELECTRODE | ITO | 150 |

Figure 29:
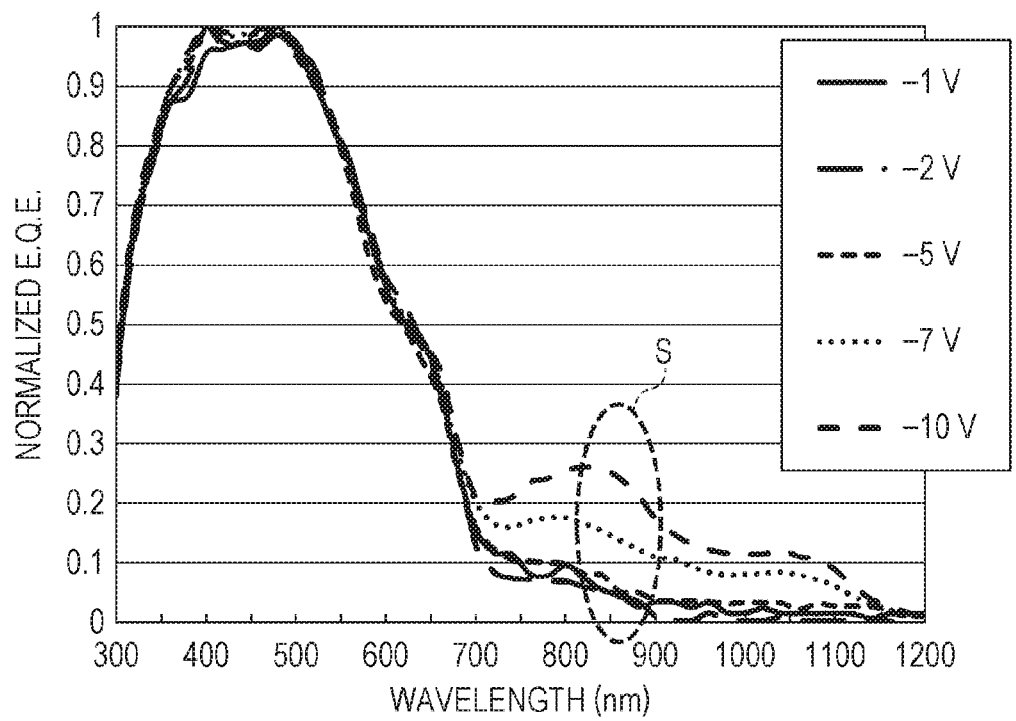
FIG. 29 is a graph illustrating the voltage dependence of external quantum efficiency in a sample of Example 2-1.
Figure 30:
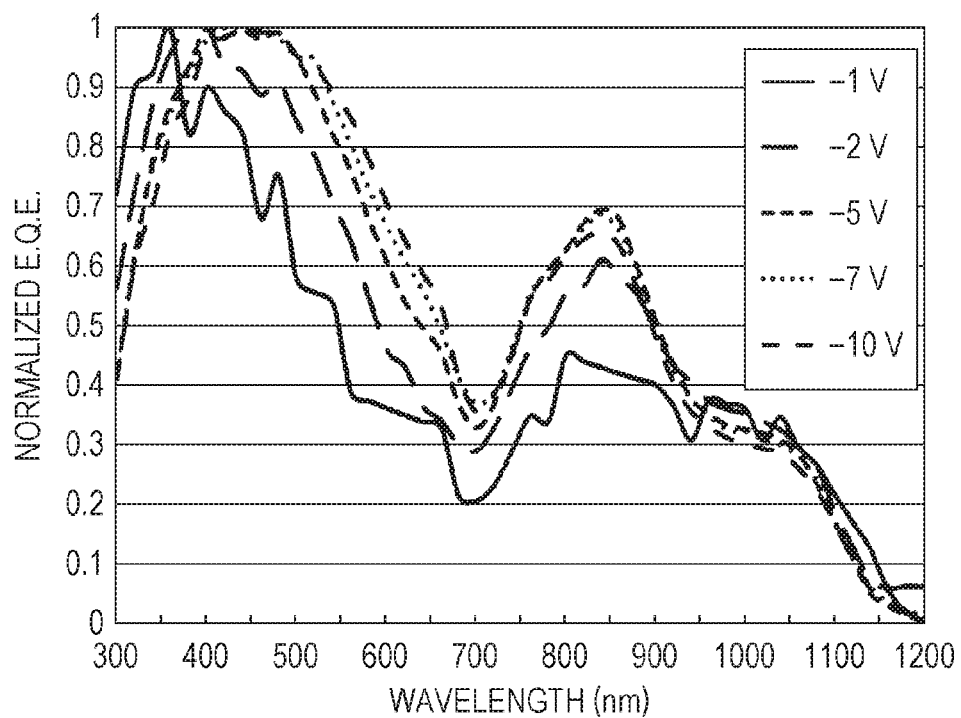
FIG. 30 is a graph illustrating the voltage dependence of external quantum efficiency in a sample of Comparative Example 2-1.

Similarly to the sample of Example 1-1, for the samples of Example 2-1 and Comparative Example 2-1, the voltage dependence of the E.Q.E. was measured. FIGS. 29 and 30 illustrate the voltage dependence of the E.Q.E. in the samples of Example 2-1 and Comparative Example 2-1, respectively.

In FIG. 29, as illustrated by a dashed ellipse S, in the sample of Example 2-1, the E.Q.E. in the infrared range increases as the electric field strength applied across two electrodes increases. In this instance, sufficient sensitivity has occurred in the infrared range at near a point where the bias voltage applied to the lower-surface electrode falls below −5V. In other words, in the sample of Example 2-1, due to the increase in the absolute value of the bias voltage applied to the lower-surface electrode, the E.Q.E. at near the absorption peak position of SnNc included in the lower-side photoelectric conversion layer increases. For instance, at the wavelength (near 870 nm) corresponding to the absorption peak of SnNc, the E.Q.E. when the potential of the lower-surface electrode was set to −3 V is compared with the E.Q.E. when the potential of the lower-surface electrode was set to −10 V, the latter was approximately 4.27 times the former.

In contrast, as illustrated in FIG. 30, in the sample of Comparative Example 2-1, both the E.Q.E. in the infrared range and the E.Q.E. in the visible range increase as the electric field strength applied across two electrodes increases. That is, in the sample of Comparative Example 2-1, no distinct modulation of sensitivity occurred in the infrared range by switching the bias voltage.

Next, similarly to the sample of Example 1-1, for each of the samples of Example 2-1 and the sample of Comparative Example 2-1, a sample having only the upper-side photoelectric conversion layer between the lower-surface electrode and the upper-surface electrode, and a sample having only the lower-side photoelectric conversion layer between the lower-surface electrode and the upper-surface electrode were produced, and the impedance of the upper-side photoelectric conversion layer and the impedance of the lower-side photoelectric conversion layer were measured. The thicknesses of the upper-side photoelectric conversion layer and the lower-side photoelectric conversion layer in the sample of a measurement target are both 200 nm. Table 8 below lists the result of measurement of impedance.

TABLE 8

| SAMPLE | LAYER | DONOR-ACCEPTOR RATIO | IMPEDANCE (Ω) |
|---|---|---|---|
| EXAMPLE 2-1 | UPPER-SIDE PHOTOELECTRIC CONVERSION LAYER | SnNc:$C_{70}$ (1:4) | $1.0 \times 10^4$ |
|  | LOWER-SIDE PHOTOELECTRIC CONVERSION LAYER | Rubrene:$C_{70}$ (1:4) | $9.0 \times 10^3$ |
| COMPARATIVE EXAMPLE 2-1 | UPPER-SIDE PHOTOELECTRIC CONVERSION LAYER | Rubrene:$C_{70}$ (1:4) | $9.0 \times 10^3$ |
|  | LOWER-SIDE PHOTOELECTRIC CONVERSION LAYER | SnNc:$C_{70}$ (1:4) | $1.0 \times 10^4$ |

As seen in Table 8, in the sample of Comparative Example 2-1, the impedance of the upper-side photoelectric conversion layer is smaller than the impedance of the lower-side photoelectric conversion layer. In contrast, in the sample of Example 2-1, the impedance of the upper-side photoelectric conversion layer is greater than the impedance of the lower-side photoelectric conversion layer. However, the ratio of the impedance of the upper-side photoelectric conversion layer to the lower-side photoelectric conversion layer is approximately 1.1 times, and a large difference was observed between the lower-side photoelectric conversion layer and the upper-side photoelectric conversion layer.

Here, when attention is focused on the ionization potentials of rubrene and SnNc, the ionization potential of rubrene is 5.35 eV and the ionization potential of SnNc is 5.0 eV. Therefore, in the sample of Example 2-1, for the positive charges that move toward the lower-surface electrode, a potential barrier of 0.35 eV is present between the HOMO level of rubrene and the HOMO level of SnNc (see FIG. 21). In contrast, in the sample of Comparative Example 2-1, for the positive charges that move toward the lower-surface electrode, no potential barrier is present between the HOMO level of rubrene and the HOMO level of SnNc. It is presumed that the reason why no distinct modulation of sensitivity in the infrared range was observed in the sample of Comparative Example 2-1, and yet distinct modulation of sensitivity in the infrared range was observed in the sample of Example 2-1 is that a potential barrier for the positive holes was formed between two photoelectric conversion layers.

Example 2-2

The materials listed in Table 9 below were deposited sequentially on a glass substrate by vacuum deposition, and thus a sample of Example 2-2 was produced. In the formation of the lower-side photoelectric conversion layer, ClAlPc and $C_{60}$ were co-evaporated, and in the formation of the upper-side photoelectric conversion layer, α-6T and $C_{70}$ were co-evaporated. In the formation of the lower-side photoelectric conversion layer, the conditions for vapor deposition were adjusted so that the volume ratio between ClAlPc and $C_{60}$ becomes 1:4, and in the formation of the upper-side photoelectric conversion layer, the conditions for vapor deposition were adjusted so that the volume ratio between α-6T and $C_{70}$ becomes 1:1.

TABLE 9

| LAYER | MATERIAL | THICKNESS (nm) |
|---|---|---|
| UPPER-SURFACE ELECTRODE | Al | 80 |
| UPPER-SIDE PHOTOELECTRIC CONVERSION LAYER | α-6T:$C_{70}$ (1:1) | 60 |

TABLE 9-continued

| LAYER | MATERIAL | THICKNESS (nm) |
|---|---|---|
| LOWER-SIDE PHOTOELECTRIC CONVERSION LAYER | ClAlPc:$C_{60}$ (1:4) | 60 |
| ELECTRON BLOCKING LAYER | CZBDF | 10 |
| LOWER-SURFACE ELECTRODE | ITO | 150 |

Figure 31:
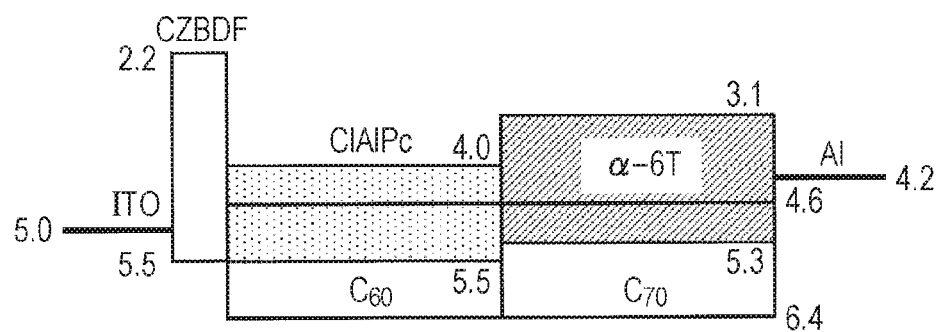
FIG. 31 is an energy diagram for a sample of Example 2-2.

FIG. 31 illustrates an energy diagram for the sample of Example 2-2. As illustrated in FIG. 31, the ionization potentials of ClAlPc and α-6T are 5.5 eV and 5.3 eV, respectively, and in the sample of Example 2-2, a potential barrier of 0.2 eV is formed between the HOMO level of ClAlPc and the HOMO level of α-6T.

Figure 32:
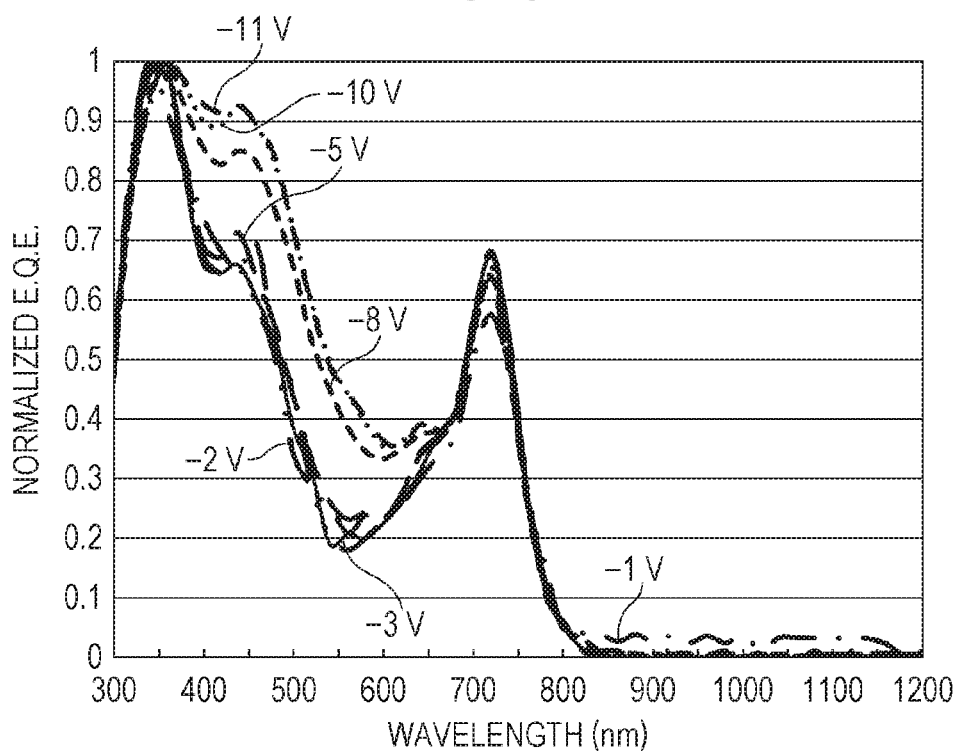
FIG. 32 is a graph illustrating the voltage dependence of external quantum efficiency in a sample of Example 2-2.

Similarly to the sample of Example 1-1, for the sample of Example 2-2, the voltage dependence of the E.Q.E. was measured. FIG. 32 illustrates the voltage dependence of the E.Q.E. in the sample of Example 2-2. As illustrated in FIG. 32, in the sample of Example 2-2, due to the increase in the absolute value of the bias voltage applied to the lower-surface electrode, the E.Q.E. at near (near 440 nm) the absorption peak position of α-6T increases. In other words, the E.Q.E. in the visible range increases. That is, in this instance, the effect of modulation of sensitivity by switching the bias voltage in the visible range is obtained.

Comparative Example 2-2

Similarly to the sample of Example 2-2, a sample of Comparative Example 2-2 was produced except that the material to form the upper-side photoelectric conversion layer and the material to form the lower-side photoelectric conversion layer are swapped. Table 10 below lists the material and the thickness of each layer in the sample of Example 2-2.

TABLE 10

| LAYER | MATERIAL | THICKNESS (nm) |
|---|---|---|
| UPPER-SURFACE ELECTRODE | Al | 80 |
| UPPER-SIDE PHOTOELECTRIC CONVERSION LAYER | ClAlPc:$C_{60}$ (1:4) | 60 |
| LOWER-SIDE PHOTOELECTRIC CONVERSION LAYER | α-6T:$C_{70}$ (1:1) | 60 |
| ELECTRON BLOCKING LAYER | CZBDF | 10 |
| LOWER-SURFACE ELECTRODE | ITO | 150 |

Figure 33:
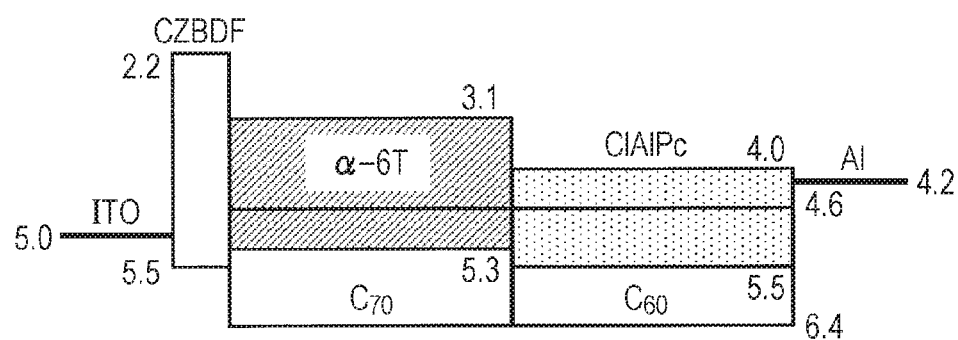
FIG. 33 is an energy diagram for a sample of Comparative Example 2-2.

FIG. 33 illustrates an energy diagram for the sample of Comparative Example 2-2. As seen from FIG. 33, in this instance, no potential barrier for the positive charges is formed between the HOMO level of ClAlPc and the HOMO level of α-6T.

Figure 34:
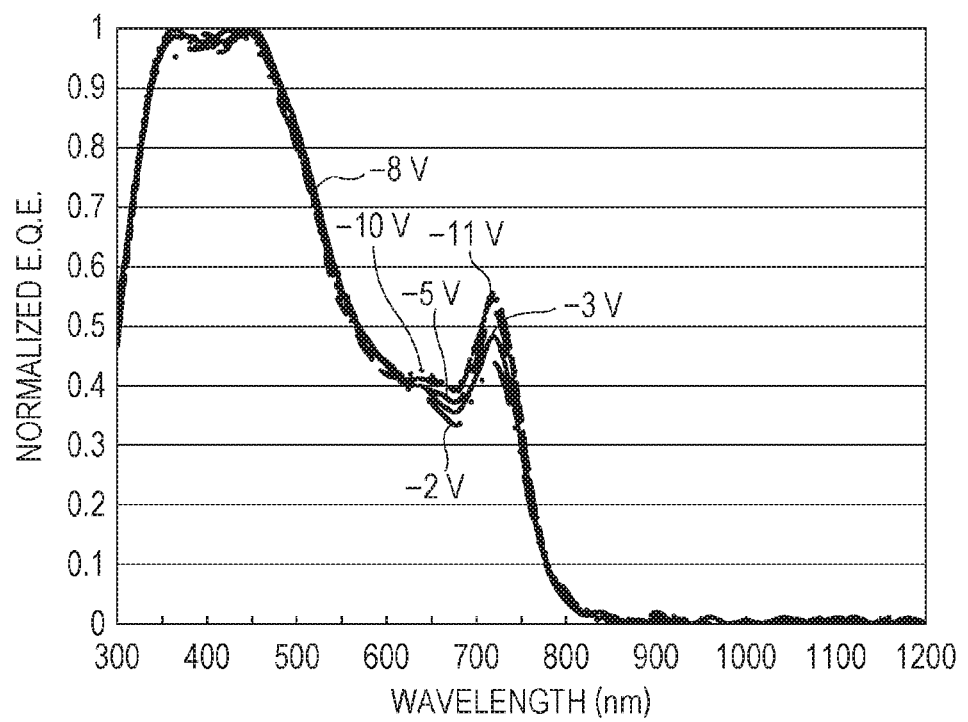
FIG. 34 is a graph illustrating the voltage dependence of external quantum efficiency in a sample of Comparative Example 2-2.

Similarly to the sample of Example 1-1, for the sample of Comparative Example 2-2, the voltage dependence of the E.Q.E. was measured. FIG. 34 illustrates the voltage dependence of E.Q.E. in a sample of Comparative Example 2-2. As illustrated in FIG. 34, in the sample of Comparative Example 2-2, even when the bias voltage applied to the lower-surface electrode is changed, no significant change was observed in the graph of E.Q.E., and no modulation of sensitivity occurred by switching the bias voltage.

It is found from FIGS. 29 to 34 that sensitivity modulation can be achieved through switching the bias voltage by forming a potential barrier for the positive charges between the HOMO level of the material of which the upper-side photoelectric conversion layer is composed and the HOMO level of the material of which the lower-side photoelectric conversion layer is composed. From comparison between Example 2-2 and Comparative Example 2-2, distinct increase in the E.Q.E. can be achieved even in the visible range by appropriately selecting materials for the two photoelectric conversion layers in the multilayer structure.

It is found from comparison between Example 2-2 and Comparative Example 2-2 that when the material for one photoelectric conversion layer has an ionization potential greater than the ionization potential of the material for the other photoelectric conversion layer by 0.2 eV or more, the effect of distinct increase in the E.Q.E. can be achieved in a specific wavelength range in addition to the infrared range, the one photoelectric conversion layer being one of two photoelectric conversion layers included in the multilayer structure in the photoelectric conversion structure and being closer to an electrode relatively low in potential (the lower-surface electrode in this instance). For instance, the ionization potential of Si(OSiR$_3$)$_2$Nc and the ionization potential of CuPc are 5.4 eV and 5.2 eV, respectively, and thus when Si(OSiR$_3$)$_2$Nc and CuPc are used as the first material Included in the first photoelectric conversion layer 64a and the second material Included in the second photoelectric conversion layer 64b, respectively, it is expected that distinct modulation of sensitivity in the visible range occurs. Instead of rubrene of Example 2-2, CuPc may be used.

As already described, the photoelectric conversion structure 66 of the imaging device 100F described with reference to FIG. 36 may be composed of a photoelectric conversion material including at least two types of materials that are the first material serving as a donor and the second material serving as an acceptor. Therefore, it is possible to use the first photoelectric conversion layer 64a or the second photoelectric conversion layer 64b as the photoelectric conversion structure 66. Alternatively, as in the mixed layer in the sample of the above-described Reference Example 1, a layer formed by co-evaporating three materials of SnNc, DTD-CTB, and $C_{70}$, for instance, can be used as the photoelectric conversion structure 66.

With use of the photoelectric conversion structure 66 having such a configuration, the sensitivity in the imaging cell 20 can be electrically changed by changing the potential difference applied across the electrodes by which the photoelectric conversion structure 66 is interposed. Therefore, for instance, two types of image signals for synthesizing a high dynamic range can be collectively obtained by making the potential difference Φx between the opposite electrode 62x and the pixel electrode 61x different from the potential difference Φy between the opposite electrode 62y and the pixel electrode 61y.

(Typical Example of Photoelectric Current Characteristic in Photoelectric Conversion Layer)

Furthermore, a photoelectric conversion structure that exhibits photocurrent characteristic as described below is used for the photoelectric converters PC or PC2, and the potential difference Φ between the pixel electrode 61 and the opposite electrode 62 is reduced to some extent, thereby making it possible to suppress movement of signal charges already accumulated in the charge accumulation region to the opposite electrode 62 via the photoelectric conversion structure 64 or the photoelectric conversion structure 66, and further accumulation of the signal charges in the charge accumulation region after the potential difference is reduced. Consequently, the function of a shutter can be electrically achieved by controlling the magnitude of the bias voltage to be applied to the photoelectric conversion structure. Therefore, for instance, a global shutter function can be achieved without separately providing a device such as a transfer transistor in each of the multiple imaging cells.

Figure 35:
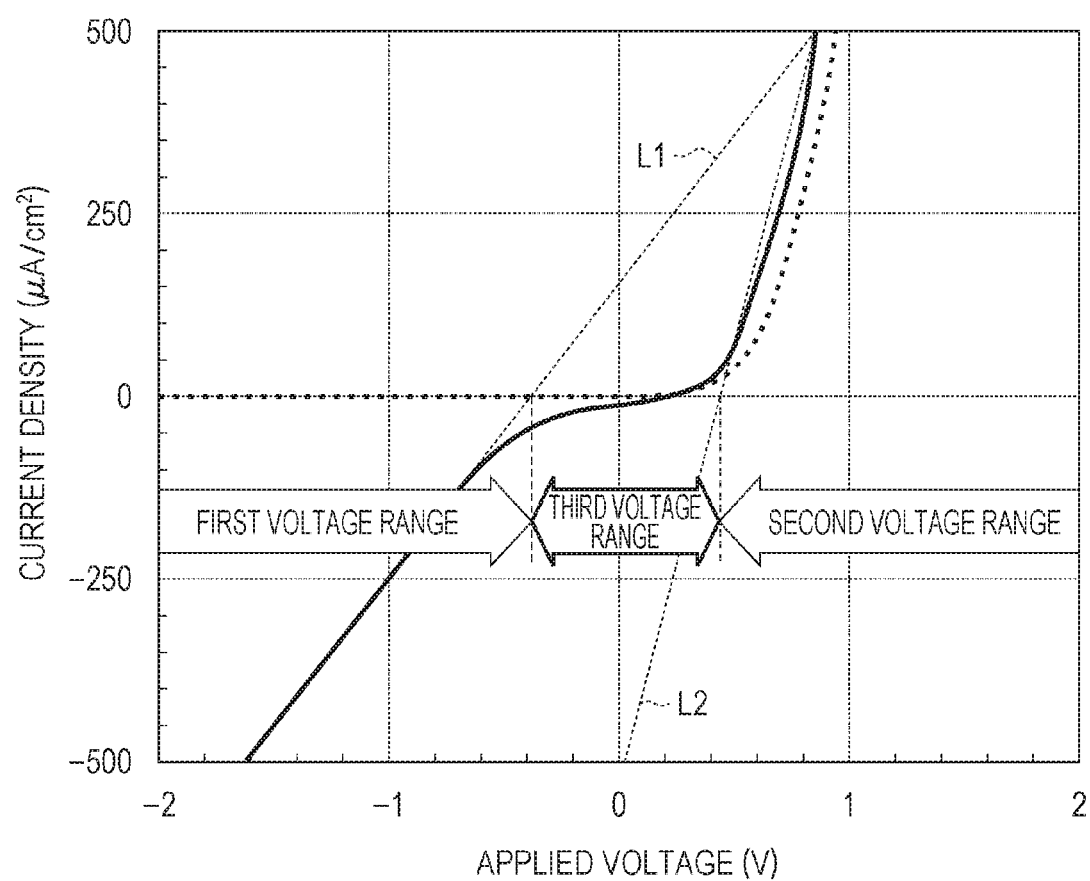
FIG. 35 is a graph illustrating a typical photocurrent characteristic of a photoelectric conversion structure according to Embodiments of the present disclosure.

FIG. 35 illustrates a typical photocurrent characteristic of a photoelectric conversion structure according to Embodiments of the present disclosure. The thick solid graph in FIG. 35 illustrates an exemplary I-V characteristic of the photoelectric conversion structure under irradiation with light. It is to be noted that FIG. 35 also illustrates an instance of I-V characteristic under no irradiation with light by a thick dashed line.

FIG. 35 illustrates the change in the current density between the major surfaces of the photoelectric conversion structure (e.g., the photoelectric conversion structure 64, 64A, 64B, or 66) when the bias voltage to be applied across the two major surfaces is changed under certain illumination. In the present description, the forward direction and the reverse direction in the bias voltage are defined as follows: When the photoelectric conversion structure has a structure of junction between a layered p-type semiconductor and a layered n-type semiconductor, a bias voltage that causes the potential of a layer of p-type semiconductor to be higher than the potential of a layer of n-type semiconductor is defined as the bias voltage in the forward direction. On the other hand, a bias voltage that causes the potential of a layer of p-type semiconductor to be lower than the potential of a layer of n-type semiconductor is defined as the bias voltage in the reverse direction. Similarly to the case where an inorganic semiconductor material is used, in the case where an organic semiconductor material is used, the forward direction and the reverse direction can be defined. When the photoelectric conversion structure has a bulk heterojunction structure, as schematically illustrated in FIG. 1 in Japanese Unexamined Patent Application Publication No. 5553727 mentioned above, a p-type semiconductor appears more often than an n-type semiconductor on one of the two major surfaces of a bulk heterojunction structure, which face respective electrodes, and an n-type semiconductor appears more often than a p-type semiconductor on the other major surface. Therefore, a bias voltage that causes the potential of one major surface in which a p-type semiconductor appears more often than an n-type semiconductor to be higher than the potential of the other major surface in which an n-type semiconductor appears more often than a p-type semiconductor can be defined as the bias voltage in the forward direction.

As illustrated in FIG. 35, for instance, the photoelectric current characteristic of the photoelectric conversion structure 64A is schematically characterized by first to third voltage ranges. The first voltage range is a reverse bias voltage range in which the absolute value of output current density increases as a reverse direction bias voltage increases. The first voltage range may be a voltage range such that a photoelectric current increases as the bias voltage applied across the major surfaces of the photoelectric conversion structure increases. The second voltage range is a forward bias voltage range in which the absolute value of output current density increases as a forward direction bias voltage increases. In other words, the second voltage range may be a voltage range such that a forward direction current increases as the bias voltage applied across the major surfaces of the photoelectric conversion structure increases. The third voltage range is a voltage range between the first voltage range and the second voltage range.

The first to third voltage ranges can be distinguished by the slope of a graph of photoelectric current characteristic when linear vertical axis and horizontal axis are used. For reference, in FIG. 35, an average slope of the graph in each of the first voltage range and the second voltage range is indicated by a dashed line L1 and a dashed line L2, respectively. As illustrated in FIG. 35, a rate of change in the output current density for an increase in the bias voltage in the first voltage range, the second voltage range, and the third voltage range is different from range to range. The third voltage range is defined as the voltage range in which the rate of change in the output current density for the bias voltage is lower than the rate of change in the first voltage range and the rate of change in the second voltage range. Alternatively, the third voltage range may be determined based on a rising or falling position in the graph illustrating the I-V characteristic. The third voltage range is typically a voltage range greater than −1 V and smaller than 1 V. In the third voltage range, even when the bias voltage is changed, the current density between the major surfaces of the photoelectric conversion structure hardly changes. As illustrated in FIG. 35, in the third voltage range, the absolute value of current density is typically 100 µA/cm$^2$ or less.

For instance, the potential of the pixel electrode 61 is adjusted by switching the voltage applied to the first voltage line 31 from the voltage supply circuit 41, and thereby the potential difference between the pixel electrode 61 and the opposite electrode 62, in other words, the bias voltage applied across the major surfaces of the photoelectric conversion structure at the start of a signal accumulation period can fall within the third voltage range. A state can be achieved in which substantially no charges are moved between the photoelectric conversion structure and the electrodes, by maintaining the bias voltage applied across the major surfaces of the photoelectric conversion structure within the third voltage range. In short, an electrical shutter can be achieved.

The imaging device in the present disclosure is applicable to, for instance, an image sensor and particularly, for photographing an object moving at a high speed. The imaging device in the present disclosure can be used for a camera for machine vision represented by a digital camera, a camera for medical use, and a camera for robots. A camera for machine vision may be utilized for input for performing, for instance, determination, classification of a state of products or detection of a defective in a production plant by using image recognition. Acquisition of an image utilizing the infrared light is also possible by appropriately selecting the material for the photoelectric conversion structure, and the voltage applied to the first signal line. Thus, an embodiment in the present disclosure is also useful for a security camera, and a camera mounted and used in a vehicle. The in-vehicle camera may be utilized for input to a control device for running the vehicle safely, for instance. Alternatively, the in-vehicle camera may be utilized for assisting an operator for running the vehicle safely. An infrared image can be utilized for sensing, such as distance detection and object recognition.

What is claimed is:

1. An imaging device comprising:
   a first imaging cell including
   a first photoelectric converter including a first electrode, a second electrode, and a first photoelectric conversion layer between the first electrode and the second electrode, and
   a first reset transistor one of a source and a drain of which is coupled to the first electrode;

a second imaging cell including
a second photoelectric converter including a third electrode, a fourth electrode, and a second photoelectric conversion layer between the third electrode and the fourth electrode, and
a second reset transistor one of a source and a drain of which is coupled to the third electrode;
first voltage supply circuitry configured to supply a first voltage to the other of the source and the drain of the first reset transistor; and
second voltage supply circuitry configured to supply a second voltage different from the first voltage to the other of the source and the drain of the second reset transistor.

2. The imaging device according to claim 1, further comprising:
a first inverting amplifier having a first inverting input terminal, a first non-inverting input terminal, and a first output terminal; and
a second inverting amplifier having a second inverting input terminal, a second non-inverting input terminal, and a second output terminal, wherein
the first imaging cell includes a first signal detection transistor having a gate coupled to the first electrode, one of a source and a drain of the first signal detection transistor being coupled to the first inverting input terminal,
the second imaging cell includes a second signal detection transistor having a gate coupled to the third electrode, one of a source and a drain of the second signal detection transistor being coupled to the second inverting input terminal,
the other of the source and the drain of the first reset transistor is coupled to the first output terminal,
the other of the source and the drain of the second reset transistor is coupled to the second output terminal,
the first voltage supply circuitry is coupled to the first non-inverting input terminal, and
the second voltage supply circuitry is coupled to the second non-inverting input terminal.

3. The imaging device according to claim 1, wherein
each of the first photoelectric conversion layer and the second photoelectric conversion layer includes a first layer and a second layer stacked one on the other, and
impedance of the first layer is greater than impedance of the second layer.

4. The imaging device according to claim 1, wherein
each of the first photoelectric conversion layer and the second photoelectric conversion layer includes a first layer and a second layer stacked one on the other,
the first layer includes a first material,
the second layer includes a second material, and
an ionization potential of the first material is greater than an ionization potential of the second material by 0.2 eV or more.

5. The imaging device according to claim 3, wherein
the first layer includes a first material,
the second layer includes a second material, and
the first material and the second material are both electron-donating molecules.

6. The imaging device according to claim 4, wherein the first material and the second material are both electron-donating molecules.

7. An imaging device comprising:
a first imaging cell including
a first photoelectric converter including a first electrode, a second electrode, and a first photoelectric conversion layer between the first electrode and the second electrode, and
a first capacitor having one end coupled to the first electrode;
a second imaging cell including
a second photoelectric converter including a third electrode, a fourth electrode, and a second photoelectric conversion layer between the third electrode and the fourth electrode; and
voltage supply circuitry configured to selectively supply a first voltage and a second voltage different from the first voltage to the other end of the first capacitor.

8. The imaging device according to claim 7, wherein
the second imaging cell includes a second capacitor having one end coupled to the third electrode, a capacitance value of the second capacitor being different from a capacitance value of the first capacitor, and
the voltage supply circuitry is coupled to the other end of the second capacitor.

9. The imaging device according to claim 8, wherein the voltage supply circuit selectively supplies the first voltage and the second voltage to both of the other end of the first capacitor and the other end of the second capacitor.

10. The imaging device according to claim 7, wherein
each of the first photoelectric conversion layer and the second photoelectric conversion layer includes a first layer and a second layer stacked one on the other, and
impedance of the first layer is greater than impedance of the second layer.

11. The imaging device according to claim 7, wherein
each of the first photoelectric conversion layer and the second photoelectric conversion layer includes a first layer and a second layer stacked one on the other,
the first layer includes a first material,
the second layer includes a second material, and
an ionization potential of the first material is greater than an ionization potential of the second material by 0.2 eV or more.

12. The imaging device according to claim 10, wherein
the first layer includes a first material,
the second layer includes a second material, and
the first material and the second material are both electron-donating molecules.

13. The imaging device according to claim 11, wherein the first material and the second material are both electron-donating molecules.

14. An imaging device comprising:
a first imaging cell including
a first photoelectric converter including a first electrode, a second electrode, and a first photoelectric conversion layer between the first electrode and the second electrode, and
a first signal detection transistor having a gate coupled to the first electrode;
a second imaging cell including
a second photoelectric converter including a third electrode, a fourth electrode, and a second photoelectric conversion layer between the third electrode and the fourth electrode, and
a second signal detection transistor having a gate coupled to the third electrode;
first voltage supply circuitry configured to supply a first voltage to the second electrode; and second voltage supply circuitry configured to supply a second voltage different from the first voltage to the fourth electrode.

15. The imaging device according to claim 14, wherein
each of the first photoelectric conversion layer and the second photoelectric conversion layer includes a first layer and a second layer stacked one on the other, and
impedance of the first layer is greater than impedance of the second layer.

16. The imaging device according to claim 14, wherein
each of the first photoelectric conversion layer and the second photoelectric conversion layer includes a first layer and a second layer stacked one on the other,
the first layer includes a first material,
the second layer includes a second material, and
an ionization potential of the first material is greater than an ionization potential of the second material by 0.2 eV or more.

17. The imaging device according to claim 15, wherein
the first layer includes a first material,
the second layer includes a second material, and
the first material and the second material are both electron-donating molecules.

18. The imaging device according to claim 16, wherein the first material and the second material are both electron-donating molecules.

* * * * *